US011881513B2

United States Patent
Nei et al.

(10) Patent No.: US 11,881,513 B2
(45) Date of Patent: Jan. 23, 2024

(54) SEMICONDUCTOR DEVICE

(71) Applicant: Semiconductor Energy Laboratory Co., Ltd., Atsugi (JP)

(72) Inventors: Kosei Nei, Yokohama (JP); Tsutomu Murakawa, Isehara (JP); Toshihiko Takeuchi, Atsugi (JP); Kentaro Sugaya, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 443 days.

(21) Appl. No.: 17/047,724

(22) PCT Filed: Apr. 16, 2019

(86) PCT No.: PCT/IB2019/053094
§ 371 (c)(1),
(2) Date: Oct. 15, 2020

(87) PCT Pub. No.: WO2019/207410
PCT Pub. Date: Oct. 31, 2019

(65) Prior Publication Data
US 2021/0167174 A1 Jun. 3, 2021

(30) Foreign Application Priority Data
Apr. 27, 2018 (JP) .................................. 2018-086578

(51) Int. Cl.
*H01L 27/00* (2006.01)
*H01L 29/00* (2006.01)
(Continued)

(52) U.S. Cl.
CPC .......... *H01L 29/24* (2013.01); *H01L 27/1225* (2013.01); *H10B 12/312* (2023.02)

(58) Field of Classification Search
CPC ............... H01L 29/24; H01L 29/66933; H01L 29/66939; H01L 29/7869; H01L 27/1225;
(Continued)

(56) References Cited

U.S. PATENT DOCUMENTS 9,653,613 B2   5/2017   Yamazaki et al.
9,704,562 B2   7/2017   Onuki et al.
(Continued)

FOREIGN PATENT DOCUMENTS

CN   107210227 A   9/2017
CN   107980178 A   5/2018
(Continued)

OTHER PUBLICATIONS

International Search Report (Application No. PCT/IB2019/053094) dated Jul. 2, 2019.
(Continued)

*Primary Examiner* — Nikolay K Yushin
(74) *Attorney, Agent, or Firm* — Eric J. Robinson; Robinson Intellectual Property Law Office, P.C.

(57) ABSTRACT

A semiconductor device that can be scaled down or highly integrated is provided. The semiconductor device includes a first layer and a second layer over the first layer. The first layer and the second layer each include a transistor. The transistor in the first layer and the transistor in the second layer each include a first oxide, a first conductor and a second conductor over the first oxide, a first insulator placed to cover the first conductor, the second conductor, and the first oxide, a second insulator over the first insulator, a second oxide placed between the first conductor and the second conductor over the first oxide, a third insulator over the second oxide, a third conductor over the third insulator, and a fourth insulator in contact with a top surface of the second insulator, a top surface of the second oxide, a top (Continued)

surface of the third insulator, and a top surface of the third conductor. The first insulator and the fourth insulator are less likely than the second insulator to allow oxygen to pass through.

16 Claims, 25 Drawing Sheets

(51) Int. Cl.
*H01L 29/24* (2006.01)
*H01L 27/12* (2006.01)
*H10B 12/00* (2023.01)

(58) Field of Classification Search
CPC ............ H01L 27/1222; H01L 27/1248; H10B 12/312; H10B 12/0387; H10B 12/30
See application file for complete search history.

(56) References Cited

U.S. PATENT DOCUMENTS

| | | | |
|---|---|---|---|
| 9,773,919 | B2 | 9/2017 | Sasagawa et al. |
| 9,935,203 | B2 | 4/2018 | Sasagawa et al. |
| 10,056,131 | B2 | 8/2018 | Atsumi et al. |
| 10,090,031 | B2 | 10/2018 | Ishizu et al. |
| 10,096,718 | B2 | 10/2018 | Asami |
| 10,186,614 | B2 | 1/2019 | Asami |
| 10,424,671 | B2 | 9/2019 | Yamazaki et al. |
| 10,490,258 | B2 | 11/2019 | Onuki et al. |
| 2016/0232956 | A1 | 8/2016 | Ishizu et al. |
| 2017/0062619 | A1 | 3/2017 | Sasagawa et al. |
| 2017/0221899 | A1 | 8/2017 | Uesugi et al. |
| 2017/0365720 | A1 | 12/2017 | Asami |
| 2018/0019343 | A1 | 1/2018 | Asami |

FOREIGN PATENT DOCUMENTS

| | | |
|---|---|---|
| JP | 2016-149175 A | 8/2016 |
| JP | 2017-028237 A | 2/2017 |
| JP | 2017-034249 A | 2/2017 |
| JP | 2017-045989 A | 3/2017 |
| JP | 2017-139460 A | 8/2017 |
| JP | 2017-228777 A | 12/2017 |
| KR | 2016-0098076 A | 8/2016 |
| KR | 2017-0107997 A | 9/2017 |
| KR | 2018-0042280 A | 4/2018 |
| TW | 201640498 | 11/2016 |
| TW | 201724515 | 7/2017 |
| WO | WO-2016/055903 | 4/2016 |
| WO | WO-2016/125052 | 8/2016 |
| WO | WO-2017/033102 | 3/2017 |

OTHER PUBLICATIONS

Written Opinion (Application No. PCT/IB2019/053094) dated Jul. 2, 2019.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) 2012, vol. 51, pp. 021201-1-021201-7.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

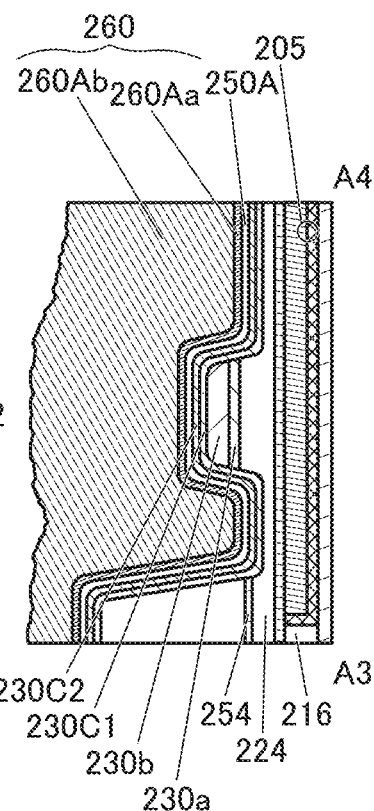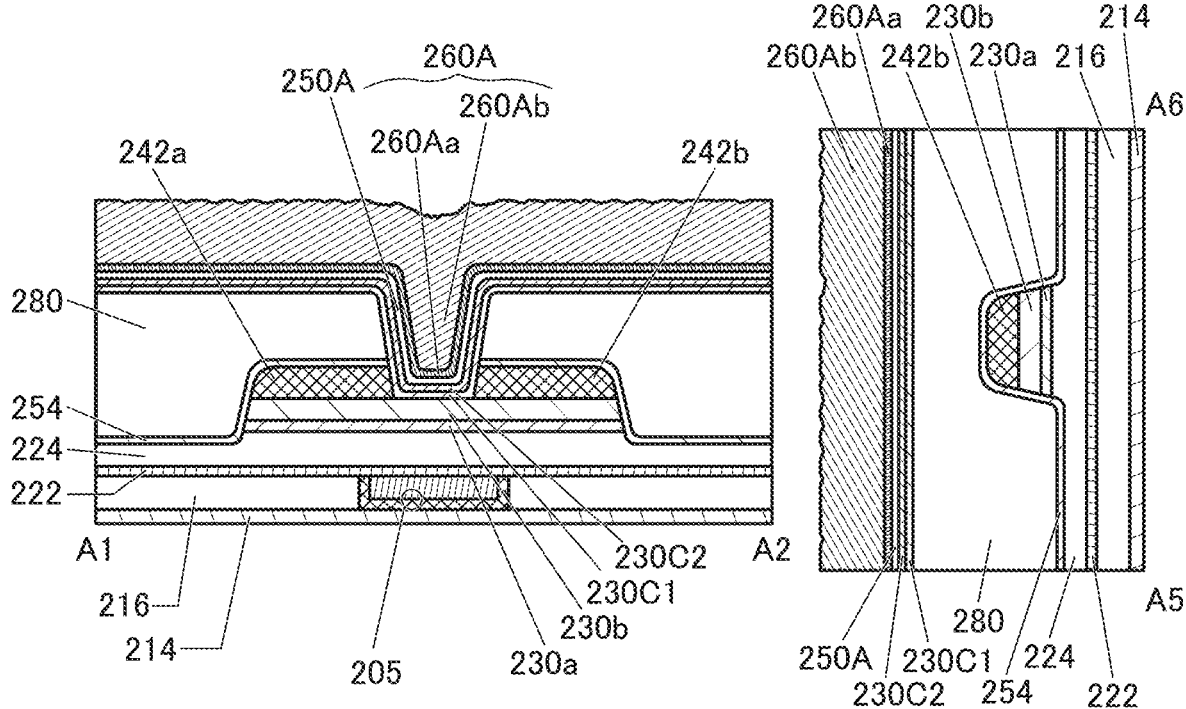

FIG. 21A
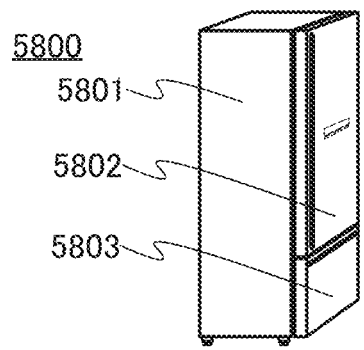
FIG. 21B1
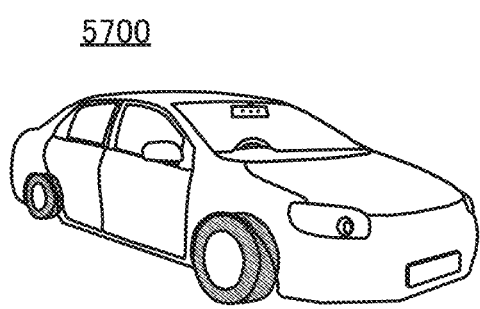
FIG. 21B2
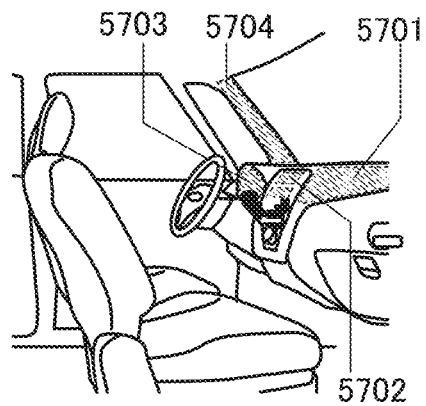
FIG. 21C
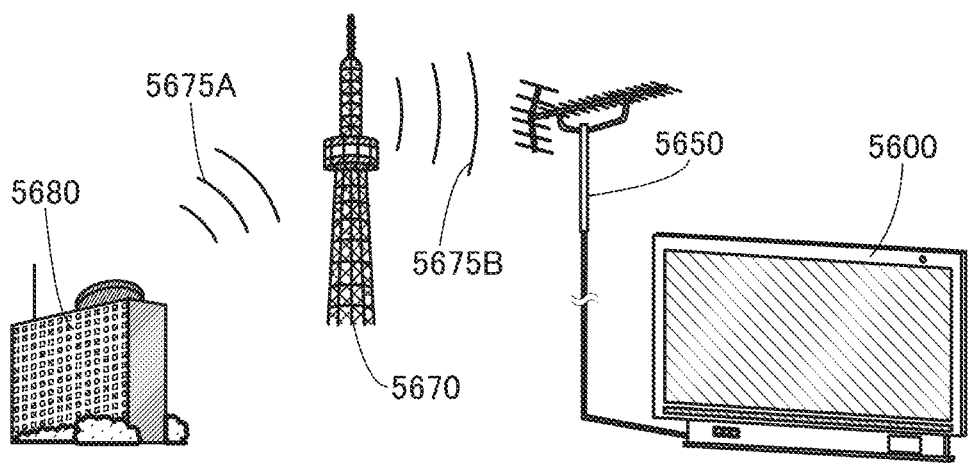

SEMICONDUCTOR DEVICE

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device refers to a device that can function by utilizing semiconductor characteristics in general. A semiconductor element such as a transistor, a semiconductor circuit, an arithmetic device, and a memory device are each one embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

As semiconductor thin films that can be used in the transistors, silicon-based semiconductor materials have been widely known, but oxide semiconductors have been attracting attention as alternative materials. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for forming a transistor using an oxide semiconductor having the CAAC structure is also disclosed. Moreover, Non-Patent Document 4 and Non-Patent Document 5 disclose that a fine crystal is included even in an oxide semiconductor that has lower crystallinity than an oxide semiconductor having the CAAC structure or the nc structure.

In addition, a transistor that uses IGZO for an active layer has an extremely low off-state current (see Non-Patent Document 6), and an LSI and a display utilizing the characteristics have been reported (see Non-Patent Document 7 and Non-Patent Document 8).

REFERENCE

Non-Patent Document

[Non-Patent Document 1] S. Yamazaki et al., "SID Symposium Digest of Technical Papers", 2012, volume 43, issue 1, p. 183-186

[Non-Patent Document 2] S. Yamazaki et al., "Japanese Journal of Applied Physics", 2014, volume 53, Number 4S, p. 04ED18-1-04ED18-10

[Non-Patent Document 3] S. Ito et al., "The Proceedings of AM-FPD'13 Digest of Technical Papers", 2013, p. 151-154

[Non-Patent Document 4] S. Yamazaki et al., "ECS Journal of Solid State Science and Technology", 2014, volume 3, issue 9, p. Q3012-Q3022

[Non-Patent Document 5] S. Yamazaki, "ECS Transactions", 2014, volume 64, issue 10, p. 155-164

[Non-Patent Document 6] K. Kato et al., "Japanese Journal of Applied Physics", 2012, volume 51, p. 021201-1-021201-7

[Non-Patent Document 7] S. Matsuda et al., "2015 Symposium on VLSI Technology Digest of Technical Papers", 2015, p. T216-T217

[Non-Patent Document 8] S. Amano et al., "SID Symposium Digest of Technical Papers", 2010, volume 41, issue 1, p. 626-629

SUMMARY OF THE INVENTION

Problems to be Solved by the Invention

An object of one embodiment of the present invention is to provide a semiconductor device that can be scaled down or highly integrated. Another object of one embodiment of the present invention is to provide a semiconductor device with excellent electrical characteristics. Another object of one embodiment of the present invention is to provide a semiconductor device with high on-state current. Another object of one embodiment of the present invention is to provide a semiconductor device with excellent frequency characteristics. Another object of one embodiment of the present invention is to provide a highly reliable semiconductor device. Another object of one embodiment of the present invention is to provide a semiconductor device with a low off-state current. Another object of one embodiment of the present invention is to provide a semiconductor device with reduced power consumption. Another object of one embodiment of the present invention is to provide a semiconductor device with high productivity.

Another object of one embodiment of the present invention is to provide a semiconductor device capable of retaining data for a long time. Another object of one embodiment of the present invention is to provide a semiconductor device with high-speed data writing. Another object of one embodiment of the present invention is to provide a semiconductor device with high design flexibility. Another object of one embodiment of the present invention is to provide a semiconductor device capable of reducing power consumption. Another object of one embodiment of the present invention is to provide a novel semiconductor device.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a semiconductor device including a first layer and a second layer over the first layer, in which the first layer and the second layer each include a transistor, in which the transistor in the first layer and the second layer includes a first oxide, a first conductor and a second conductor over the first oxide, a first insulator placed to cover the first conductor, the second conductor, and the first oxide, a second insulator over the first insulator, a second oxide placed between the first conductor and the second conductor over the first oxide, a third insulator over the second oxide, a third conductor over the third insulator, and a fourth insulator in contact with a top surface of the second insulator, a top surface of the second oxide, a top surface of the third insulator, and a top surface of the third conductor. The first insulator and the fourth insulator are less likely than the second insulator to allow oxygen to pass through.

In the above, the second oxide preferably has crystallinity. In the above, the second oxide preferably includes a region in contact with a side surface of the second insulator, the region in which a c-axis is oriented substantially perpendicular to the side surface. In the above, a third oxide is preferably placed over and in contact with the second oxide.

In the above embodiment, it is preferable that a fifth insulator be placed below the first oxide and the first insulator, a sixth insulator be placed below the fifth insulator, and the sixth insulator be less likely than the fifth insulator to allow oxygen to pass through. In the above, it is preferable that a fourth conductor be placed below the sixth insulator to overlap with the first oxide.

In the above, the first insulator and the fourth insulator are preferably oxides comprising one or both of aluminum and hafnium.

In the above, the first oxide and the second oxide preferably include In, an element M (M is Al, Ga, Y, or Sn), and Zn.

In the above, it is preferable that a third layer be placed below the first layer, and the third layer include a seventh insulator over a silicon substrate and a fifth conductor over the seventh insulator.

Effect of the Invention

According to one embodiment of the present invention, a semiconductor device that can be scaled down or highly integrated can be provided. According to one embodiment of the present invention, a semiconductor device with excellent electrical characteristics can be provided. According to one embodiment of the present invention, a semiconductor device with high on-state current can be provided. According to one embodiment of the present invention, a semiconductor device with excellent frequency characteristics can be provided. According to one embodiment of the present invention, a highly reliable semiconductor device can be provided. According to one embodiment of the present invention, a semiconductor device with low off-state current can be provided. According to one embodiment of the present invention, a semiconductor device with reduced power consumption can be provided. According to one embodiment of the present invention, a semiconductor device with high productivity can be provided.

A semiconductor device capable of retaining data for a long time can also be provided. A semiconductor device with high-speed data writing can also be provided. A semiconductor device with high design flexibility can also be provided. A semiconductor device capable of reducing power consumption can also be provided. A novel semiconductor device can also be provided.

Note that the description of the effects does not preclude the existence of other effects. Note that one embodiment of the present invention does not have to have all of these effects. Effects other than these will be apparent and can be derived from the description of the specification, the drawings, the claims, and the like.

BRIEF DESCRIPTION OF THE DRAWINGS

FIG. 11 (A) to (D) Atop view and cross-sectional views illustrating a method for manufacturing a semiconductor device of one embodiment of the present invention.

FIG. 21 (A) to (C) Diagrams each illustrating an electronic device of one embodiment of the present invention.

MODE FOR CARRYING OUT THE INVENTION

Figure 1:
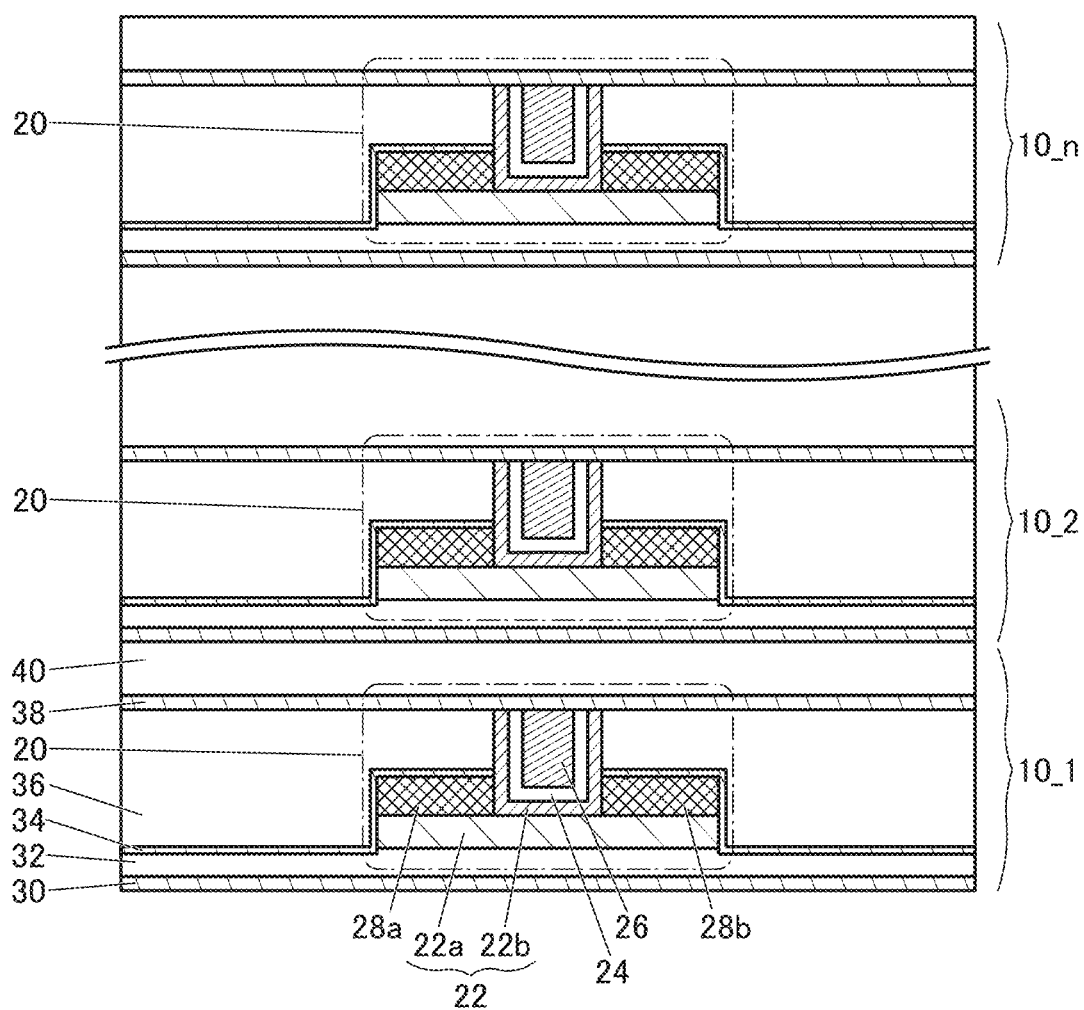
FIG. 1 A cross-sectional view of a semiconductor device of one embodiment of the present invention.

Embodiments will be described below with reference to the drawings. Note that the embodiments can be implemented in many different modes, and it will be readily understood by those skilled in the art that modes and details thereof can be changed in various ways without departing from the spirit and scope thereof. Therefore, the present invention should not be interpreted as being limited to the description of the embodiments below.

In the drawings, the size, the layer thickness, or the region is exaggerated for clarity in some cases. Thus, they are not necessarily limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, some hidden lines and the like might be omitted.

In addition, in this specification and the like, ordinal numbers such as "first" and "second" are used for convenience and do not denote the order of steps or the stacking order of layers. Thus, for example, description can be made by replacing "first" with "second," "third," or the like as appropriate. In addition, the ordinal numbers in this specification and the like do not correspond to the ordinal numbers that are used to specify one embodiment of the present invention in some cases.

In addition, in this specification and the like, terms for describing arrangement, such as "over" and "below," are used for convenience to describe the positional relation between components with reference to drawings. The positional relation between components is changed as appropriate in accordance with a direction in which the components are described. Thus, without limitation to the terms used for description in this specification, description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or text, a connection relationship other than a connection relationship shown in drawings or text is regarded as being disclosed in the drawings or the text.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or a direction of current flow is changed in circuit operation, for example. Thus, the terms "source" and "drain" can sometimes be interchanged with each other in this specification and the like.

Note that in this specification and the like, depending on transistor structures, channel width in a region where a channel is actually formed (hereinafter also referred to as effective channel width) is different from channel width shown in a top view of a transistor (hereinafter also referred to as apparent channel width) in some cases. For example, when a gate electrode covers a side surface of a semiconductor, effective channel width is greater than apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, effective channel width is greater than apparent channel width.

In such a case, an estimation of effective channel width by actual measurement may be difficult. For example, an estimation of effective channel width from a design value requires assumption that the shape of a semiconductor is known. Accordingly, in the case where the shape of a semiconductor is not known accurately, it is difficult to measure effective channel width accurately.

In this specification, the simple term "channel width" refers to an apparent channel width in some cases. Alternatively, in this specification, the simple term "channel width" refers to an effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration of lower than 0.1 atomic % can be regarded as an impurity. When an impurity is contained, for example, DOS (Density of States) in a semiconductor might be increased or crystallinity might be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. For an oxide semiconductor, water also serves as an impurity in some cases. In addition, entry of impurities in an oxide semiconductor, for example, forms oxygen vacancies in some cases. In the case where the semiconductor is silicon, examples of the impurity that changes characteristics of the semiconductor include oxygen, Group 1 elements except for hydrogen, Group 2 elements, Group 13 elements, and Group 15 elements.

Note that in this specification and the like, silicon oxynitride is a material that contains more oxygen than nitrogen in its composition. Silicon nitride oxide is a material that contains more nitrogen than oxygen in its composition.

In this specification and the like, the term "insulator" can be replaced with an insulating film or an insulating layer.

Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle of greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle of greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

Note that in this specification, a barrier film means a film having a function of inhibiting passage of oxygen and impurities such as water and hydrogen; in the case where the barrier film has conductivity, the barrier film may be referred to as a conductive barrier film.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, when the term OS FET or OS transistor is used, the term can be replaced by a transistor including an oxide or an oxide semiconductor.

In this specification and the like, "normally off" means that current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

The structure and characteristics of a semiconductor device of one embodiment of the present invention will be described below.

FIG. 1 is a cross-sectional view of a semiconductor device in which a layer 10_1 to a layer 10_n (n is a natural number of 2 or greater) are sequentially stacked from the layer 10_1. Note that in the following description, a given layer from the layer 10_1 to the layer 10_n may be referred to as a layer 10 without an ordinal number.

The layer 10_1 to the layer 10_n each include at least one or more transistors 20. Although the layer 10_1 to the layer 10_n each include one transistor 20 in FIG. 1, the number of transistors is not limited to this and may be different between the layers 10. Note that the layer 10 is provided with circuit elements such as a switch, a transistor, a capacitor, an inductor, a resistor, and a diode, a wiring, an electrode, a terminal, or the like as appropriate in accordance with the required function of the semiconductor device.

As illustrated in FIG. 1, the transistor 20 includes: an insulator 30; an insulator 32 over the insulator 30; an oxide 22a over the insulator 32; a conductor 28a and a conductor 28b over the oxide 22a; an insulator 34 placed to cover the conductor 28a, the conductor 28b, and the oxide 22a; an insulator 36 over the insulator 34; an oxide 22b placed between the conductor 28a and the conductor 28b over the oxide 22a; an insulator 24 over the oxide 22b; a conductor 26 over the insulator 24; and an insulator 38 being in contact with a top surface of the insulator 36, a top surface of the oxide 22b, a top surface of the insulator 24, and a top surface of the conductor 26. Hereinafter, the oxide 22a and the oxide 22b may be collectively referred to as an oxide 22.

Here, each of the conductor 28a and the conductor 28b functions as a source electrode or a drain electrode of the transistor 20. The conductor 26 functions as a gate electrode of the transistor 20, and the insulator 24 functions as a gate insulator of the transistor 20. In the transistor 20, the conductor 26, the insulator 24, and the oxide 22b are formed in a self-aligned manner to fill an opening formed by the insulator 36, the insulator 34, the conductor 28a, and the conductor 28b. This enables the conductor 26 to be positioned without fail in a region between the conductor 28a and the conductor 28b even without alignment.

Here, it is preferable that the insulator 38, the insulator 34, and the insulator 30 have a function of inhibiting diffusion of oxygen (e.g., oxygen atoms, oxygen molecules, and the like) (or that the above oxygen be less likely to pass through these insulators). It is preferable that the insulator 38 and the insulator 34 be less likely than the insulator 30 to allow oxygen to pass through, for example. In addition, it is preferable that the insulator 30 be less likely than the insulator 32 to allow oxygen to pass through, for example. As an insulator having such a barrier property against oxygen, an oxide containing one or both of aluminum and hafnium can be used, for example.

The insulator 36 preferably contains oxygen that is released therefrom by heating. The insulator 36 is preferably an oxide, and may contain more oxygen than that in the stoichiometric composition. Note that in the following description, oxygen that is released by heating may be referred to as excess oxygen.

Here, it is preferable that the level of the top surface of the insulator 36 be approximately equal to the level of the top surface of the conductor 26, the top surface of the insulator 24, and the top surface of the oxide 22b. It is also preferable that the insulator 36, the conductor 26, the insulator 24, and the oxide 22b be covered with the insulator 38. It is also preferable that a side surface of the insulator 36 be in contact with a side surface of the oxide 22b. With such a structure, the insulator 36 can be isolated from the conductor 26 by the insulator 38 and the oxide 22b. Thus, oxygen contained in the insulator 36 can be prevented from directly diffusing into the conductor 26.

A bottom surface of the insulator 36 is preferably in contact with the insulator 34. Furthermore, the insulator 34 is preferably in contact with the side surface of the oxide 22b, a top surface and a side surface of the conductor 28a, a top surface and a side surface of the conductor 28b, a side surface of the oxide 22a, and a top surface of the insulator 32. With such a structure, the insulator 36 can be isolated from the conductor 28a and the conductor 28b by the oxide 22b and the insulator 34. Thus, oxygen contained in the insulator 36 can be prevented from directly diffusing into the conductor 28a and the conductor 28b.

An insulator 40 may be provided over the insulator 38. Note that in FIG. 1, the insulator 30 in the upper layer 10 is provided in contact with a top surface of the insulator 40 in the lower layer 10; however, one embodiment of the present invention is not limited thereto. Circuit elements such as a switch, a transistor, a capacitor, an inductor, a resistor, and a diode, a wiring, an electrode, a terminal, or the like may be appropriately provided between the lower layer 10 and the upper layer 10. A structure in which the insulator 40 is not provided and the insulator 38 in the lower layer 10 serves as the insulator 30 in the upper layer 10 may also be employed.

The oxide 22a includes a channel formation region in a region between the conductor 28a and the conductor 28b, and includes a source region and a drain region in the vicinity of a region overlapping with the conductor 28a (the conductor 28b) so that the channel formation region is sandwiched between the source region and the drain region. Note that the source region and/or the drain region may have a shape in which the source region and/or the drain region extends inward from the conductor 28a (the conductor 28b). The channel formation region of the transistor 20 is formed not only in the oxide 22a but also in the vicinity of the interface between the oxide 22a and the oxide 22b and/or in the oxide 22b, in some cases.

Here, in the transistor 20, a metal oxide functioning as an oxide semiconductor (hereinafter also referred to as an oxide semiconductor) is preferably used as the oxide 22a and the oxide 22b. A metal oxide having an energy gap of 2 eV or more, preferably 2.5 eV or more is preferably used as a metal oxide to be the oxide 22a and the oxide 22b, for example. The off-state current (leakage current) of a transistor including a metal oxide having a wide energy gap as described above is small. With the use of such a transistor, a semiconductor device with low power consumption can be provided.

For the oxide 22a and the oxide 22b, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, as the oxide 22a and the oxide 22b, an In—Ga oxide or an In—Zn oxide may be used.

Here, the atomic ratio of In to the element M in the metal oxide used as the oxide 22a may be higher than the atomic ratio of In to the element M in the metal oxide used as the oxide 22b. When the oxide 22b is provided over the oxide 22a as described above, impurities can be inhibited from being diffused into the oxide 22a from components formed above the oxide 22b. Furthermore, when the oxide 22a and the oxide 22b contain a common element (as its main component) besides oxygen, the density of defect states at the interface between the oxide 22a and the oxide 22b can be low. Since the density of defect states at the interface between the oxide 22a and the oxide 22b can be decreased, the influence of interface scattering on carrier conduction is small, and a high on-state current can be obtained.

Each of the oxide 22a and the oxide 22b preferably has crystallinity. It is particularly preferable to use a CAAC-OS (c-axis aligned crystalline oxide semiconductor) for the oxide 22a and the oxide 22b.

The CAAC-OS has c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

Here, an example of a CAAC-OS analyzed by X-ray diffraction (XRD) will be described. For example, when a CAAC-OS including an $InGaZnO_4$ crystal is subjected to structural analysis by an out-of-plane method, a peak appears at a diffraction angle (2θ) in the neighborhood of 31° in some cases. This peak is assigned to the (009) plane of the $InGaZnO_4$ crystal, which indicates that crystals in the CAAC-OS have c-axis alignment, and that the c-axes face in a direction substantially perpendicular to the formation surface or the top surface.

Furthermore, an example of a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) can be obtained in some cases. This diffraction pattern includes spots derived from the (009) plane of the $InGaZnO_4$ crystal. Thus, the electron diffraction also indicates that crystals included in the CAAC-OS have c-axis alignment, and that the c-axes face in a direction substantially perpendicular to the formation surface or the top surface. Meanwhile, a ring-like diffraction pattern is shown when an electron beam with a probe diameter of 300 nm is incident on the same sample in a direction perpendicular to the sample surface. Thus, the electron diffraction also indicates that the a-axes and b-axes of the crystals included in the CAAC-OS do not have regular alignment.

A transistor using an oxide semiconductor is likely to have its electrical characteristics changed when impurities and oxygen vacancies exist in a region of the oxide semiconductor where a channel is formed, which may affect the reliability. Moreover, if the channel formation region of the oxide semiconductor includes oxygen vacancies, or impurities (typically, hydrogen) are introduced into the oxygen vacancies, the transistor tends to have normally on characteristics. When an oxide semiconductor is subjected to heat treatment without oxygen being supplied, oxygen may leave the oxide semiconductor and oxygen vacancies may be formed. Heat treatment in a transistor fabrication process, for example, may cause oxygen in the oxide semiconductor to be absorbed into a source electrode and a drain electrode to form oxygen vacancies in the oxide semiconductor.

As a countermeasure to the above, an insulator containing excess oxygen is provided near the oxide semiconductor, so that oxygen can be supplied from the insulator to the oxide semiconductor when heat treatment is performed. However, when a conductor functioning as a gate, a source, or a drain is provided in contact with the insulator containing excess oxygen, oxygen contained in the insulator may be absorbed into the conductor, which inhibits the supply of oxygen to the oxide semiconductor.

In the case where a plurality of transistors are stacked as in this embodiment, underlying transistors are subjected to heat treatment during the fabrication process every time a transistor is fabricated thereover. In other words, the lower layer a transistor is placed in, the higher thermal budget that transistor is subjected to. Thus, in a transistor placed in a lower layer, oxygen in an insulator containing excess oxygen may be absorbed into a conductor to prevent the supply of oxygen into an oxide semiconductor during the fabrication process of a transistor in an upper layer. At this time, the amount of oxygen supplied to the oxide semiconductor becomes greater than the amount of oxygen absorbed from the oxide semiconductor. For this reason, even when oxygen vacancies in the oxide semiconductor are sufficiently reduced at the time of completion of a transistor in a lower layer, oxygen vacancies are formed in the oxide semiconductor in the fabrication process of a transistor in an upper layer.

Figure 2:
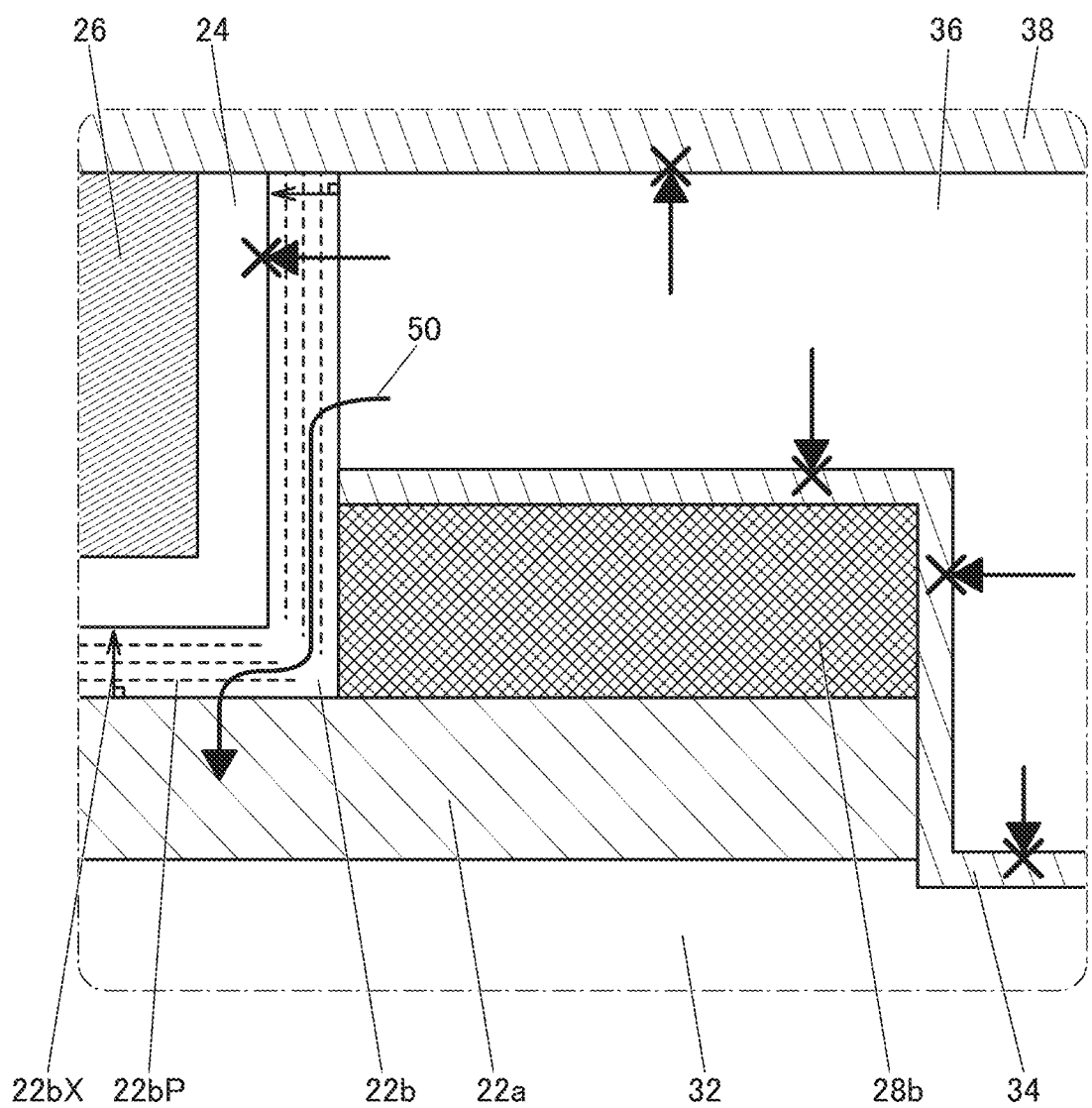
FIG. 2 A cross-sectional view of a semiconductor device of one embodiment of the present invention.

Here, the behavior of oxygen 50 contained in the insulator 36 at the time when the transistor 20 of this embodiment is subjected to heat treatment will be described with reference to FIG. 2. FIG. 2 is an enlarged cross-sectional view of the transistor 20. As described above, in the semiconductor device described in this embodiment, the insulator 36 containing excess oxygen is surrounded by the insulator 38, the oxide 22*b*, and the insulator 34, and isolated from the conductor 26, the conductor 28*a*, and the conductor 28*b*. Thus, even when heat treatment is performed, the oxygen 50 in the insulator 36 is blocked by the insulator 38, the oxide 22*b*, and the insulator 34 and does not directly diffuse into the conductor 26, the conductor 28*a*, and the conductor 28*b*, as illustrated in FIG. 2.

In addition, when oxygen in the oxide 22*a* is released by the heat treatment and oxygen vacancies are formed, oxygen diffuses from the oxide 22*b* into the oxide 22*a* to fill the oxygen vacancies in the vicinity of the interface between the oxide 22*a* and the oxide 22*b*. Oxygen supplied to the oxide 22*a* diffuses through the oxide 22*a* while repeatedly filling oxygen vacancies in the oxide 22*a*.

Supplying oxygen to the oxide 22*a* causes oxygen vacancies to be formed also in the oxide 22*b*. At this time, the oxygen 50 diffuses from the insulator 36 into the oxide 22*b* in the vicinity of the interface between the insulator 36 and the oxide 22*b* to fill the oxygen vacancies. The oxygen 50 supplied to the oxide 22*b* diffuses through the oxide 22*b* while repeatedly filling oxygen vacancies in the oxide 22*b*.

Here, the oxide 22*b* is preferably a CAAC-OS. As illustrated in FIG. 2, the oxide 22*b* includes a crystal region including a layer 22*b*P of crystals that extend in the a-b plane direction and a c-axis 22*b*X perpendicular to the a-b plane direction. In the oxide 22*b*, the c-axis 22*b*X preferably faces in a direction substantially perpendicular to a formation surface of the oxide 22*b*. Thus, the oxide 22*b* includes: a region where the c-axis 22*b*X is oriented substantially perpendicular to a top surface of the oxide 22*a*; a region where the c-axis 22*b*X is oriented substantially perpendicular to the side surfaces of the conductor 28*a*, the insulator 34, and the insulator 36; and a region where the c-axis 22*b*X is oriented substantially perpendicular to the side surfaces of the conductor 28*b*, the insulator 34, and the insulator 36.

A CAAC-OS has a property that makes oxygen more easily diffuse in the a-b plane direction rather than in the c-axis direction. Thus, the oxygen 50 supplied from the insulator 36 to the oxide 22*b* is diffused preferentially into the vicinity of the interface between the oxide 22*b* and the oxide 22*a* and can fill the oxygen vacancies in the oxide 22*b*, as illustrated in FIG. 2.

As described above, the transistor 20 described in this embodiment is capable of supplying oxygen from the insulator 36 into the oxide 22 to prevent an increase of oxygen vacancies in the oxide 22 even when heat treatment is performed after the fabrication of the transistor 20. Thus, even in a lower layer 10, the electrical characteristics of the transistor 20 can be stable with suppressed variation, and the reliability of the transistor 20 can be improved.

Stacking the layer 10_1 to the layer 10_*n* each including such a transistor 20 can reduce the top-view area occupied by the semiconductor device of this embodiment to promote scaling-down and higher integration of the semiconductor device.

In accordance with one embodiment of the present invention, a semiconductor device that can be scaled down or highly integrated can be provided. In accordance with one embodiment of the present invention, a semiconductor device with excellent electrical characteristics can also be provided. In accordance with one embodiment of the present invention, a semiconductor device with a high on-state current can also be provided. In accordance with one embodiment of the present invention, a semiconductor device with excellent frequency characteristics can also be provided. In accordance with one embodiment of the present invention, a highly reliable semiconductor device can also be provided. In accordance with one embodiment of the present invention, a semiconductor device with low off-state current can also be provided. In accordance with one embodiment of the present invention, a semiconductor device with reduced power consumption can also be provided. In accordance with one embodiment of the present invention, a semiconductor device with high productivity can also be provided.

The structure, method, and the like described above in this embodiment can be used in combination as appropriate with the structures, methods, and the like described in the other embodiments.

Embodiment 2

Specific structure examples of the semiconductor device described in the above embodiment will be described below with reference to FIG. 3 to FIG. 13.

Structure Example of Semiconductor Device

FIG. 3(A), FIG. 3(B), FIG. 3(C), and FIG. 3(D) are a top view and cross-sectional views of a transistor 200 of one embodiment of the present invention and the periphery of the transistor 200. The transistor 200 corresponds to the transistor 20 described in the above embodiment. In other words, the transistors 200 can be stacked as described in the above embodiment.

Figure 3A:
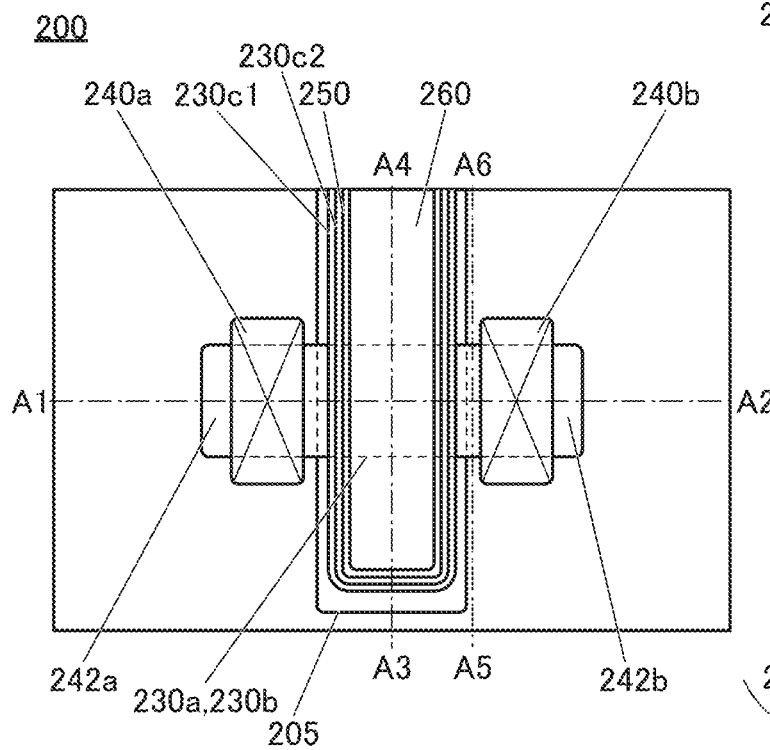
FIG. 3 (A) to (D) A top view and cross-sectional views of a semiconductor device of one embodiment of the present invention.
Figure 3C:
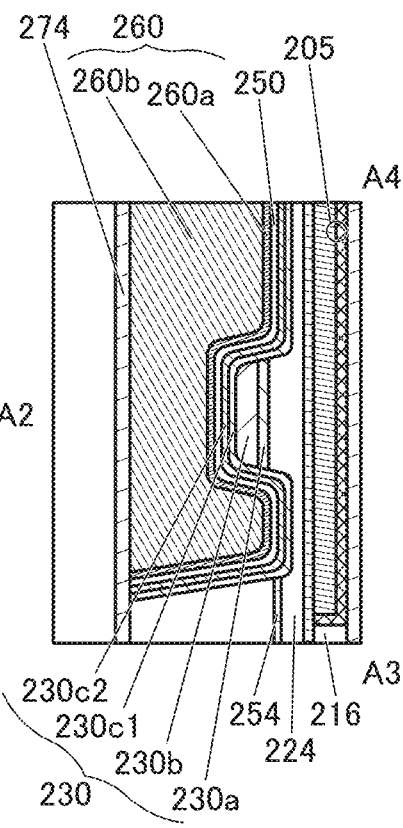
Figure 3B:
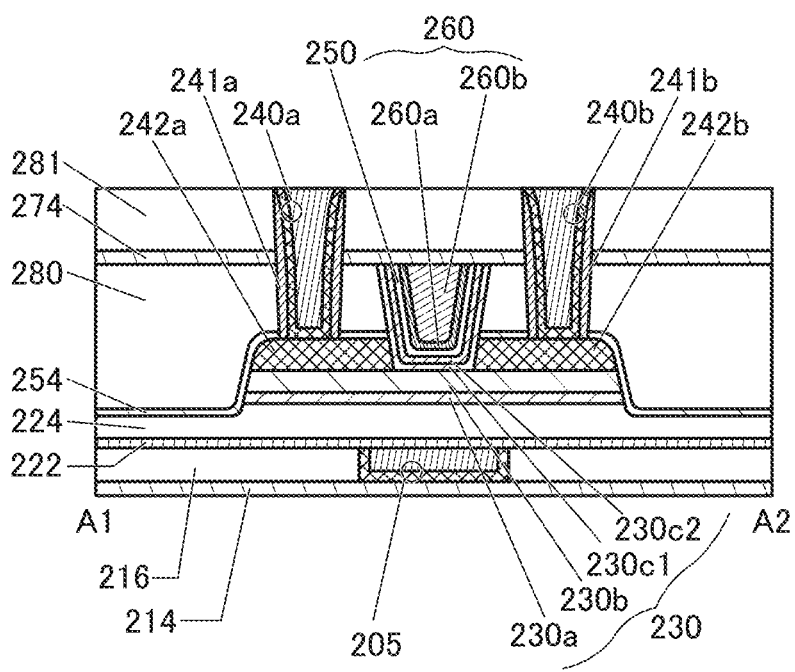
Figure 3D:
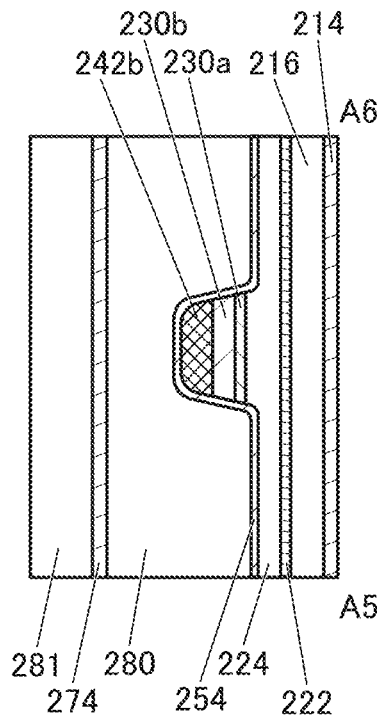

FIG. 3(A) is a top view of a semiconductor device including the transistor 200. FIG. 3(B) and FIG. 3(C) are cross-sectional views of the semiconductor device. Here, FIG. 3(B) is a cross-sectional view of a portion indicated by a dashed-dotted line A1-A2 in FIG. 3(A), and is a cross-sectional view in the channel length direction of the transistor 200. FIG. 3(C) is a cross-sectional view of a portion indicated by a dashed-dotted line A3-A4 in FIG. 3(A), and is a cross-sectional view in the channel width direction of the transistor 200. FIG. 3(D) is a cross-sectional view of a portion indicated by dashed-dotted line A5-A6 in FIG. 3(A). For clarity of the drawing, some components are not illustrated in the top view of FIG. 3(A).

The semiconductor device of one embodiment of the present invention includes the transistor 200, and an insulator 214, an insulator 274, and an insulator 280, and an insulator 281 that function as interlayer films. A conductor 240 (a conductor 240*a* and a conductor 240*b*) functioning as a plug and being electrically connected to the transistor 200 is also included. Note that an insulator 241 (an insulator 241*a* and an insulator 241*b*) is provided in contact with a side surface of the conductor 240 functioning as a plug.

In contact with the inner wall of an opening formed in an insulator 254, the insulator 274, and the insulator 281, the insulator 241 is provided. In contact with its side surface, a first conductor of the conductor 240 is provided, and a second conductor of the conductor 240 is further provided on the inner side. Here, the level of a top surface of the conductor 240 and the level of a top surface of the insulator 281 can be substantially the same. Note that although the transistor 200 having a structure in which the first conductor of the conductor 240 and the second conductor of the conductor 240 are stacked is illustrated, the present invention is not limited thereto. The conductor 240 may be provided as a single layer or to have a stacked-layer structure including three or more layers, for example. In the case where a structure body has a stacked-layer structure, layers may be distinguished by ordinal numbers corresponding to the formation order.

[Transistor 200]

As illustrated in FIG. 1, the transistor 200 includes the insulator 214 and an insulator 216 placed over a substrate (not illustrated); a conductor 205 placed to be embedded in the insulator 216; an insulator 222 placed over the insulator 216 and the conductor 205; an insulator 224 placed over the insulator 222; an oxide 230 (an oxide 230*a*, an oxide 230*b*, an oxide 230*c*1, and an oxide 230*c*2) placed over the insulator 224; an insulator 250 placed over the oxide 230; a conductor 260 (a conductor 260*a* and a conductor 260*b*) placed over the insulator 250; a conductor 242*a* and a conductor 242*b* in contact with a portion of the top surface of the oxide 230*b*; an insulator 254 placed to be in contact with a portion of the top surface of the insulator 224, the side surface of the oxide 230*a*, the side surface of the oxide 230*b*, the side surface of the conductor 242*a*, the top surface of the conductor 242*a*, the side surface of the conductor 242*b*, and the top surface of the conductor 242*b*; an insulator 280 placed over the insulator 254; and an insulator 274 placed over the insulator 280. The conductor 260 includes the conductor 260*a* and the conductor 260*b*, and the conductor 260*a* is placed so as to cover a bottom surface and a side surface of the conductor 260*b*. Here, as illustrated in FIG. 3B, a top surface of the conductor 260 is positioned to be substantially aligned with a top surface of the insulator 250, a top surface of the oxide 230*c*1, a top surface of the oxide 230*c*2, and a top surface of the insulator 280. The insulator 274 is in contact with each of the top surfaces of the conductor 260, the oxide 230*c*, and the insulator 250. Note that hereinafter the oxide 230*c*1 and the oxide 230*c*2 may be collectively referred to as the oxide 230*c*.

Here, the insulator 214 corresponds to the insulator 30 of the transistor 20 of the above embodiment. The insulator 224 corresponds to the insulator 32 of the transistor 20 of the above embodiment. The oxide 230*b* corresponds to the oxide 22*a* of the transistor 20 of the above embodiment. The conductor 242*a* and the conductor 242*b* correspond to the conductor 28*a* and the conductor 28*b* of the transistor 20 of the above embodiment. The insulator 254 corresponds to the insulator 34 of the transistor 20 of the above embodiment. The insulator 280 corresponds to the insulator 36 of the transistor 20 of the above embodiment. The oxide 230*c* corresponds to the oxide 22*b* of the transistor 20 of the above embodiment. The insulator 250 corresponds to the insulator 24 of the transistor 20 of the above embodiment. The conductor 260 corresponds to the conductor 26 of the transistor 20 of the above embodiment. The insulator 274 corresponds to the insulator 38 of the transistor 20 of the above embodiment. The insulator 281 corresponds to the insulator 40 of the transistor 20 of the above embodiment. Note that the insulator 222 may be regarded as corresponding to the insulator 32 of the transistor 20 of the above embodiment.

The insulator 280 preferably includes a region containing oxygen that is released by heating. When the insulator 280 from which oxygen is released by heating is provided in contact with the oxide 230*c*1, oxygen in the insulator 280 can be efficiently supplied to the oxide 230*b* through the oxide 230*c*1.

The insulator 222, the insulator 254, and the insulator 274 preferably have a function of inhibiting diffusion of oxygen (for example, at least one of an oxygen atom, an oxygen molecule, and the like). The insulator 222, the insulator 254, and the insulator 274 preferably have a function of inhibiting diffusion of hydrogen (for example, at least one of a hydrogen atom, a hydrogen molecule, and the like). For example, the insulator 222, the insulator 254, and the insulator 274 each preferably have lower permeability of one or both of oxygen and hydrogen than the insulator 224. The insulator 222, the insulator 254, and the insulator 274 each preferably have lower permeability of one or both of oxygen and hydrogen than the insulator 250. The insulator 222, the insulator 254, and the insulator 274 each preferably have lower permeability of one or both of oxygen and hydrogen than the insulator 280.

As illustrated in FIGS. 3(B) and 3(C), the insulator 254 is preferably in contact with the top surface and the side surface of the conductor 242*a*, the top surface and the side surface of the conductor 242*b*, the side surfaces of the oxide 230*a* and the oxide 230*b*, and the top surface of the insulator 224.

With such a structure, the insulator 280 can be isolated from the conductor 260 by the insulator 274 and the oxide 230*c*. In this way, oxygen contained in the insulator 280 can be prevented from directly diffusing into the conductor 260. In addition, the insulator 280 can be isolated from the conductor 242*a* and the conductor 242*b* by the oxide 230*c* and the insulator 254. In this way, oxygen contained in the insulator 280 can be prevented from directly diffusing into the conductor 242*a* and the conductor 242*b*.

The oxide 230 preferably includes the oxide 230a placed over the insulator 224, the oxide 230b placed over the oxide 230a, and the oxide 230c which is placed over the oxide 230b and at least partly in contact with a top surface of the oxide 230b. The oxide 230c may have a stacked-layer structure including the oxide 230c1 and the oxide 230c2 in contact with the top surface of the oxide 230c1.

Note that although the structure of the transistor 200 in which four layers, the oxide 230a, the oxide 230b, the oxide 230c1, and the oxide 230c2, are stacked in a region where a channel is formed (hereinafter also referred to as a channel formation region) and in its vicinity is illustrated, the present invention is not limited thereto. For example, any of the following structures may be employed: a single layer of the oxide 230b; a two-layer structure of the oxide 230b and the oxide 230a; a two-layer structure of the oxide 230b and the oxide 230c2; a three-layer structure of the oxide 230a, the oxide 230b, and the oxide 230c1; and a stacked-layer structure with five or more layers. Although the transistor 200 with the conductor 260 having a stacked-layer structure including two layers is described, the present invention is not limited thereto. For example, the conductor 260 may have a single-layer structure or a stacked-layer structure with three or more layers.

Here, the conductor 260 functions as a gate electrode of the transistor, and the conductor 242a and the conductor 242b function as a source electrode and a drain electrode. In the transistor 200, the conductor 260 functioning as a gate electrode is formed in a self-aligned manner to fill an opening formed by the insulator 280 and the like. The formation of the conductor 260 in this manner allows the conductor 260 to be positioned certainly in the region between the conductor 242a and the conductor 242b without alignment. Note that as illustrated in FIG. 1, the conductor 260 preferably includes a conductor 260a and a conductor 260b placed over the conductor 260a.

The transistor 200 preferably includes the insulator 214 placed over a substrate (not illustrated); the insulator 216 placed over the insulator 214; the conductor 205 placed to be embedded in the insulator 214 and the insulator 216; and the insulator 222 placed over the insulator 216 and the conductor 205. Furthermore, the insulator 224 is preferably placed over the insulator 222.

In the transistor 200, as the oxide 230 (the oxide 230a, the oxide 230b, the oxide 230c1, and the oxide 230c2) including the channel formation region, a metal oxide functioning as an oxide semiconductor (such a metal oxide is hereinafter also referred to as an oxide semiconductor) is preferably used.

The transistor 200 using an oxide semiconductor in the channel formation region exhibits extremely low leakage current in a non-conduction state (off-state current); thus, a semiconductor device with low power consumption can be provided. An oxide semiconductor can be deposited by a sputtering method or the like, and can be used for the transistor 200 constituting a highly integrated semiconductor device.

For example, as the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, as the oxide 230, an In—Ga oxide or an In—Zn oxide may be used.

A transistor using an oxide semiconductor is likely to have its electrical characteristics changed when impurities and oxygen vacancies exist in a region of the oxide semiconductor where a channel is formed, which may deteriorate the reliability. Moreover, if the channel formation region of the oxide semiconductor includes oxygen vacancies, the transistor tends to have normally on characteristics. Thus, oxygen vacancies in the channel formation region are preferably reduced as much as possible. For example, oxygen may be supplied to the oxide 230b through the oxide 230c or the like to fill the oxygen vacancies. Accordingly, a transistor with reduced variation in electrical characteristics, stable electrical characteristics, and improved reliability can be provided.

A low-resistance region might be formed in part of a region between the oxide 230 and the conductor 242 or the vicinity of a surface of the oxide 230 when an element (for example, a second element) included in the conductor 242 (the conductor 242a and the conductor 242b) which is provided over and in contact with the oxide 230 and functions as the source electrode and the drain electrode has a function of absorbing oxygen in the oxide 230. In that case, in the low-resistance region, an impurity (such as hydrogen, nitrogen, metal elements, or the like) entering oxygen vacancies serves as a donor, which causes an increase in carrier density in some cases. Note that in the following, hydrogen that enters oxygen vacancies is sometimes referred to as $V_O H$.

Figure 4A:
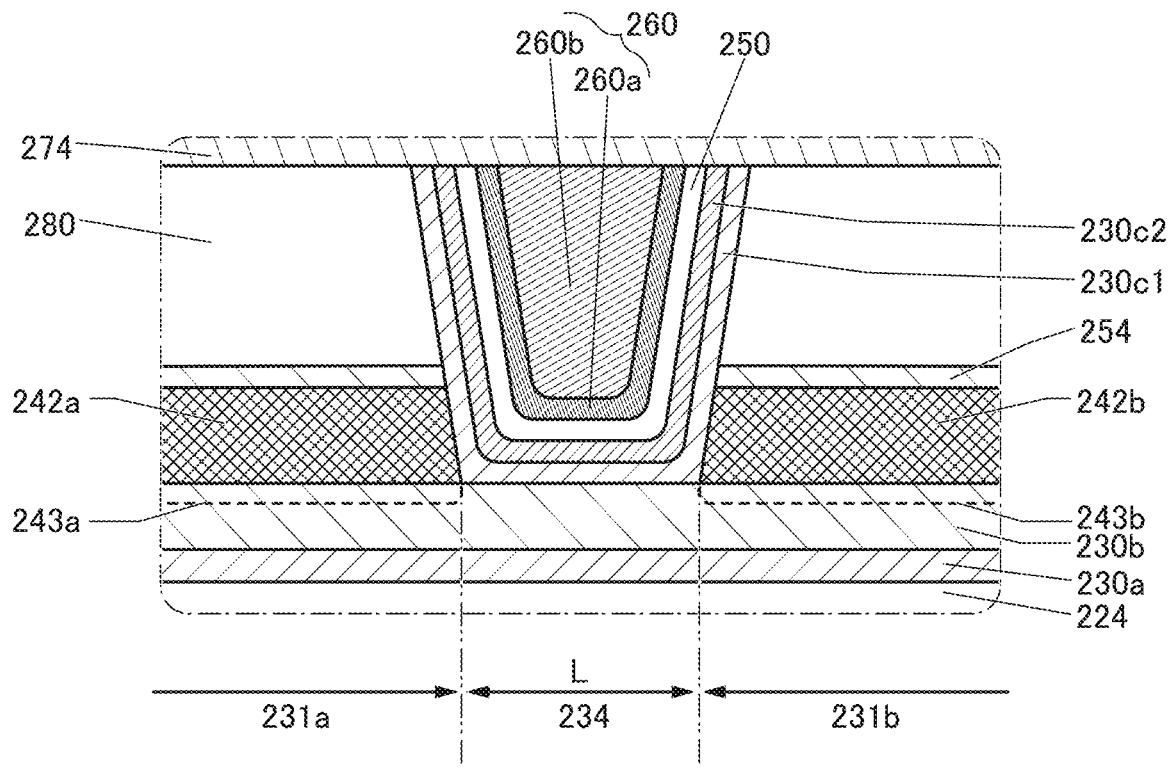
FIGS. 4 (A) and (B) Cross-sectional views of a semiconductor device of one embodiment of the present invention.

FIG. 4(A) is an enlarged view of a region of part of the transistor 200 illustrated in FIG. 3(B). As illustrated in FIG. 4(A), the conductor 242 is provided on and in contact with the oxide 230, and a region 243 (a region 243a and a region 243b) is sometimes formed as a low-resistance region at an interface between the oxide 230 and the conductor 242 and the vicinity of the interface. The oxide 230 includes a region 234 functioning as a channel formation region of the transistor 200 and a region 231 (a region 231a and a region 231b) including part of the region 243 and functioning as a source region or a drain region. Note that in the following drawings, even when the region 243 is not illustrated in an enlarged view or the like, the same region 243 has been formed in some cases.

Note that although an example in which the region 243a and the region 243b are provided to spread in the depth direction of the oxide 230b near the conductor 242 is illustrated, the present invention is not limited thereto. The region 243a and the region 243b may be formed as appropriate in accordance with the required electrical characteristics of the transistor. In the oxide 230, the boundaries between the regions are difficult to detect clearly in some cases. The concentration of an element detected in each region might not only gradually change between the regions, but also continuously change within each region.

In the transistor 200 of one embodiment of the present invention, as illustrated in FIG. 4(A), a bottom surface of the insulator 274 and the top surface of the oxide 230c are in contact with each other, and the conductor 260 is isolated from the insulator 280. Thus, oxygen contained in the insulator 280 can be prevented from being absorbed into the conductor 260. In addition, in the transistor 200 of one embodiment of the present invention, as illustrated in FIG. 4(A), a side surface of the oxide 230c and a side surface of the insulator 254 are in contact with each other, and the conductor 242a and the conductor 242b are isolated from the insulator 280. Thus, oxygen contained in the insulator 280 can be prevented from being absorbed into the conductor 242a and the conductor 242b.

Figure 4B:
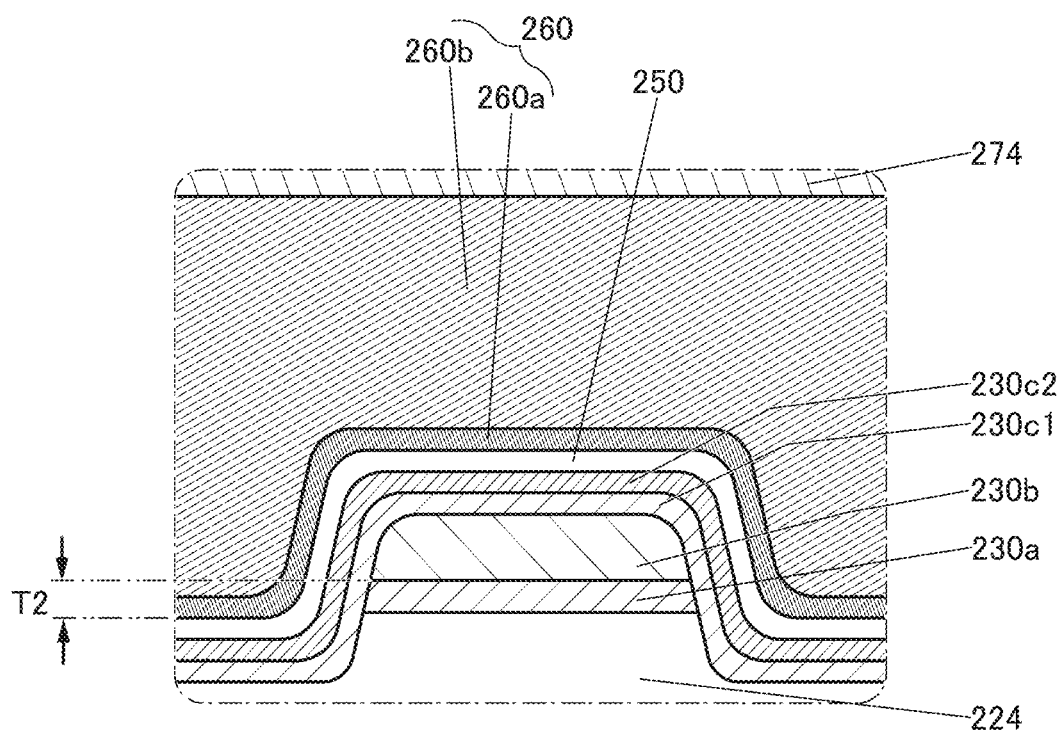

Here, FIG. 4(B) illustrates an enlarged view of a region in part of the transistor 200 illustrated in FIG. 3(C). FIG. 4(B) is an enlarged view in the W width direction of the channel formation region of the transistor 200.

As shown in FIG. 4(B), with the bottom surface of the insulator 224 as a reference, the level of the bottom surface of the conductor 260 in a region where the conductor 260 does not overlap with the oxide 230a and the oxide 230b is preferably located in a lower position than the level of the bottom surface of the oxide 230b. When T2 denotes the difference between the level of the bottom surface of the conductor 260 in a region where the oxide 230b does not overlap with the conductor 260 and the level of the bottom surface of the oxide 230b, T2 is set to greater than or equal to 0 nm and less than or equal to 100 nm, preferably greater than or equal to 3 nm and less than or equal to 50 nm, further preferably greater than or equal to 5 nm and less than or equal to 20 nm.

As described above, the conductor 260, which functions as the gate electrode, covers the side surface and the top surface of the oxide 230b of the channel formation region, with the oxide 230c and the insulator 250 positioned therebetween; this enables the electrical field of the conductor 260 to easily affect the entire oxide 230b of the channel formation region. Thus, the on-state current of the transistor 200 can be increased and the frequency characteristics of the transistor 200 can be improved.

Accordingly, a semiconductor device including a transistor with high on-state current can be provided. Alternatively, a semiconductor device including a transistor with excellent frequency characteristics can be provided. Alternatively, a semiconductor device that has stable electrical characteristics with reduced variations in electrical characteristics and higher reliability can be provided. Alternatively, a semiconductor device including a transistor with low off-state current can be provided.

The detailed structure of the semiconductor device including the transistor 200 of one embodiment of the present invention will be described below.

The conductor 205 is placed to overlap with the oxide 230 and the conductor 260. Furthermore, the conductor 205 is preferably provided to be embedded in the insulator 214 and the insulator 216. Here, the top surface of the conductor 205 is preferably made flat. For example, the average surface roughness (Ra) of the top surface of the conductor 205 is less than or equal to 1 nm, preferably less than or equal to 0.5 nm, further preferably less than or equal to 0.3 nm. This allows the improvement in flatness of the insulator 224 formed over the conductor 205 and the increase in crystallinity of the oxide 230b and the oxide 230c.

Here, the conductor 260 functions as a first gate (also referred to as a top gate) electrode in some cases. The conductor 205 functions as a second gate (also referred to as a bottom gate) electrode in some cases. In such cases, Vth of the transistor 200 can be controlled by changing a potential applied to the conductor 205 independently of a potential applied to the conductor 260. In particular, Vth of the transistor 200 can be higher than 0 V and the off-state current can be reduced by application of a negative potential to the conductor 205. Thus, drain current when a potential applied to the conductor 260 is 0 V can be lower in the case where a negative potential is applied to the conductor 205 than in the case where the negative potential is not applied to the conductor 205.

Note that as illustrated in FIG. 3(A), the conductor 205 is preferably provided larger than the region 234 of the oxide 230. In particular, as illustrated in FIG. 3(C), the conductor 205 preferably extends to a region outside an end portion of the region 234 in the oxide 230 that intersects with the channel width direction. That is, the conductor 205 and the conductor 260 preferably overlap with each other with the insulators therebetween on an outer side of the side surface of the oxide 230 in the channel width direction.

With the above structure, the channel formation region in the region 234 can be electrically surrounded by the electric field of the conductor 260 having a function of a first gate electrode and the electric field of the conductor 205 having a function of a second gate electrode.

As illustrated in FIG. 3(C), the conductor 205 is extended to function as a wiring. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

In the conductor 205, a first conductor is formed in contact with the inner wall of the opening in the insulator 216, and a second conductor is formed on the inner side. Here, the top surfaces of the first conductor of the conductor 205 and the second conductor thereof and the top surface of the insulator 216 can be substantially level with each other. Note that although the transistor 200 having a structure in which the first conductor of the conductor 205 and the second conductor thereof are stacked is shown, the present invention is not limited thereto. For example, the conductor 205 may have a single-layer structure or a stacked-layer structure including three or more layers. In the case where a structure body has a stacked-layer structure, layers may be distinguished by ordinal numbers corresponding to the formation order.

In addition, a conductor having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (a conductor through which the above impurities are less likely to pass) may be used for the first conductor of the conductor 205. Alternatively, it is preferable to use a conductor having a function of inhibiting diffusion of oxygen (e.g., at least one of an oxygen atom, an oxygen molecule, and the like) (through which the above oxygen is less likely to pass). Note that in this specification, a function of inhibiting diffusion of impurities or oxygen means a function of inhibiting diffusion of any one or all of the above impurities and oxygen.

When a conductor having a function of inhibiting oxygen diffusion is used for the first conductor of the conductor 205, the conductivity of the conductor 205 can be inhibited from being lowered because of oxidation. As the conductor having a function of inhibiting oxygen diffusion, for example, tantalum, tantalum nitride, ruthenium, ruthenium oxide, or the like is preferably used. Accordingly, a first conductor of the conductor 205 is a single layer or stacked layers of the above conductive materials.

A conductive material containing tungsten, copper, or aluminum as its main component is preferably used for the second conductor of the conductor 205.

It is preferable to use an insulating material having a function of inhibiting diffusion of oxygen (e.g., an oxygen atom or an oxygen molecule) (or an insulating material through which the oxygen is less likely to pass) for the insulator 214. The insulator 214 preferably functions as a barrier insulating film that inhibits the mixing of impurities such as water or hydrogen into the transistor 200 from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (an insulating material through which the above impurities are less likely to pass).

For example, it is preferable that silicon nitride or the like be used for the insulator 214. Accordingly, impurities such as water or hydrogen can be inhibited from being diffused into the transistor 200 side from the substrate side through the insulator 214. Alternatively, oxygen contained in the insulator 224 and the like can be inhibited from diffusing into the substrate side through the insulator 214. Alternatively, an insulator containing an oxide of one or both of aluminum and hafnium, which is an insulating material, may be used as the insulator 222.

The insulator 216, the insulator 280, and the insulator 281 preferably have a lower permittivity than the insulator 214. When a material with a low permittivity is used for an interlayer film, the parasitic capacitance generated between wirings can be reduced. For each of the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 222 and the insulator 224 each have a function of a gate insulator.

Here, it is preferable that the insulator 224 in contact with the oxide 230 release oxygen by heating. In this specification, oxygen that is released by heating is referred to as excess oxygen in some cases. For example, for the insulator 224, silicon oxide, silicon oxynitride, or the like is used as appropriate. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide that releases oxygen by heating is an oxide film in which the amount of released oxygen converted into oxygen atoms is greater than or equal to $1.0 \times 10^{18}$ atoms/$cm^3$, preferably greater than or equal to $1.0 \times 10^{19}$ atoms/$cm^3$, further preferably greater than or equal to $2.0 \times 10^{19}$ atoms/$cm^3$ or greater than or equal to $3.0 \times 10^{20}$ atoms/$cm^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

In addition, as illustrated in FIG. 3(C), the insulator 224 in a region overlapping with neither the insulator 254 nor the oxide 230b sometimes has smaller thickness than the insulator 224 in the other regions. In the insulator 224, the region overlapping with neither the insulator 254 nor the oxide 230b preferably has thickness with which released oxygen can be adequately diffused.

It is preferable that the insulator 222 have a function of inhibiting diffusion of oxygen (e.g., at least one of oxygen atoms, oxygen molecules, and the like) (or that the above oxygen be less likely to pass through the insulator). For example, the insulator 222 preferably has lower oxygen permeability than the insulator 224. The insulator 222 preferably has a function of inhibiting diffusion of oxygen or impurities, in which case diffusion of oxygen included in the oxide 230 to the insulator 220 side can be reduced. Furthermore, the conductor 205 can be inhibited from reacting with oxygen contained in the insulator 224 or the oxide 230.

Furthermore, the insulator 222 preferably functions as a barrier insulating film that inhibits impurities such as water and hydrogen from entering the transistor 200 from the substrate side. For example, the insulator 222 preferably has lower hydrogen permeability than the insulator 224. Surrounding the insulator 224, the oxide 230, and the like by the insulator 222 and the insulator 254 can inhibit entry of an impurity such as water or hydrogen into the transistor 200 from the outside.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used for the insulator 222. With scaling-down and higher integration of transistors, a problem such as leakage current may arise because of a thinner gate insulator. When a high-k material is used for an insulator functioning as the gate insulator, a gate potential during operation of the transistor can be reduced while the physical thickness of the gate insulator is kept.

Note that the insulator 222 and the insulator 224 may each have a stacked-layer structure including two or more layers. In that case, without limitation to a stacked-layer structure formed of the same material, a stacked-layer structure formed of different materials may be employed.

The oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

As illustrated in FIG. 3 and the like, the oxide 230c preferably includes the oxide 230c1 and the oxide 230c2 placed over the oxide 230c1. The oxide 230c1 preferably contains at least one of the metal elements contained in the metal oxide used as the oxide 230b, and further preferably contains all of these metal elements. Accordingly, the density of defect states at the interface between the oxide 230b and the oxide 230c1 can be decreased.

Note that the oxide 230 preferably has a stacked-layer structure of oxides that differ in the atomic ratio of metal atoms. Specifically, the atomic ratio of the element M to the constituent elements in the metal oxide used for the oxide 230a is preferably greater than the atomic ratio of the element M to the constituent elements in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a. A metal oxide that can be used for the oxide 230a or the oxide 230b can be used for the oxide 230c. In the case where a stacked-layer structure including the oxide 230c1 and the oxide 230c2 is employed, when the atomic proportion of In in the constituent elements in the metal oxide used for the oxide 230c2 is made lower than the atomic proportion of In in the constituent elements in the metal oxide used for the oxide 230c1, diffusion of In to the insulator 250 side can be inhibited.

The oxide 230b preferably has crystallinity. For example, a CAAC-OS is preferably used. An oxide having crystallinity, such as a CAAC-OS, has a dense structure with small amounts of impurities and defects (oxygen vacancies or the like) and high crystallinity. This can reduce oxygen extraction from the oxide 230b by the source electrode or the drain electrode. This can reduce oxygen extraction from the oxide 230b even when heat treatment is performed; thus, the transistor 200 is stable with respect to high temperatures in a fabrication process, or thermal budget.

The oxide 230c1 and the oxide 230c2 preferably have crystallinity; for example, a CAAC-OS is preferably used.

The energy of the conduction band minimum of each of the oxide 230a and the oxide 230c2 is preferably higher than the energy of the conduction band minimum of the oxide 230b. In other words, the electron affinity of each of the oxide 230a and the oxide 230c2 is preferably smaller than the electron affinity of the oxide 230b.

Here, the energy level of the conduction band minimum gradually changes at junction portions of the oxide 230a, the oxide 230b, and the oxide 230c. In other words, the energy level of the conduction band minimum at the junction portions of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, as the oxide 230a, a metal oxide with In:Ga:Zn=1:3:4 [atomic ratio] or 1:1:0.5 [atomic ratio] is used. As the oxide 230b, a metal oxide with In:Ga:Zn=4:2:3 [atomic ratio] or 3:1:2 [atomic ratio] is used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the combination of the oxide 230c1 and oxide 230c2 include a stacked-layer structure of In:Ga:Zn=4:2:3 [atomic ratio] and In:Ga:Zn=1:3:4 [atomic ratio], a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and high frequency characteristics.

A metal oxide functioning as an oxide semiconductor is preferably used as the oxide 230. For example, as the metal oxide to be the region 234, it is preferable to use a metal oxide having a bandgap of 2 eV or more, preferably 2.5 eV or more. With the use of a metal oxide having such a wide bandgap, the off-state current of the transistor can be reduced. With the use of such a transistor, a semiconductor device with low power consumption can be provided.

Figure 5:
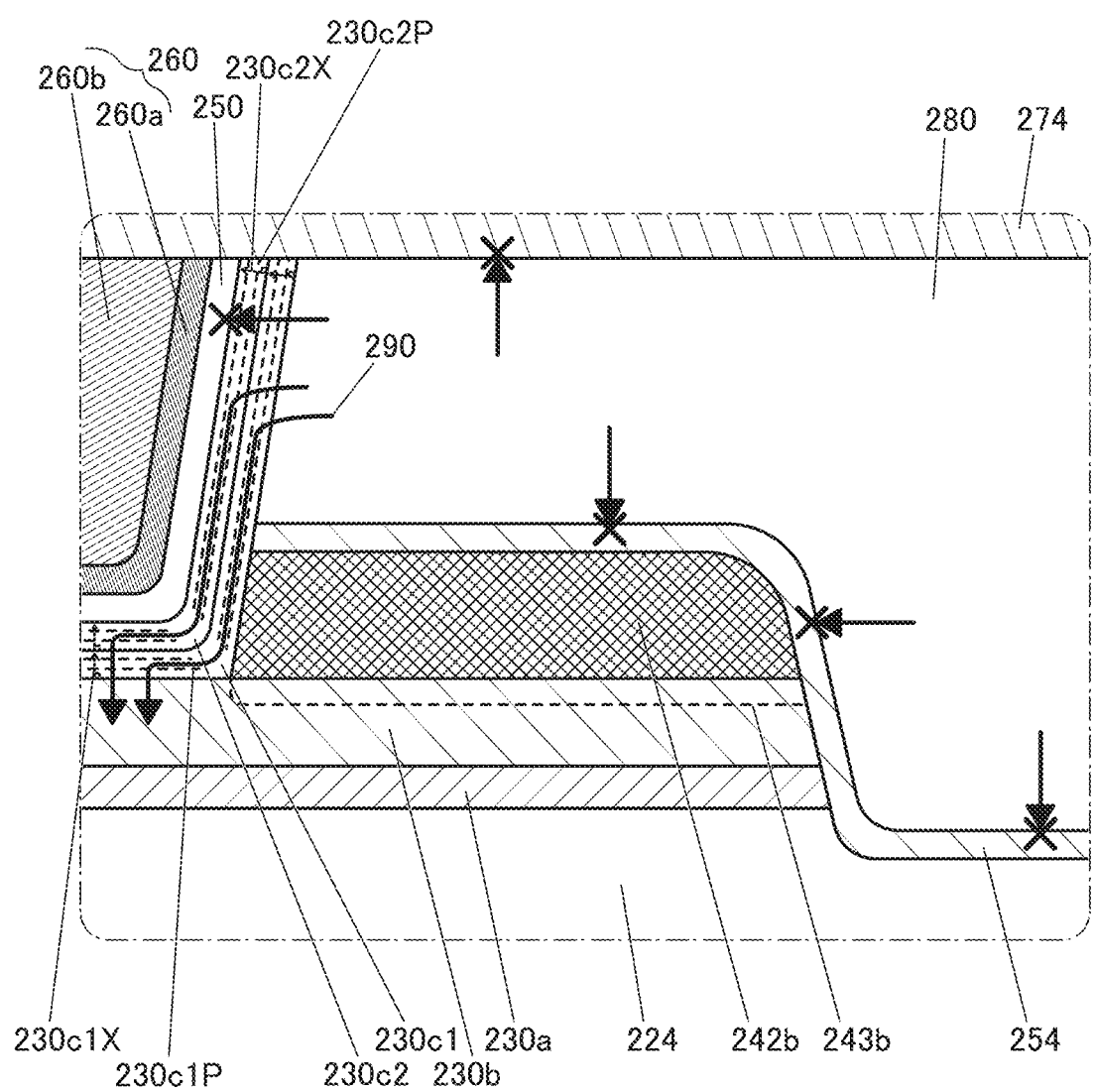
FIG. 5 A cross-sectional view of a semiconductor device of one embodiment of the present invention.
Figure 6:
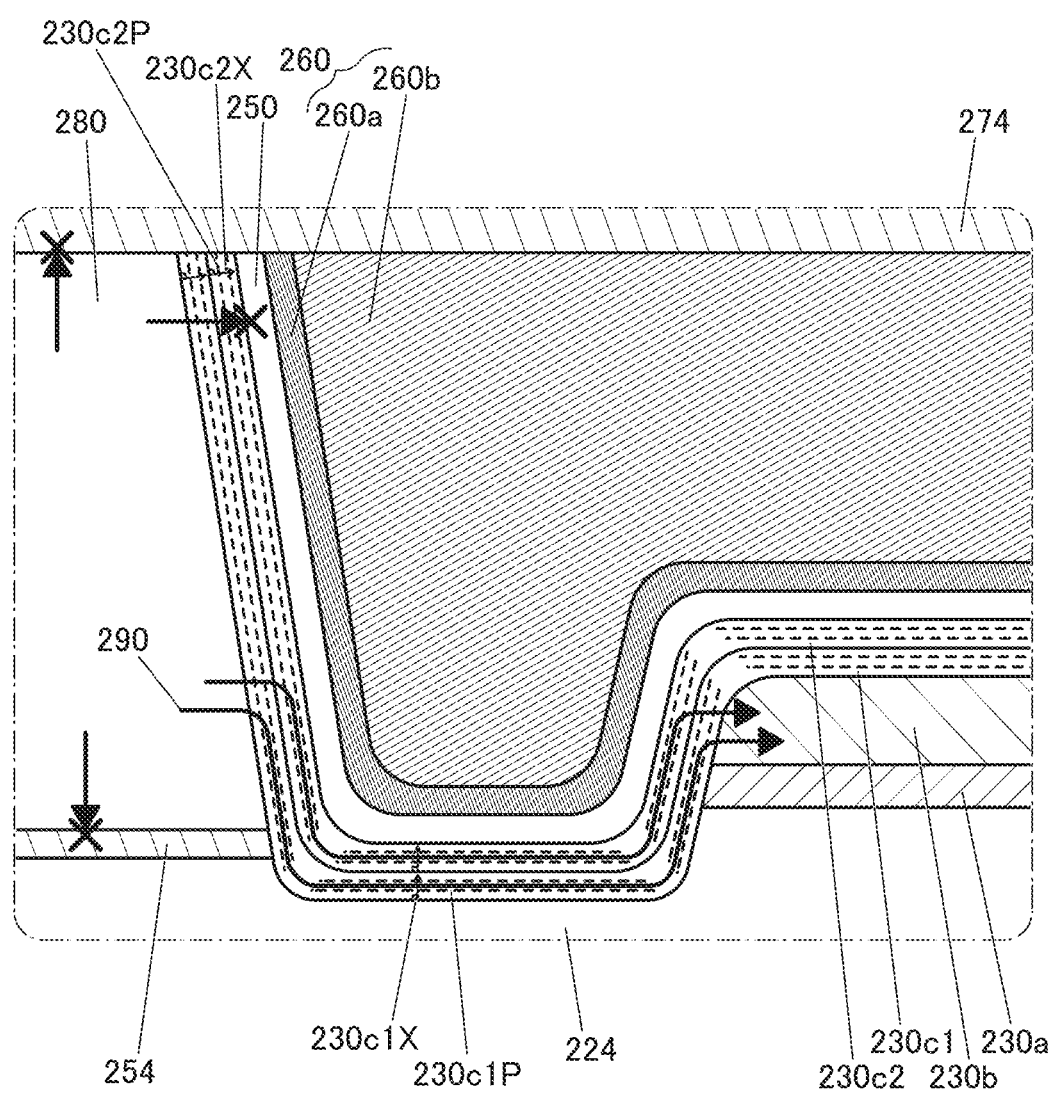
FIG. 6 A cross-sectional view of a semiconductor device of one embodiment of the present invention.
Figure 7A:
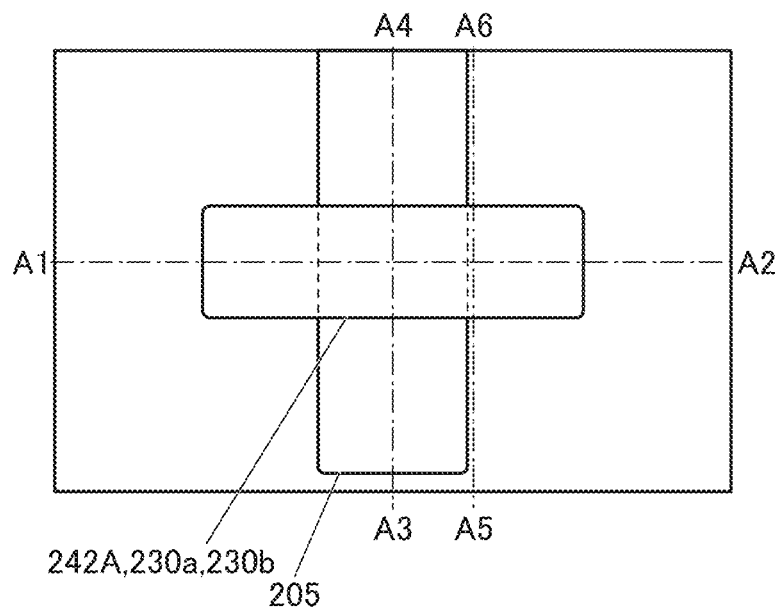
FIG. 7 (A) to (D) A top view and cross-sectional views illustrating a method for manufacturing a semiconductor device of one embodiment of the present invention.
Figure 7C:
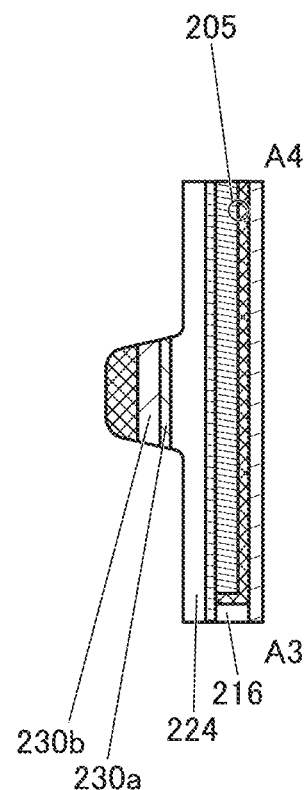
Figure 7B:
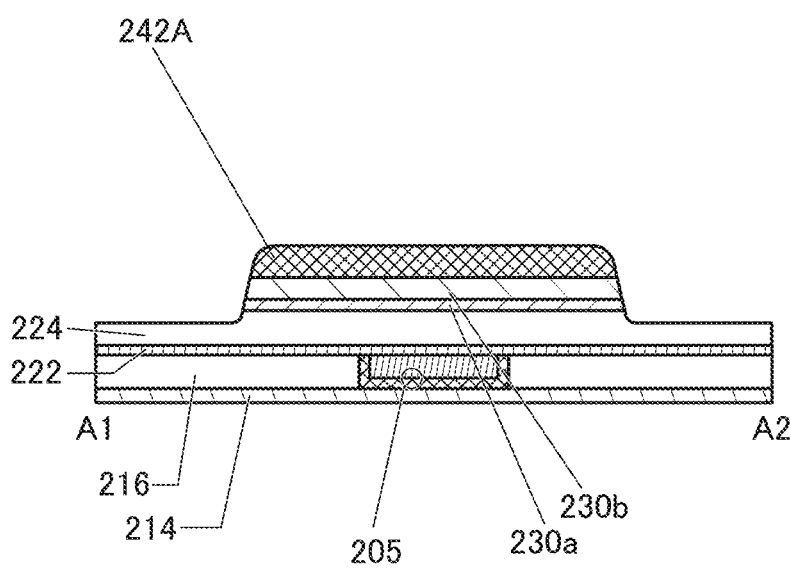
Figure 7D:
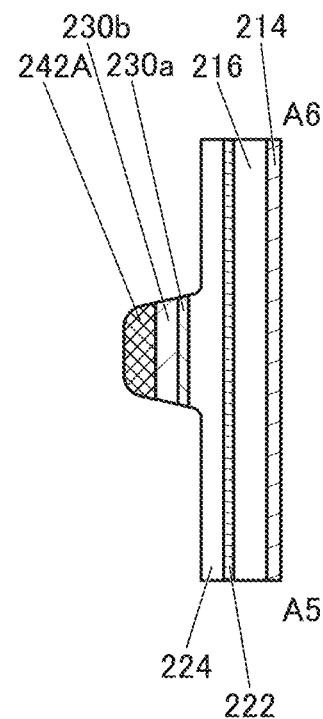
Figure 8A:
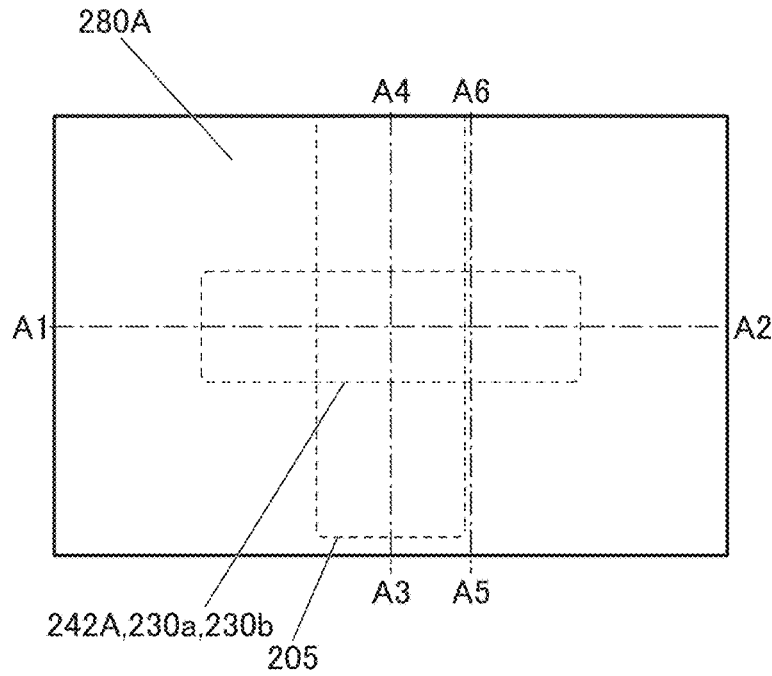
FIG. 8 (A) to (D) A top view and cross-sectional views illustrating a method for manufacturing a semiconductor device of one embodiment of the present invention.
Figure 8C:
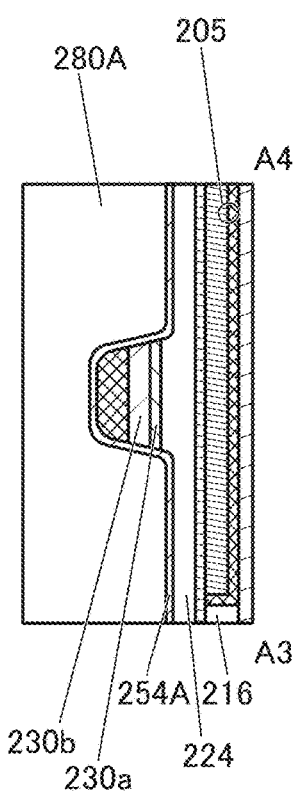
Figure 8B:
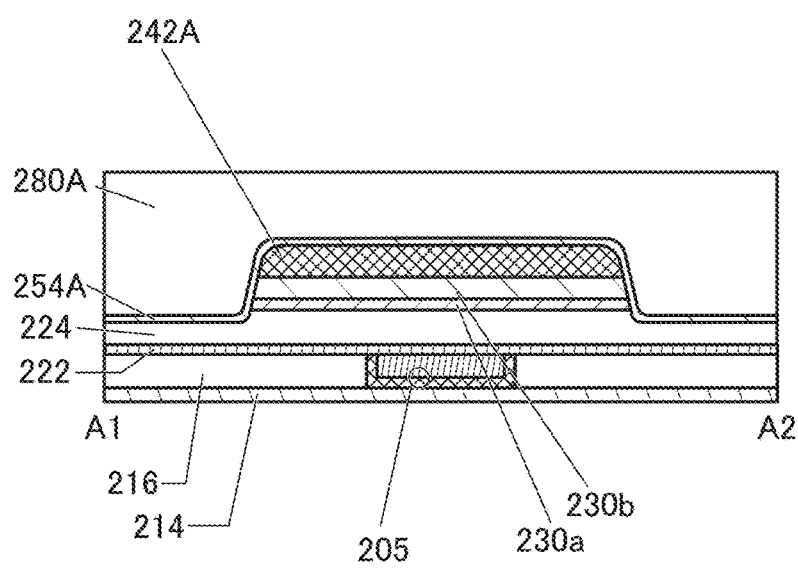
Figure 8D:
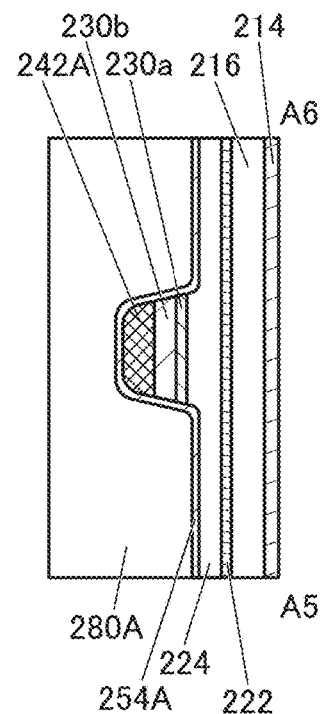
Figure 9A:
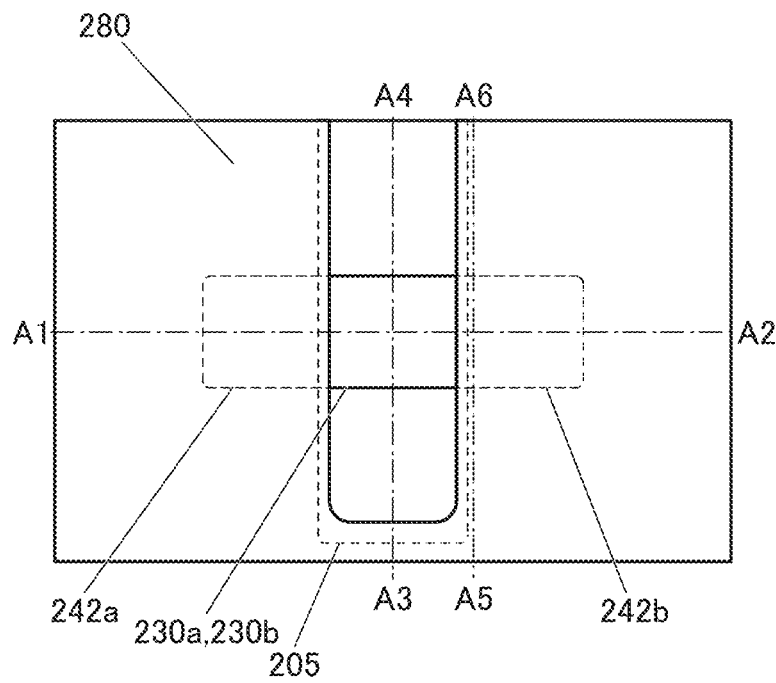
FIG. 9 (A) to (D) A top view and cross-sectional views illustrating a method for manufacturing a semiconductor device of one embodiment of the present invention.
Figure 9C:
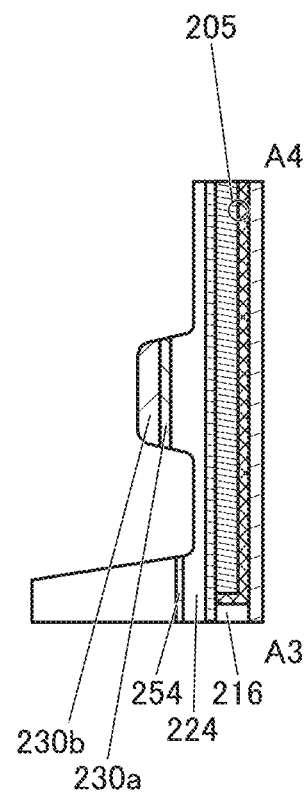
Figure 9B:
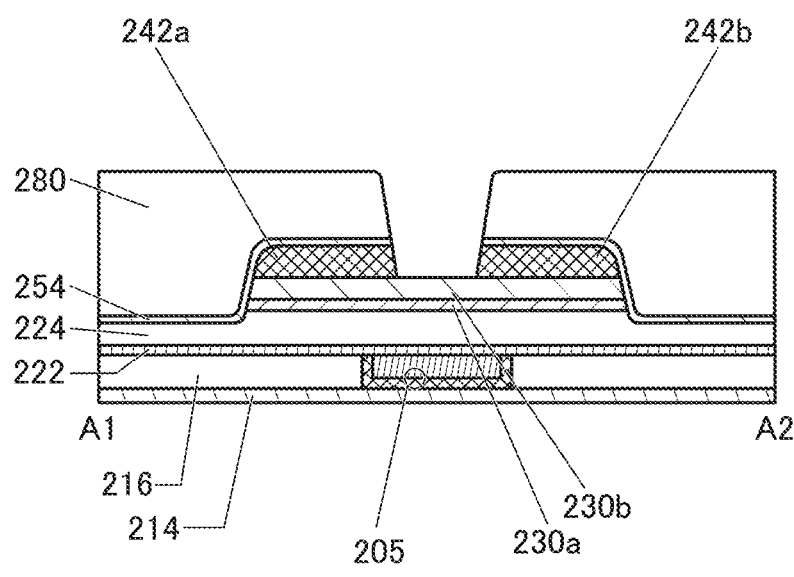
Figure 9D:
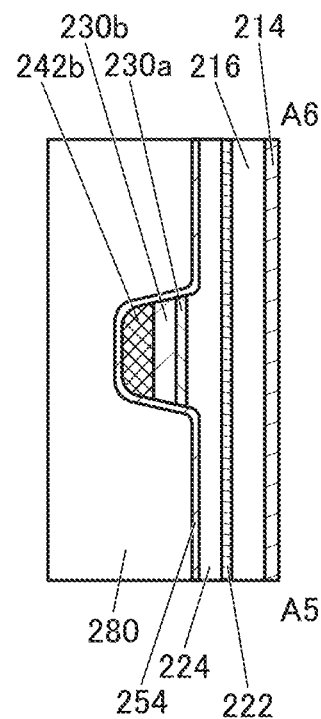
Figure 10A:
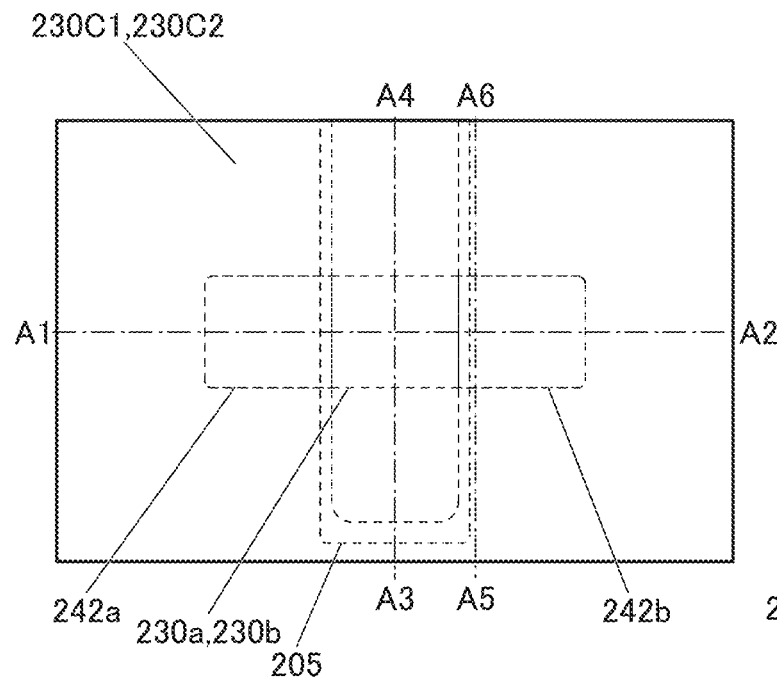
FIG. 10 (A) to (D) A top view and cross-sectional views illustrating a method for manufacturing a semiconductor device of one embodiment of the present invention.
Figure 10C:
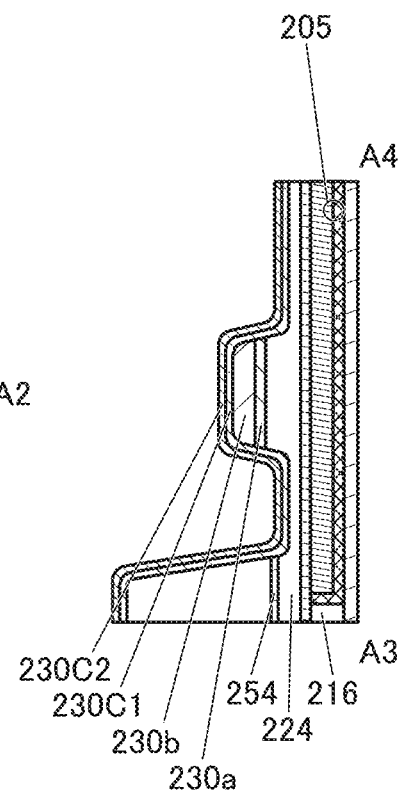
Figure 10B:
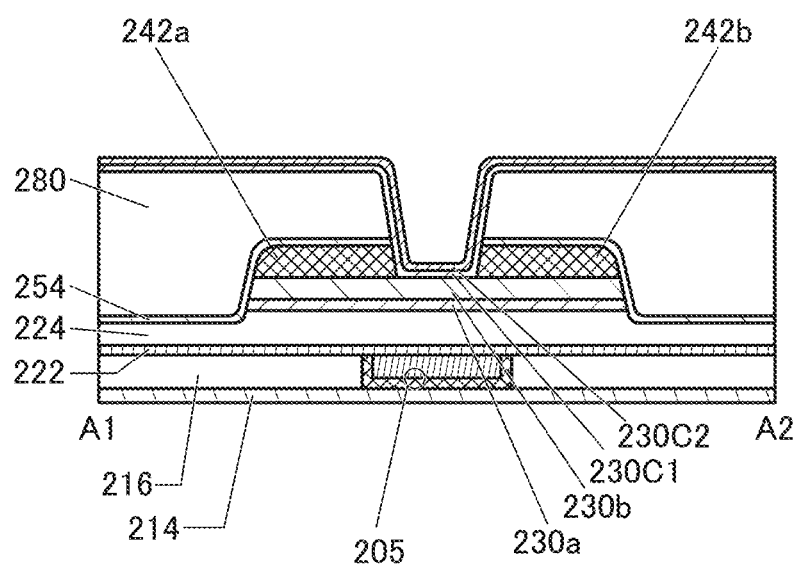
Figure 10D:
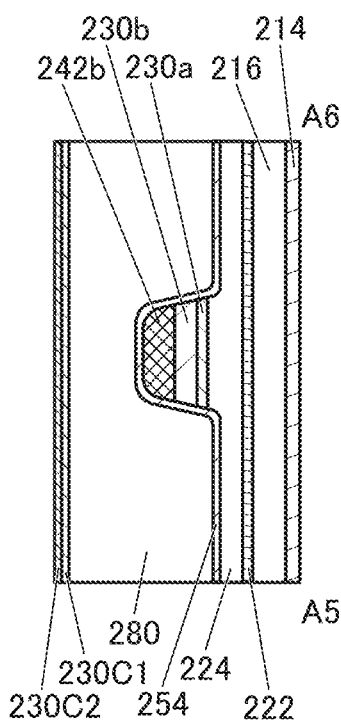
Figure 12A:
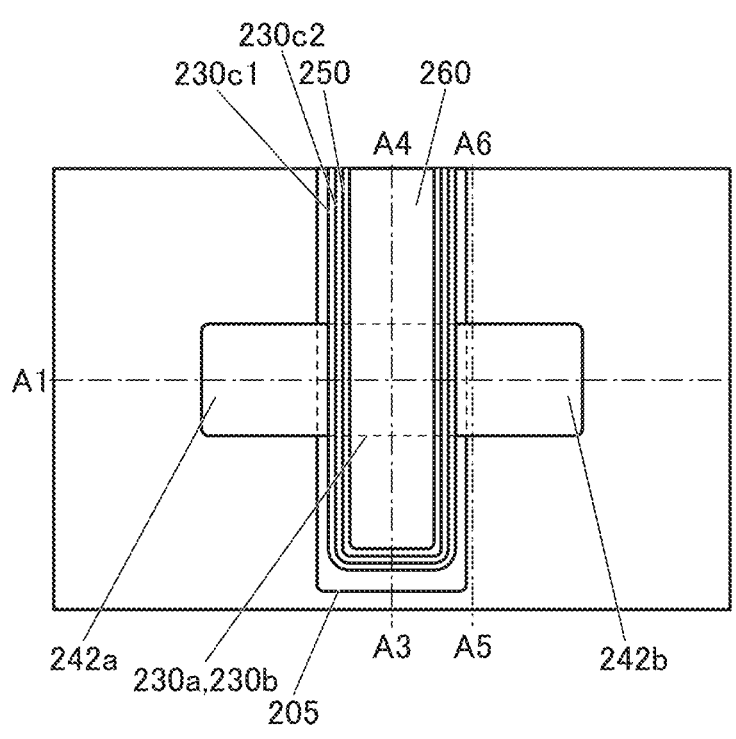
FIG. 12 (A) to (D) A top view and cross-sectional views illustrating a method for manufacturing a semiconductor device of one embodiment of the present invention.
Figure 12C:
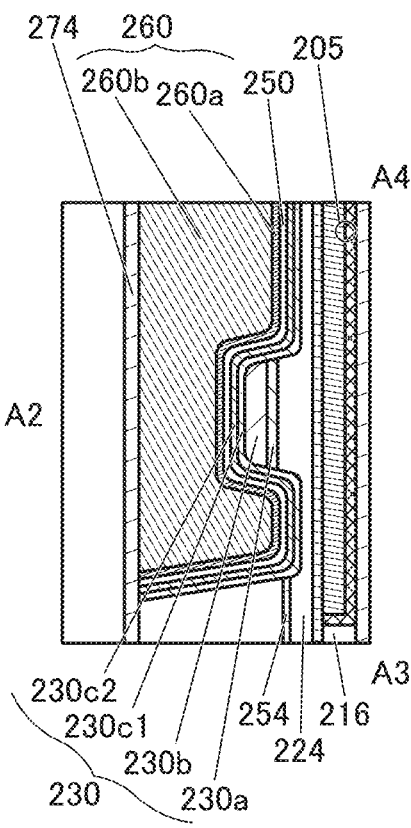
Figure 12B:
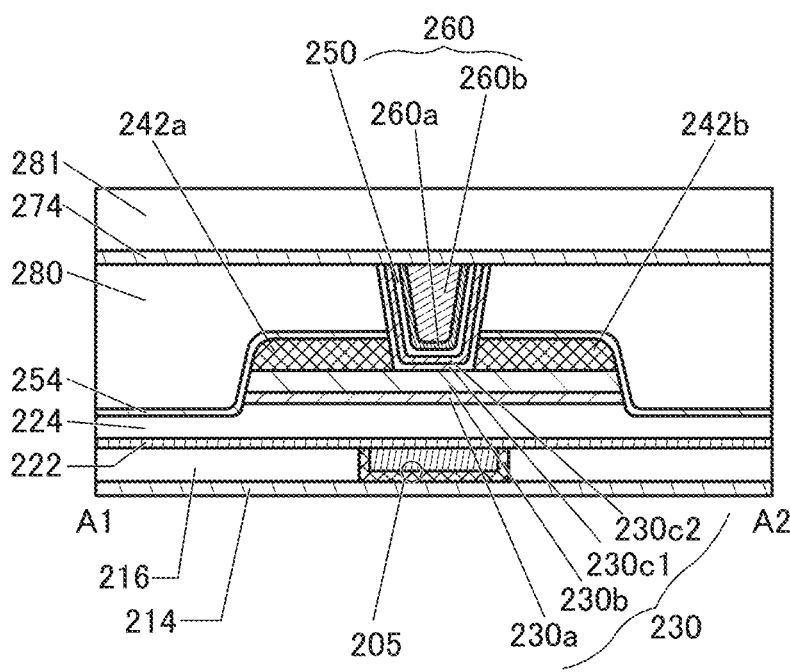
Figure 12D:
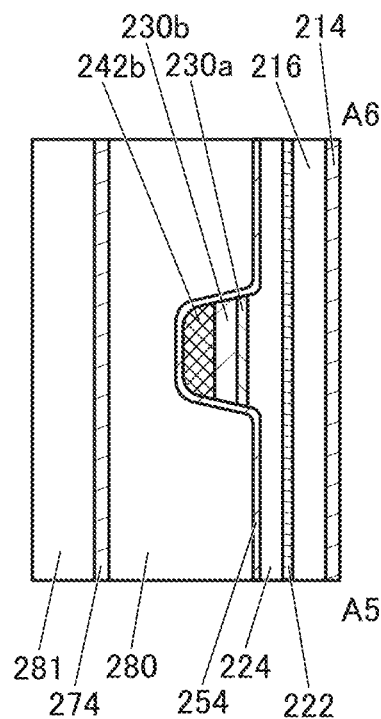

Here, the behavior of oxygen 290 contained in the insulator 280 at the time when the transistor 200 of this embodiment is subjected to heat treatment will be described with reference to FIG. 5 and FIG. 6. FIG. 5 is an enlarged cross-sectional view of the transistor 200 in the channel length direction, and FIG. 6 is an enlarged cross-sectional view of the transistor 200 in the channel width direction. As described above, in the semiconductor device described in this embodiment, the insulator 280 containing excess oxygen is surrounded by the insulator 274, the oxide 230c1, the oxide 230c2, and the insulator 254, and is isolated from the conductor 260, the conductor 242a, and the conductor 242b. Thus, as illustrated in FIG. 5 and FIG. 6, the oxygen 290 in the insulator 280 is blocked by the insulator 274, the oxide 230c1, the oxide 230c2, and the insulator 254, and does not directly diffuse into the conductor 260, the conductor 242a, and the conductor 242b even when heat treatment is performed.

When oxygen is released from the oxide 230b by heat treatment and oxygen vacancies are formed, oxygen diffuses from the oxide 230c1 to the oxide 230b to fill the oxygen vacancies in the vicinity of the interface between the oxide 230b and the oxide 230c1. Oxygen supplied to the oxide 230b diffuses through the oxide 230b while repeatedly filling the oxygen vacancies in the oxide 230b.

Supplying oxygen to the oxide 230b causes oxygen vacancies to be formed also in the oxide 230c1. At this time, the oxygen 290 diffuses from the insulator 280 into the oxide 230c1 to fill the oxygen vacancies in the vicinity of the interface between the insulator 280 and the oxide 230c1. The oxygen 290 supplied to the oxide 230c1 diffuses through the oxide 230c1 while repeatedly filling the oxygen vacancies in the oxide 230c. Note that as illustrated in FIG. 5 and FIG. 6, the oxygen 290 in the oxide 230c1 diffuses into the oxide 230c2 to be supplied to the oxide 230b through the oxide 230c2 in some cases.

Here, the oxide 230c1 is preferably a CAAC-OS. The oxide 230c1 includes a crystal region having a crystal layer 230c1P that extends in the a-b plane direction and a c-axis 230c1X perpendicular to the a-b plane direction, as illustrated in FIG. 5 and FIG. 6. Here, in the oxide 230c1, the c-axis 230c1X preferably faces in a direction substantially perpendicular to a formation surface of the oxide 230c1. Thus, the oxide 230c1 includes a region where the c-axis 230c1X is oriented substantially perpendicular to the top surface of the oxide 230b, a region where the c-axis 230c1X is oriented substantially perpendicular to the side surfaces of the conductor 242a, the insulator 254, and the insulator 280, and a region where the c-axis 230c1X is oriented substantially perpendicular to the side surfaces of the conductor 242b, the insulator 254, and the insulator 280. Note that the oxide 230c2, in the same way as the oxide 230c1, is also a CAAC-OS, and may include a crystal region having a crystal layer 230c2P that extends in the a-b plane direction and a c-axis 230c2X perpendicular to the a-b plane direction, as illustrated in FIG. 5 and FIG. 6.

A CAAC-OS has a property that makes oxygen more easily diffuse in the a-b plane direction rather than in the c-axis direction. Thus, as illustrated in FIG. 5, the oxygen 290 supplied from the insulator 280 to the oxide 230c1 and the oxide 230c2 is diffused preferentially into the vicinity of the interface between the oxide 230c1 and the oxide 230b and can fill the oxygen vacancies in the oxide 230c.

As described above, the transistor 200 described in this embodiment is capable of supplying oxygen from the insulator 280 into the oxide 230 to prevent an increase of oxygen vacancies in the oxide 230 even when heat treatment is performed after the fabrication of the transistor 200. Thus, even in lower layers in the stacked-layer structure, the electrical characteristics of the transistor 200 can be stable with suppressed variation, and the reliability of the transistor 200 can be improved.

Note that although FIG. 5 and FIG. 6 each illustrate an example in which the oxygen 290 diffuses through the oxide 230c1 and the oxide 230c2, this embodiment is not limited to this example. A structure in which the oxygen 290 diffuses only through the oxide 230c1 and the oxide 230c2 prevents the diffusion of the oxygen 290 may be employed, for example. With such a structure, the absorption of the oxygen 290 into the conductor 260 can be further reduced.

The conductor 242 (the conductor 242a and the conductor 242b) functioning as the source electrode and the drain electrode is provided over the oxide 230b. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

It is preferable that, like the insulator 222 or the like, the insulator 254 have a function of inhibiting diffusion of oxygen (e.g., at least one of oxygen atoms, oxygen molecules, and the like) (or that the above oxygen be less likely to pass through the insulator). For example, the insulator 254 preferably has the property of being less likely to transmit oxygen than the insulator 224. Furthermore, as illustrated in FIGS. 3(B) and 3(C), the insulator 254 is preferably in contact with the top surface and the side surface of the conductor 242a, the top surface and the side surface of the conductor 242b, the side surfaces of the oxide 230a and the oxide 230b, and the top surface of the insulator 224. Such a structure can prevent oxygen contained in the insulator 280 from being absorbed into the conductor 242a and the conductor 242b.

Note that as illustrated in FIG. 3(D), even side surfaces at the channel width direction side of the oxide 230a and the oxide 230b in a region overlapping with the conductor 242b (the conductor 242a) are covered with the insulator 254. Such a structure can prevent oxygen contained in the insulator 280 from being absorbed into the conductor 242a and the conductor 242b.

In addition, the insulator 254 preferably functions as a barrier insulating film that inhibits entry of impurities such as water and hydrogen into the transistor 200 from the insulator 280 side. The insulator 254 preferably has lower hydrogen permeability than the insulator 224, for example.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Accordingly, oxygen can be supplied from the region to the oxide 230 through the insulator 224. Here, with the insulator 254 having a function of inhibiting upward oxygen diffusion, oxygen can be prevented from diffusing from the oxide 230 into the insulator 280. Moreover, with the insulator 222 having a function of inhibiting downward diffusion of oxygen, oxygen can be prevented from diffusing from the oxide 230 into the insulator 216. In the above manner, oxygen is supplied to the region 234 functioning as the channel formation region of the oxide 230. Accordingly, oxygen vacancies in the oxide 230 can be reduced, so that the transistor can be inhibited from becoming normally on.

The insulator 254 can have a multilayer structure of two or more layers. For example, the insulator 254 may have a two-layer structure in which the first layer is deposited by a sputtering method in an oxygen-containing atmosphere, after which the second layer is deposited by an ALD method. An ALD method is a deposition method achieving excellent step coverage, and thus can prevent formation of disconnection or the like due to unevenness of the first layer.

An insulator containing an oxide of one or both of aluminum and hafnium is preferably deposited as the insulator 254, for example. Note that as the insulator containing an oxide of one or both of aluminum and hafnium, aluminum oxide, hafnium oxide, an oxide containing aluminum and hafnium (hafnium aluminate), or the like is preferably used. Alternatively, a nitride having a high barrier property such as silicon nitride may be used for the insulator 254.

The insulator 250 functions as a gate insulator. The insulator 250 is preferably placed in contact with the inner side (the top surface and the side surface) of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

The insulator 250 is preferably formed using an insulator from which oxygen is released by heating as in the insulator 224. When an insulator from which oxygen is released by heating is provided as the insulator 250 in contact with the top surface of the oxide 230c, oxygen can be efficiently supplied to the region 234 of the oxide 230b. Furthermore, as in the insulator 224, the concentration of an impurity such as water or hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 to the conductor 260. Provision of the metal oxide that inhibits diffusion of oxygen inhibits diffusion of oxygen from the insulator 250 to the conductor 260. That is, a reduction in the amount of excess oxygen supplied to the oxide 230 can be inhibited. In addition, oxidation of the conductor 260 due to oxygen from the insulator 250 can be inhibited.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Accordingly, a gate potential that is applied during operation of the transistor can be reduced while the physical thickness of the gate insulator is kept. In addition, the equivalent oxide thickness (EOT) of an insulator functioning as the gate insulator can be reduced.

Specifically, a metal oxide containing one or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium such as aluminum oxide, hafnium oxide, or an oxide containing aluminum and hafnium (hafnium aluminate).

Although the conductor 260 has a two-layer structure in FIG. 1, a single-layer structure or a stacked-layer structure of three or more layers may be employed.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, the conductivity of the conductor 260b can be inhibited from being lowered because of oxidation due to oxygen included in the insulator 250. As a conductive material having a function of inhibiting diffusion of oxygen, for example, tantalum, tantalum nitride, ruthenium, ruthenium oxide, or the like is preferably used.

Moreover, a conductive material containing tungsten, copper, or aluminum as its main component is preferably used for the conductor 260b. As the conductor 260 also functioning as a wiring, a conductor having high conductivity is preferably used. For example, a conductive material containing tungsten, copper, or aluminum as its main component can be used. In addition, the conductor 260b may have a stacked-layer structure, for example, a stacked-layer structure of any of the above conductive materials and titanium or titanium nitride.

The insulator 280 is provided over the insulator 224, the oxide 230, and the conductor 242 with the insulator 254 placed therebetween. The insulator 280 preferable contains oxygen that is released by heating. For example, as the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride, which are thermally stable, are preferable. Materials such as silicon oxide, silicon oxynitride, and porous silicon oxide, in each of which a region containing oxygen that is released by heating can be easily formed, are particularly preferable.

The concentration of an impurity such as water or hydrogen included in the insulator 280 is preferably lowered. A top surface of the insulator 280 may be planarized.

As well as the insulator 210 or the like, the insulator 274 preferably functions as a barrier insulating film that inhibits an impurity such as water or hydrogen from being mixed in the insulator 280 from the above. The insulator 274 is formed using an insulator that can be used as the insulator 210 or the insulator 254, for example.

It is preferable that, like the insulator 222 or the like, the insulator 274 have a function of inhibiting diffusion of oxygen (e.g., at least one of oxygen atoms, oxygen molecules, and the like) (or that the above oxygen be less likely to pass through the insulator). For example, the insulator 274 preferably has a lower oxygen permeability than the insulator 280. Furthermore, as illustrated in FIGS. 3(B) and 1(C), the insulator 274 is preferably in contact with the top surface of the conductor 260, the top surface of the insulator 250, the top surface of the oxide 230c, and the top surface of the insulator 280. With such a structure, oxygen contained in the insulator 280 can be inhibited from being absorbed into the conductor 260.

In addition, the insulator 274 preferably functions as a barrier insulating film that inhibits the mixing of impurities such as water or hydrogen into the transistor 200 from the insulator 281 side. For example, the insulator 274 preferably has a lower hydrogen permeability than the insulator 280.

It is preferable that the insulator 274 be deposited by a sputtering method. It is more preferable that the insulator 274 be deposited in an oxygen-containing atmosphere by a sputtering method. When the insulator 274 is deposited by a sputtering method, excess oxygen can be added to the vicinity of a region of the insulator 280 that is in contact with the insulator 274. Accordingly, oxygen can be supplied from the region to the oxide 230b through the oxide 230c. Here, with the insulator 274 having a function of inhibiting upward oxygen diffusion, oxygen can be prevented from diffusing above the insulator 280. Moreover, with the insulator 254 having a function of inhibiting downward oxygen diffusion, oxygen can be prevented from diffusing downward from the insulator 280. In the above manner, oxygen is supplied to the region 234 functioning as the channel formation region of the oxide 230b. Accordingly, oxygen vacancies in the oxide 230b can be reduced, so that the transistor can be inhibited from becoming normally on.

The insulator 281 functioning as an interlayer film is preferably provided over the insulator 274. As in the insulator 224 or the like, the concentration of an impurity such as water or hydrogen included in the film of the insulator 281 is preferably lowered.

The conductor 240a and the conductor 240b are placed in the openings formed in the insulator 281, the insulator 274, the insulator 280, and the insulator 254. The conductor 240a and the conductor 240b are placed to face each other with the conductor 260 interposed therebetween. Note that the level of the top surfaces of the conductor 240a and the conductor 240b may be on the same surface as the top surface of the insulator 281.

Note that the insulator 241a is provided in contact with the inner wall of the opening of the insulator 281, the insulator 274, the insulator 280, and the insulator 254 and the first conductor of the conductor 240a is formed on the side surface. The conductor 242a is located on at least part of the bottom portion of the opening, and thus the conductor 240a is in contact with the conductor 242a. Similarly, the insulator 241b is provided in contact with the inner wall of the opening of the insulator 281, the insulator 274, the insulator 280, and the insulator 254, and the first conductor of the conductor 240b is formed on the side surface. The conductor 242b is located on at least part of the bottom portion of the opening, and thus the conductor 240b is in contact with the conductor 242b.

For the conductor 240a and the conductor 240b, a conductive material containing tungsten, copper, or aluminum as its main component is preferably used. In addition, the conductor 240a and the conductor 240b may have a stacked-layer structure In the case where the conductor 240 has a stacked-layer structure, a conductive material having a function of inhibiting passage of an impurity such as water or hydrogen is preferably used for a conductor in contact with the oxide 230a, the oxide 230b, the conductor 242, the insulator 254, the insulator 280, the insulator 274, and the insulator 281. For example, tantalum, tantalum nitride, titanium, titanium nitride, ruthenium, ruthenium oxide, or the like is preferably used. A single layer or a stacked layer of the conductive material having a function of inhibiting passage of an impurity such as water or hydrogen may be used. The use of the conductive material can prevent oxygen added to the insulator 280 from being absorbed by the conductor 240a and the conductor 240b. Moreover, an impurity such as water or hydrogen can be inhibited from being mixed in the oxide 230 through the conductor 240a and the conductor 240b from a layer above the insulator 281.

As the insulator 241a and the insulator 241b, an insulator that can be used as the insulator 254 (e.g., aluminum oxide or silicon nitride) is used, for example. Since the insulator 241a and the insulator 241b are provided in contact with the insulator 254, an impurity such as water or hydrogen can be inhibited from being mixed in the oxide 230 through the conductor 240a and the conductor 240b from the insulator 280 or the like. In addition, oxygen included in the insulator 280 can be prevented from being absorbed by the conductor 240a and the conductor 240b.

Although not illustrated, a conductor functioning as a wiring may be placed in contact with the top surface of the conductor 240a and the top surface of the conductor 240b. For the conductor functioning as a wiring, a conductive material containing tungsten, copper, or aluminum as its main component is preferably used. The conductor may have a stacked-layer structure, for example, a stacked layer of any of the above conductive materials and titanium or titanium nitride. Note that the conductor may be formed to be embedded in an opening provided in an insulator.

<Constituent Material of Semiconductor Device>

Constituent materials that can be used for the semiconductor device will be described below.

<<Substrate>>

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon, germanium, or the like as the material, and a compound semiconductor substrate including silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. A substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

With miniaturization and high integration of a transistor, a problem such as leakage current may arise because of a thinner gate insulator. When a high-k material is used for an insulator functioning as the gate insulator, a voltage during operation of the transistor can be reduced while the physical thickness of the gate insulator is kept. By contrast, when a material with a low relative permittivity is used for the insulator functioning as an interlayer film, the parasitic capacitance generated between wirings can be reduced. Accordingly, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting passage of oxygen and impurities such as hydrogen (e.g., the insulator 214, the insulator 222, the insulator 254, the insulator 274, and the like), the electrical characteristics of the transistor can be stable. As the insulator having a function of inhibiting passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide or silicon nitride; or the like can be used.

In addition, the insulator functioning as the gate insulator is preferably an insulator including a region containing oxygen that is released by heating. When a structure is employed in which silicon oxide or silicon oxynitride including a region containing oxygen that is released by heating is in contact with the oxide 230, oxygen vacancies included in the oxide 230 can be compensated for.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably employed for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen included in the metal oxide in which a channel is formed can be trapped in some cases. Alternatively, hydrogen mixed from an external insulator or the like can be trapped in some cases.

<<Metal Oxide>>

As the oxide 230, a metal oxide functioning as an oxide semiconductor is preferably used. A metal oxide that can be used as the oxide 230 of the present invention will be described below The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be combined as the element M.

Note that in this specification and the like, a metal oxide containing nitrogen is also referred to as a metal oxide in some cases. In addition, a metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

[Impurities]

Here, the influence of each impurity in the metal oxide will be described.

When the metal oxide contains an alkali metal or an alkaline earth metal, defect states are formed and carriers are generated, in some cases. Thus, a transistor using a metal oxide that contains an alkali metal or an alkaline earth metal in its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS (the concentration obtained by Secondary Ion Mass Spectrometry (SIMS)) is set lower than or equal to $1\times10^{18}$ atoms/cm$^3$, preferably lower than or equal to $2\times10^{16}$ atoms/cm$^3$.

Hydrogen included in a metal oxide reacts with oxygen bonded to a metal atom to become water, and thus forms an oxygen vacancy, in some cases. When hydrogen enters the oxygen vacancy, an electron which is a carrier is generated in some cases. Furthermore, in some cases, bonding of part of hydrogen to oxygen bonded to a metal atom causes generation of an electron which is a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities are sufficiently reduced is used in a channel formation region of a transistor, stable electrical characteristics can be given.

Note that as a metal oxide used for a semiconductor of a transistor, a thin film having high crystallinity is preferably used. With the use of the thin film, the stability or the reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, the manufacturing process cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

Non-Patent Document 6 shows that a transistor using a metal oxide has an extremely low leakage current in an off state; specifically, the off-state current per micrometer in the channel width of the transistor is of the order of yA/μm ($10^{-24}$ A/μm). For example, a low-power-consumption CPU applying a characteristic of low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristics of a low leakage current of the transistor have been studied.

<Method of Fabricating Semiconductor Device>

Next, a method for fabricating a semiconductor device including the transistor 200 according to the present invention, which is illustrated in FIG. 1, will be described with reference to FIG. 5 to FIG. 12. In FIG. 5 to FIG. 12, (A) of each drawing is a top view. Moreover, (B) of each drawing is a cross-sectional view corresponding to a portion indicated by the dashed-dotted line A1-A2 in (A), and is also a cross-sectional view of the transistor 200 in the channel length direction. Furthermore, (C) of each drawing is a cross-sectional view corresponding to a portion indicated by the dashed-dotted line A3-A4 in (A), and is also a cross-sectional view in the channel width direction of the transistor 200. Furthermore, (D) of each drawing is a cross-sectional view corresponding to a portion indicated by the dashed-dotted line A5-A6 in (A). Note that for simplification of the drawings, some components are not illustrated in the top view of (A) of each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (e.g., transistor or capacitor), or the like included in a semiconductor device might be charged up by receiving charges from plasma. In this case, accumulated charges might break the wiring, electrode, element, or the like included in the semiconductor device. By contrast, in the case of a thermal CVD method that does not use plasma, such plasma damage is not caused and the yield of the semiconductor device can be increased. Furthermore, a thermal CVD method does not cause plasma damage during deposition, so that a film with few defects can be obtained.

In an ALD method, one atomic layer can be deposited at a time using self-regulating characteristics of atoms. Hence, an ALD method has effects such as deposition of an extremely thin film, deposition on a component with a large aspect ratio, deposition of a film with a small number of defects such as pinholes, deposition with excellent coverage, and low-temperature deposition. An ALD method includes a deposition method using plasma, a PEALD (plasma-enhanced ALD) method. The use of plasma is sometimes preferable because deposition at a lower temperature is possible. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and thus is suitable for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

A CVD method and an ALD method enable control of the composition of a film to be obtained with a flow rate ratio of the source gases. For example, by a CVD method or an ALD method, a film with a certain composition can be deposited depending on a flow rate ratio of the source gases. Moreover, by a CVD method or an ALD method, by changing the flow rate ratio of the source gases during the deposition, a film whose composition is continuously changed can be deposited. In the case of depositing while changing the flow rate ratio of the source gases, as compared with the case of depositing with the use of a plurality of deposition chambers, time taken for the deposition can be shortened because time taken for transfer and pressure adjustment is omitted. Thus, productivity of semiconductor devices can be improved in some cases.

In this embodiment, for the insulator 214, silicon nitride is deposited by a CVD method. As described here, an insulator through which copper is less likely to pass, such as silicon nitride, is used for the insulator 214; accordingly, even when a metal that is likely to diffuse, such as copper, is used for a conductor in a layer (not illustrated) below the insulator 214, diffusion of the metal to a layer above the insulator 214 can be inhibited.

Next, the insulator 216 is formed over the insulator 214. The insulator 216 can be formed by a sputtering method, a CVD method, an MBE method, a PLD method, an ALD method, or the like. In this embodiment, for the insulator 216, silicon oxide is formed by a CVD method.

Next, an opening reaching the insulator 214 is formed in the insulator 216 by a lithography method. Examples of the opening include a groove and a slit. A region where the opening is formed may be referred to as an opening portion. A wet etching method may be used for the formation of the opening; however, a dry etching method is preferably used for microfabrication. As the insulator 214, it is preferable to select an insulator that functions as an etching stopper used in forming the opening by etching the insulator 216. For example, in the case where silicon oxide is used for the insulator 216 in which the opening is formed, silicon nitride, aluminum oxide, or hafnium oxide is preferably used for the insulator 214 as the insulator that functions as an etching stopper.

In the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

A hard mask formed of an insulator or a conductor may be used instead of the resist mask. In the case where a hard mask is used, a hard mask with a desired shape can be formed by forming an insulating film or a conductive film that is the hard mask material over the insulating film to be the insulator 216, forming a resist mask thereover, and then etching the hard mask material. The etching of the insulating film to be the insulator 216 may be performed after removal of the resist mask or with the resist mask remaining. In the latter case, the resist mask sometimes disappears during the etching. The hard mask may be removed by etching after the etching of the insulating film to be the insulator 216. The hard mask does not need to be removed in the case where the material of the hard mask does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may be employed in which different high-frequency powers are applied to one of the parallel plate type electrodes. Alternatively, a structure may be employed in which high-frequency power sources with the same frequency are applied to the parallel plate type electrodes. Alternatively, a structure may be employed in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

After the formation of the opening, a conductive film to be the first conductor of the conductor 205 is deposited. A conductive barrier film having a function of inhibiting the passage of impurities and oxygen is preferably used as the conductive film. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the first conductor of the conductor 205 can be deposited by a sputtering method, a CVD method, an MBE method, a PLD method, an ALD method, or the like.

In this embodiment, as the conductive film to be the first conductor of the conductor 205, tantalum nitride or a film of tantalum nitride and titanium nitride stacked thereover is deposited. With the use of such a metal nitride as the first conductor of the conductor 205, even when a metal that is easy to diffuse, such as copper, is used for the second conductor of the conductor 205, the metal can be inhibited from being diffused outward through the first conductor of the conductor 205.

Next, a conductive film to be the second conductor of the conductor 205 is deposited over the conductive film to be the first conductor of the conductor 205. The conductive film can be deposited by a sputtering method, a CVD method, an MBE method, a PLD method, an ALD method, or the like. In this embodiment, a low-resistance conductive material such as tungsten, copper, or aluminum is deposited for the conductive film to be the second conductor of the conductor 205.

Next, CMP (Chemical Mechanical Polishing) treatment is performed to remove by polishing part of the conductive film to be the first conductor of the conductor 205 and part of the conductive film to be the second conductor of the conductor 205 to expose the insulator 216. As a result, the conductive film to be the first conductor of the conductor 205 and the conductive film to be the second conductor of the conductor 205 remain only in the opening portion. Thus, the conductor 205 including the first conductor of the conductor 205 and the second conductor of the conductor 205, which has a flat top surface, can be formed (see FIG. 5). Note that the insulator 216 is partly removed by the CMP treatment in some cases.

Note that the method for forming the insulator 216 and the conductor 205 is not limited to the above. For example, a conductive film to be the conductor 205 is formed over the insulator 214, and the conductive film is processed by a lithography method to form the conductor 205. Next, the insulating film to be the insulator 216 may be provided to cover the conductor 205 and part of the insulating film may be removed by CMP treatment until part of the conductor 205 is exposed, so that the conductor 205 and the insulator 216 may be formed.

The conductor 205 and the insulator 216 are formed by CMP treatment as described above, whereby the planarity of the top surfaces of the conductor 205 and the insulator 216 can be improved, and the crystallinity of the CAAC-OS, which is to be the oxide 230$a$, the oxide 230$b$, and the oxide 230$c$ in a later process, can be improved.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Then, an insulating film to be the insulator 224 is deposited over the insulator 222. The insulating film to be the insulator 224 can be deposited by a sputtering method, a CVD method, an MBE method, a PLD method, an ALD method, or the like.

Sequentially, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen atmosphere, an inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

In this embodiment, treatment is performed at 400° C. in a nitrogen atmosphere for one hour, and successively another treatment is performed at 400° C. in an oxygen atmosphere for one hour. By the heat treatment, impurities such as water and hydrogen included in the insulator 224 can be removed, for example.

The above heat treatment may be performed after the insulator 222 is deposited. For the heat treatment, the conditions for the above-described heat treatment can be used.

Here, plasma treatment containing oxygen may be performed under reduced pressure so that an excess-oxygen region can be formed in the insulator 224. The plasma treatment containing oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as water and hydrogen included in the insulator 224 can be removed by selecting the conditions for the plasma treatment appropriately. In that case, the heat treatment is not necessarily performed.

Here, aluminum oxide may be deposited over the insulator 224 by a sputtering method and the aluminum oxide may be subjected to CMP until the insulator 224 is reached. The CMP treatment can planarize the surface of the insulator 224 and smooth the surface of the insulator 224. When the CMP treatment is performed on the aluminum oxide placed over the insulator 224, it is easy to detect the endpoint of CMP. Although part of the insulator 224 is polished by CMP and the thickness of the insulator 224 is reduced in some cases, the thickness can be adjusted when the insulator 224 is deposited. Planarizing and smoothing the surface of the insulator 224 can prevent deterioration of the coverage with an oxide deposited later and prevent a decrease in the yield of the semiconductor device in some cases. The deposition of aluminum oxide over the insulator 224 by a sputtering method is preferred because oxygen can be added to the insulator 224.

Next, an oxide film to be the oxide 230$a$ and an oxide film to be the oxide 230$b$ are deposited in this order over the insulator 224. Note that the oxide films are preferably deposited successively without exposure to an air atmosphere. By the deposition without exposure to the air, impurities or moisture from the air atmosphere can be prevented from being attached to the top surfaces of the oxide film to be the oxide 230$a$ and the oxide film to be the oxide 230$b$, so that the vicinity of an interface between the oxide film to be the oxide 230$a$ and the oxide film to be the 230$b$ can be kept clean.

The oxide film to be the oxide 230a and the oxide film to be the oxide 230b can be deposited by a sputtering method, a CVD method, an MBE method, a PLD method, an ALD method, or the like.

In the case where the oxide film to be the oxide 230a and the oxide film to be the oxide 230b are deposited by a sputtering method, for example, oxygen or a mixed gas of oxygen and a rare gas is used as a sputtering gas. The amount of excess oxygen in the oxide film to be deposited can be increased by an increase in the proportion of oxygen included in the sputtering gas. In the case where the above oxide films are deposited by a sputtering method, the above In-M-Zn oxide target can be used.

In particular, when the oxide film to be the oxide 230a is deposited, part of oxygen included in the sputtering gas is supplied to the insulator 224 in some cases. Therefore, the proportion of oxygen included in the sputtering gas for the oxide film to be the oxide 230a is preferably 70% or higher, further preferably 80% or higher, and still further preferably 100%.

In the case where the oxide film to be the oxide 230b is formed by a sputtering method, when the proportion of oxygen included in the sputtering gas is higher than or equal to 1% and lower than or equal to 30%, preferably higher than or equal to 5% and lower than or equal to 20% during the deposition, an oxygen-deficient oxide semiconductor is formed. In a transistor using an oxygen-deficient oxide semiconductor for its channel formation region, relatively high field-effect mobility can be obtained. Furthermore, when the deposition is performed while the substrate is heated, the crystallinity of the oxide film can be improved. Note that one embodiment of the present invention is not limited thereto. In the case where the oxide film to be the oxide 230b is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained.

In this embodiment, the oxide film to be the oxide 230a is deposited by a sputtering method using a target with In:Ga:Zn=1:1:0.5 [atomic ratio] (2:2:1 [atomic ratio]) or a target with In:Ga:Zn=1:3:4 [atomic ratio]. The oxide film to be the oxide 230b is deposited by a sputtering method using a target with In:Ga:Zn=4:2:4.1 [atomic ratio]. Note that each of the oxide films is preferably formed to have characteristics required for the oxide 230 by appropriate selection of deposition conditions and an atomic ratio.

Here, the insulator 222, the insulator 224, the oxide film to be the oxide 230a, and the oxide film to be the oxide 230b are preferably formed without exposure to the air. For example, a multi-chamber deposition apparatus is used.

Next, heat treatment may be performed. For the heat treatment, the conditions for the above-described heat treatment can be used. Through the heat treatment, impurities such as water and hydrogen in the oxide film to be the oxide 230a and the oxide film to be the oxide 230b can be removed, for example. In this embodiment, treatment is performed at 400° C. in a nitrogen atmosphere for one hour, and successively another treatment is performed at 400° C. in an oxygen atmosphere for one hour.

Next, a conductive film to be the conductor 242A is deposited over the oxide film 232B. The conductive film can be deposited by a sputtering method, a CVD method, an MBE method, a PLD method, an ALD method, or the like.

Next, the oxide film to be the oxide 230a, the oxide film to be the oxide 230b, and the conductive film to be a conductor layer 242A are processed into island shapes to form the oxide 230a, the oxide 230b, and the conductor layer 242A. Note that in the step, the thickness of a region of the insulator 224 which does not overlap with the oxide 230a becomes small in some cases (see FIG. 7).

Here, the oxide 230a, the oxide 230b, and the conductor layer 242A are formed to at least partly overlap with the conductor 205. It is preferable that the side surfaces of the oxide 230a, the oxide 230b, and the conductor layer 242A be substantially perpendicular to a top surface of the insulator 222. When the side surfaces of the oxide 230a, the oxide 230b, and the conductor layer 242A are substantially perpendicular to the top surface of the insulator 222, the plurality of transistors 200 can be provided in a smaller area and at a higher density. Alternatively, a structure may be employed in which an angle formed by the side surfaces of the oxide 230a, the oxide 230b, and the conductor layer 242A and the top surface of the insulator 222 is a small angle. In that case, the angle formed by the side surfaces of the oxide 230a and the oxide 230b and the top surface of the insulator 222 is preferably greater than or equal to 60° and less than 70°. With such a shape, the coverage with the insulator 273 and the like can be improved in a later step, so that defects such as a void can be reduced.

There is a curved surface between the side surface of the conductor layer 242A and the top surface of the conductor layer 242A. That is, an end portion of the side surface and an end portion of the top surface are preferably curved (hereinafter such a curved shape is also referred to as a rounded shape). The radius of curvature of the curved surface at an end portion of the conductor layer 242A layer is greater than or equal to 3 nm and less than or equal to 10 nm, preferably greater than or equal to 5 nm and less than or equal to 6 nm, for example. When the end portions are not angular, the coverage with films deposited in a later step can be improved.

Note that for the processing of the oxide films and the conductive film, a lithography method can be employed. The processing can be performed by a dry etching method or a wet etching method. The processing by a dry etching method is suitable for microfabrication.

Next, an insulating film 254A is deposited over the insulator 224, the oxide 230a, the oxide 230b, and the conductor layer 242A (see FIG. 8).

As the insulating film 254A, an insulating film having a function of inhibiting transmission of oxygen is preferably used. For example, an aluminum oxide film is preferably deposited by a sputtering method. When an aluminum oxide film is deposited by a sputtering method using a gas containing oxygen, oxygen can be injected into the insulator 224. That is, the insulator 224 can contain excess oxygen.

Next, an insulating film to be the insulator 280 is deposited over the insulating film 254A. The insulating film to be the insulator 280 can be deposited by a sputtering method, a CVD method, an MBE method, a PLD method, an ALD method, or the like. A silicon oxynitride film may be deposited by a PECVD method as the insulating film to be the insulator 280, for example. A silicon oxide film may be deposited by a sputtering method as the insulating film to the insulator 280, for example.

Next, the insulating film to be the insulator 280 is subjected to CMP treatment, so that an insulator 280A having a flat top surface is formed (see FIG. 8).

Then, part of the insulator 280A, part of the insulating film 254A, and part of the conductor layer 242A are processed to form an opening reaching the oxide 230*b*. The opening is preferably formed to overlap with the conductor 205. The conductor 242*a*, the conductor 242*b*, the insulator 254, and the insulator 280 are formed by the opening (see FIG. 9).

Part of the insulator 280, part of the insulating film 254A, and part of the conductor may be processed under different conditions. For example, part of the insulator 280A may be processed by a dry etching method, part of the insulating film 254A may be processed by a wet etching method, and part of the conductor layer 242A may be processed by a dry etching method.

In some cases, the treatment such as dry etching causes the attachment or diffusion of impurities due to an etching gas or the like to a surface or an inside of the oxide 230*a*, the oxide 230*b*, or the like. Examples of the impurities include fluorine and chlorine.

In order to remove the above impurities and the like, cleaning is performed. Examples of the cleaning method include wet cleaning using a cleaning solution, plasma treatment using plasma, and cleaning by heat treatment, and any of these cleanings may be performed in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed.

Next, heat treatment may be performed. Heat treatment may be performed under reduced pressure, and an oxide film 230C1 may be successively deposited without exposure to the air. The treatment can remove moisture and hydrogen adsorbed onto the surface onto the surface of the oxide 230*b* and the like, and further can reduce the moisture concentration and the hydrogen concentration of the oxide 230*a* and the oxide 230*b*. The heat treatment is preferably performed at a temperature higher than or equal to 100° C. and lower than or equal to 400° C. In this embodiment, the heat treatment is performed at 200° C. (see FIG. 10).

The oxide film 230C1 can be deposited by a sputtering method, a CVD method, an MBE method, a PLD method, an ALD method, or the like. The oxide film 230C1 is deposited by a method similar to that for the oxide film to be the oxide 230*a* or the oxide film to be the oxide 230*b* in accordance with characteristics required for the oxide film 230C1. In this embodiment, the oxide film 230C1 is deposited by a sputtering method using a target with In:Ga:Zn=4:2:4.1 [atomic ratio].

In particular, when the oxide film 230C1 is deposited, part of oxygen included in the sputtering gas is supplied to the oxide 230*a* and the oxide 230*b* in some cases. Therefore, the proportion of oxygen included in the sputtering gas for the oxide film 230C1 is preferably 70% or higher, further preferably 80% or higher, and still further preferably 100%.

Then, an oxide film 230C2 can successively be deposited by a sputtering method, a CVD method, an MBE method, a PLD method, an ALD method, or the like. The oxide film 230C2 is deposited by a method similar to that for the oxide film to be the oxide 230*a* or the oxide film to be the oxide 230*b* in accordance with characteristics required for the oxide film 230C2. In this embodiment, the oxide film 230C2 is deposited by a sputtering method using a target with In:Ga:Zn=1:3:4 [atomic ratio].

Next, heat treatment may be performed. Heat treatment may be performed under reduced pressure, and the insulating film 250A may be successively deposited without exposure to the air. The treatment can remove moisture and hydrogen adsorbed onto the surface onto the surface of the oxide film 230C2 and the like, and further can reduce the moisture concentration and the hydrogen concentration of the oxide 230*a*, the oxide 230*b*, the oxide film 230C1, and the oxide film 230C2. The heat treatment is preferably performed at a temperature higher than or equal to 100° C. and lower than or equal to 400° C.

The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulator having few impurities can be deposited.

Next, the conductive film 260Aa and the conductive film 260Ab are deposited. The conductive film 260Aa and the conductive film 260Ab can be deposited by a sputtering method, a CVD method, an MBE method, a PLD method, an ALD method, or the like. For example, a CVD method is preferably used. In this embodiment, the conductive film 260Aa is deposited by an ALD method, and the conductive film 260Ab is deposited by a CVD method (see FIG. 11).

Then, the oxide film 230C1, the oxide film 230C2, the insulating film 250A, the conductive film 260Aa, and the conductive film 260Ab are polished by CMP treatment until the insulator 280 is exposed, whereby the oxide 230*c*1, the oxide 230*c*2, the insulator 250, and the conductor 260 (the conductor 260*a* and the conductor 260*b*) are formed (see FIG. 12).

Next, heat treatment may be performed. In this embodiment, the treatment is performed at 400° C. in a nitrogen atmosphere for one hour. The heat treatment can reduce the moisture concentration and the hydrogen concentration in the insulator 250 and the insulator 280.

Next, the insulating film to be the insulator 274 is formed over the insulator 280. The insulating film to be the insulator 274 can be formed by a sputtering method, a CVD method, an MBE method, a PLD method, an ALD method, or the like. An aluminum oxide film is preferably formed as the insulating film to be the insulator 274 by a sputtering method, for example. Formation of the aluminum oxide film by a sputtering method enables oxygen that is released by heat treatment to be added to the insulator 280 (see FIG. 12).

Next, heat treatment may be performed. In this embodiment, the treatment is performed at 400° C. in a nitrogen atmosphere for one hour. By the heat treatment, oxygen added to the insulator 280 by the formation of the insulator 274 can be supplied to the oxide 230*b* through the oxide 230*c*.

Next, an insulator to be the insulator 281 may be deposited over the insulator 274. The insulating film to be the insulator 281 can be deposited by a sputtering method, a CVD method, an MBE method, a PLD method, an ALD method, or the like (see FIG. 12).

Next, openings reaching the conductor 242*a* and the conductor 242*b* are formed in the insulator 254, the insulator 280, the insulator 274, and the insulator 281. The openings are formed by a lithography method.

Next, an insulating film to be the insulator 241 is deposited and the insulating film is subjected to anisotropic etching, so that the insulator 241 is formed. The conductive film can be deposited by a sputtering method, a CVD method, an MBE method, a PLD method, an ALD method, or the like. As the insulating film to be the insulator 241, an insulating film having a function of inhibiting the passage of oxygen is preferably used. For example, an aluminum oxide film is preferably deposited by an ALD method. For the anisotropic etching, a dry etching method or the like is employed, for example. When the side wall portions of the openings have such a structure, passage of oxygen from the outside can be inhibited and oxidation of the conductor 240*a* and the conductor 240*b* to be formed next can be prevented. Furthermore, impurities such as water and hydrogen can be prevented from diffusing from the conductor 240*a* and the conductor 240*b* to the outside.

Next, a conductive film to be the conductor 240*a* and the conductor 240*b* is deposited. The conductive film to be the conductor 240*a* and the conductor 240*b* desirably has a stacked-layer structure that includes a conductor having a function of inhibiting passage of impurities such as water and hydrogen. For example, stacked layers of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Next, CMP treatment is performed to remove part of the conductive film to be the conductor 240*a* and the conductor 240*b*, so that the insulator 281 is exposed. As a result, the conductive film remains only in the openings, so that the conductor 240*a* and the conductor 240*b* having planar top surfaces can be formed (see FIG. 1). Note that the insulator 281 is partly removed by the CMP treatment in some cases.

Through the above process, the semiconductor device including the transistor 200 illustrated in FIG. 1 can be fabricated. As illustrated in FIG. 5 to FIG. 12, with the use of the fabrication method of the semiconductor device described in this embodiment, the transistor 200 can be fabricated.

To fabricate the semiconductor device in which transistors are stacked, which is described in the above embodiment, the above process is repeated to stack the transistors 200. Although a transistor placed in a lower layer is subjected to more excess heat treatment after its completion, oxygen is supplied from the insulator 280 into the oxide 230 such that oxygen vacancies in the oxide 230 can be prevented from increasing, as described above. Thus, even in the transistor 200 in a lower layer, changes in electrical characteristics can be suppressed, and the semiconductor device can have stable electrical characteristics and high reliability.

According to one embodiment of the present invention, a semiconductor device that can be scaled down or highly integrated can be provided. According to one embodiment of the present invention, a semiconductor device with excellent electrical characteristics can also be provided. According to one embodiment of the present invention, a semiconductor device with a high on-state current can also be provided. According to one embodiment of the present invention, a semiconductor device with excellent frequency characteristics can also be provided. According to one embodiment of the present invention, a highly reliable semiconductor device can also be provided. According to one embodiment of the present invention, a semiconductor device with low off-state current can also be provided. According to one embodiment of the present invention, a semiconductor device with reduced power consumption can also be provided. According to one embodiment of the present invention, a semiconductor device with high productivity can also be provided.

Modification Example of Semiconductor Device

An example of a semiconductor device including the transistor 200 of one embodiment of the present invention, which is different from the semiconductor device described in the above <Structure example of semiconductor device> will be described below with reference to FIG. 13.

Figure 13A:
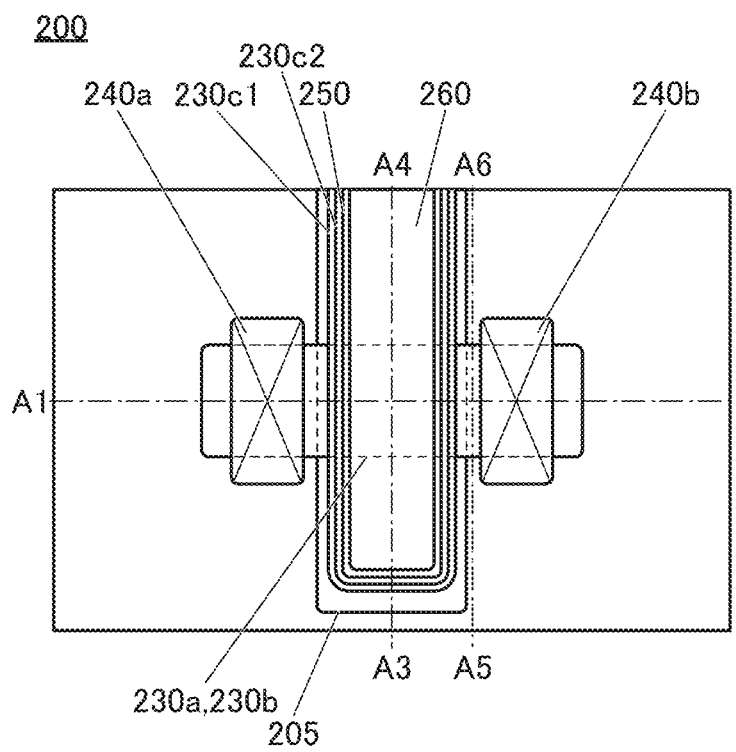
FIG. 13 (A) to (D) A top view and cross-sectional views of a semiconductor device of one embodiment of the present invention.
Figure 13C:
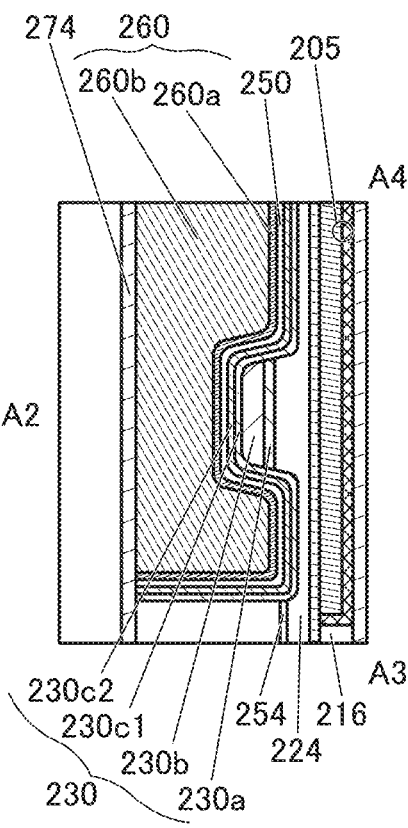
Figure 13B:
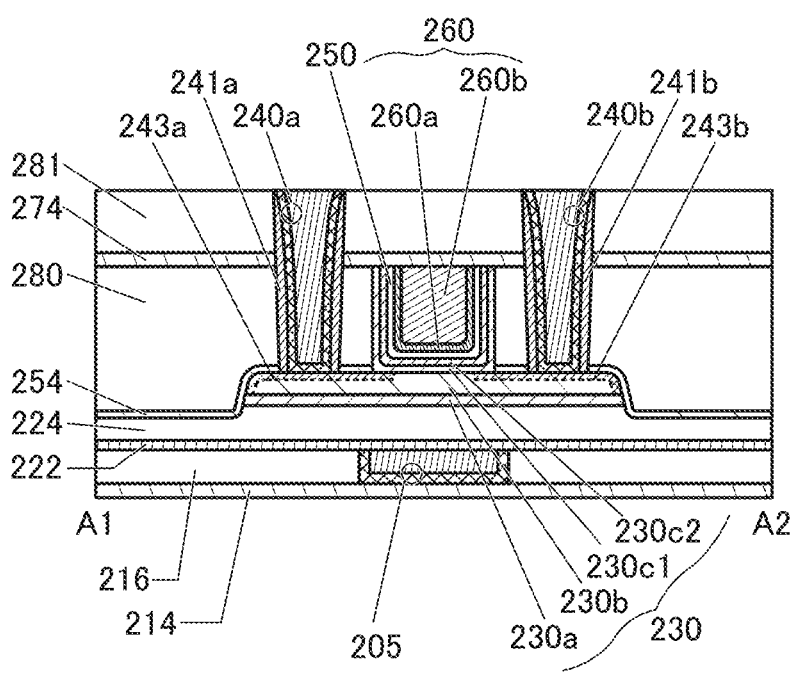
Figure 13D:
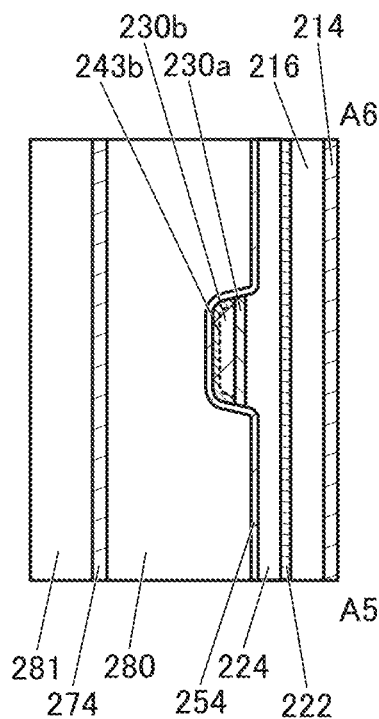

FIG. 13(A) is a top view. FIG. 13(B) is a cross-sectional view corresponding to a portion indicated by a dashed-dotted line A1-A2 in FIG. 13(A), and is also a cross-sectional view of the transistor 200 in the channel length direction. FIG. 13(C) is a cross-sectional view corresponding to a portion indicated by a dashed-dotted line A3-A4 in FIG. 13(A), and is also a cross-sectional view of the transistor 200 in the channel width direction. FIG. 13(D) is a cross-sectional view corresponding to a portion indicated by a dashed-dotted line A3-A4 in FIG. 13(A). Note that for simplification of the drawing, some components are not illustrated in the top view in FIG. 13(A).

Note that in the semiconductor device shown in FIG. 13, components having the same functions as the components in the semiconductor device described in <Structure example of semiconductor device> (see FIG. 1) are denoted by the same reference numerals. Note that in this section, the materials described in detail in <Structure example of semiconductor device> can be used as the constituent materials for the transistor 200.

The transistor 200 illustrated in FIG. 13 is different from the transistor 200 illustrated in FIG. 3 in that the conductor 242 is not provided. In the transistor 200 illustrated in FIG. 13, the region 243 may be formed by adding as a dopant an element that can increase the carrier density of the oxide 230 and reduce the resistance thereof.

As the dopant, an element that forms an oxygen vacancy, an element that is bonded to an oxygen vacancy, or the like is used. Typical examples of the element include boron and phosphorus. Hydrogen, carbon, nitrogen, fluorine, sulfur, chlorine, titanium, a rare gas element, or the like can also be used. Typical examples of the rare gas include helium, neon, argon, krypton, and xenon. Furthermore, any one or more metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added. Among the above, boron and phosphorus are preferable as a dopant. In the case where boron or phosphorus is used as a dopant, manufacturing line apparatuses for amorphous silicon or low-temperature polysilicon can be used; thus, capital investment can be reduced. The concentration of the element is measured by SIMS or the like.

In particular, an element that easily forms an oxide is preferably used as an element to be added to the region 243. Typical examples of the element include boron, phosphorus, aluminum, and magnesium. The element added to the region 243 can deprive the oxide 230 of oxygen to form an oxide. As a result, many oxygen vacancies are generated in the region 243. When the oxygen vacancies and hydrogen in the oxide 230 are bonded to each other, carriers are generated, and accordingly, a region with extremely low resistance is formed. The element added to the region 243 exists in the state of a stable oxide in the region 243; thus, even when treatment that requires a high temperature is performed in a later step, the element is not easily released from the region 243. That is, the use of an element that easily forms an oxide as an element to be added to the region 243 enables formation of a region whose resistance is not easily increased even through a high-temperature process, in the oxide 230.

The formation of the region 243 functioning as the source region or the drain region in the oxide 230 enables the conductor 240 functioning as a plug to be connected to the region 243 without providing a source electrode and a drain electrode that are formed of metal.

In the case where the region 243 is formed by addition of a dopant, for example, a mask such as a resist mask or a hard mask is provided in a position to be the channel formation region of the transistor 200 and addition of a dopant is performed. In that case, the region 243 containing the element can be formed in a region of the oxide 230 that does not overlap with the mask.

As a method for adding a dopant, an ion implantation method in which an ionized source gas is subjected to mass separation and then added, an ion doping method in which an ionized source gas is added without mass separation, a plasma immersion ion implantation method, or the like can be used. In the case where mass separation is performed, an ion species to be added and its concentration can be adjusted precisely. On the other hand, in the case where mass separation is not performed, ions at a high concentration can be added in a short time. Alternatively, an ion doping method in which atomic or molecular clusters are generated and ionized may be used. Note that a dopant may be referred to as an ion, a donor, an acceptor, an impurity, an element, or the like.

By adding an element that forms an oxygen vacancy to the region 243 and performing heat treatment, hydrogen contained in the region 234 functioning as a channel formation region can be trapped by an oxygen vacancy included in the region 243, in some cases. Thus, the transistor 200 can have stable electrical characteristics and increased reliability.

The structure, method, and the like described above in this embodiment can be used in appropriate combination with structures, methods, and the like described in the other embodiments and the examples.

Embodiment 3

In this embodiment, one embodiment of a semiconductor device will be described with reference to FIG. 14 and FIG. 15.

[Memory Device 1]

Figure 14:
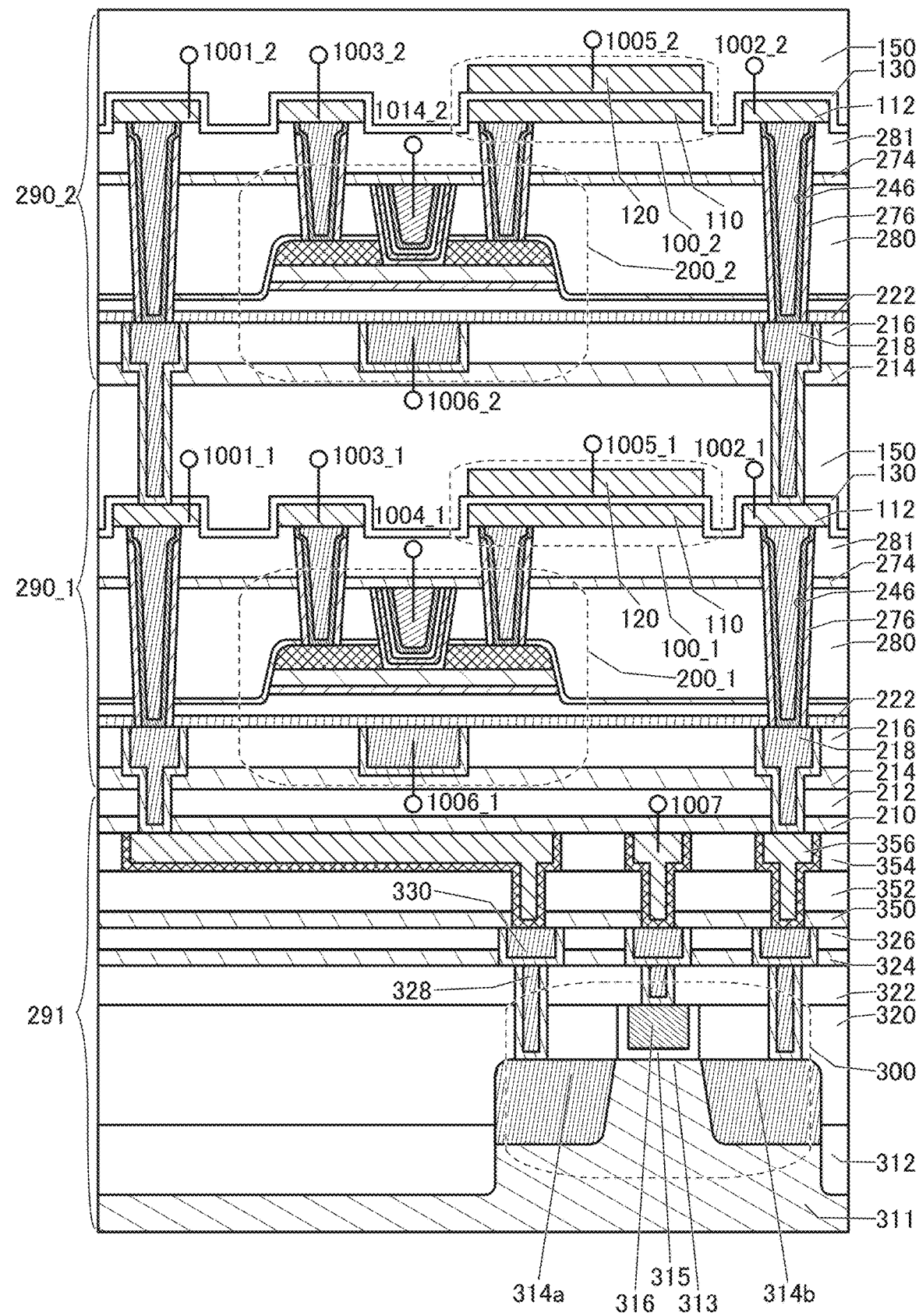
FIG. 14 A cross-sectional view illustrating a structure of a memory device of one embodiment of the present invention.

FIG. 14 illustrates an example of a semiconductor device (memory device) using a capacitor which is one embodiment of the present invention. The semiconductor device of one embodiment of the present invention includes a layer 291 including a transistor 300, a layer 290_1 over the layer 291, and a layer 290_2 over the layer 290_1. Here, the layer 291_1 includes a transistor 200_1, a capacitor 100_1, and a wiring 1001_1 to a wiring 1006_1. The layer 291_2 includes a transistor 200_2, a capacitor 100_2, and a wiring 1001_2 to a wiring 1006_2. Here, the layer 291_1 and the layer 291_2 have substantially the same structures; thus, the same conductors, insulators, and oxides are denoted by the same reference numerals. The transistor 200_1 and the transistor 200_2 are collectively referred to as the transistor 200, in some cases. The capacitor 100_1 and the capacitor 100_2 are collectively referred to as a capacitor 100, in some cases. The transistor 200 described in the above embodiment can be used as the transistor 200.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 14, the wiring 1001_1 and the wiring 1001_2 are electrically connected to a source of the transistor 300, and a wiring 1002_1 and a wiring 1002_2 are electrically connected to a drain of the transistor 300.

A wiring 1003_1 is electrically connected to one of a source and a drain of the transistor 200_1. A wiring 1004_1 is electrically connected to a first gate of the transistor 200_1. A wiring 1006_1 is electrically connected to a second gate of the transistor 200_1. The other of the source and the drain of the transistor 200_1 is electrically connected to one electrode of the capacitor 100_1. A wiring 1005_1 is electrically connected to the other electrode of the capacitor 100_1. Note that the wiring 1001_1 may be electrically connected to the wiring 1003_1, the wiring 1004_1, the wiring 1005_1, or the wiring 1006_1. The wiring 1002_1 may be electrically connected to the wiring 1003_1, the wiring 1004_1, the wiring 1005_1, or the wiring 1006_1.

A wiring 1003_2 is electrically connected to one of a source and a drain of the transistor 200_2. A wiring 1004_2 is electrically connected to a first gate of the transistor 200_2. A wiring 1006_2 is electrically connected to a second gate of the transistor 200_2. The other of the source and the drain of the transistor 200_2 is electrically connected to one electrode of the capacitor 100_2. The wiring 1005_2 is electrically connected to the other electrode of the capacitor 100_2. Note that the wiring 1001_2 may be electrically connected to the wiring 1003_2, the wiring 1004_2, the wiring 1005_2, or the wiring 1006_2. The wiring 1002_2 may be electrically connected to the wiring 1003_2, the wiring 1004_2, the wiring 1005_2, or the wiring 1006_2.

The memory device illustrated in FIG. 14 enables data writing, retention, and reading by having the capability of retaining the potential of one of the electrodes of the capacitor 100 by switching of the transistor 200.

The memory devices illustrated in FIG. 14 can form a memory cell array when arranged in a matrix.

Next, the transistor 300 where the layer 291 is included will be described.

<Transistor 300>

The transistor 300 is provided over a substrate 311 and includes a conductor 316 functioning as a gate electrode, an insulator 315 functioning as a gate insulator, a semiconductor region 313 that is part of the substrate 311, and a low-resistance region 314a and a low-resistance region 314b functioning as a source region and a drain region.

Here, the insulator 315 is placed over the semiconductor region 313, and the conductor 316 is placed over the insulator 315. The transistors 300 formed in one layer are electrically isolated from each other by an insulator 312 functioning as an element isolation insulating layer. The insulator 312 can be formed using an insulator similar to an insulator 326 described later, for example. The transistor 300 may be a p-channel transistor or an n-channel transistor.

It is preferable that the substrate 311 contain a semiconductor such as a silicon-based semiconductor, further preferably single crystal silicon, in a region of the semiconductor region 313 where a channel is formed, a region in the vicinity thereof, the low-resistance region 314a and the low-resistance region 314b functioning as the source region and the drain region, and the like. Alternatively, these regions may be formed using a material containing Ge (germanium), SiGe (silicon germanium), GaAs (gallium arsenide), GaAlAs (gallium aluminum arsenide), or the like.

A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

In the transistor 300 illustrated in FIG. 14, the semiconductor region 313 (part of the substrate 311) in which a channel is formed has a convex shape. Furthermore, the conductor 316 is provided so as to cover a side surface and top surface of the semiconductor region 313 with the insulator 315 positioned therebetween. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Over the transistor 300, an insulator 320, an insulator 322, an insulator 324, and an insulator 326 are sequentially stacked as interlayer films. In addition, a conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. In FIG. 14, an insulator 350, an insulator 352, and an insulator 354 are stacked sequentially, for example. Furthermore, a conductor 356 is formed in the insulator 350, the insulator 352, and the insulator 354. The conductor 356 functions as a plug or a wiring.

Note that the transistor 300 illustrated in FIG. 14 is an example and the structure is not limited thereto; an appropriate transistor is used in accordance with a circuit configuration or a driving method.

Next, the capacitor 100 and wiring layers in the layer 290_1 and the layer 290_2 will be described. Note that the following description is common to both the layer 290_1 and the layer 290_2. Note that the detailed description of the transistor 200 is omitted because the above embodiment can be referred to therefor.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

A conductor 112 provided over the conductor 246 and the conductor 110 can be formed at the same time. Note that the conductor 112 has a function of a plug or a wiring that is electrically connected to the capacitor 100, the transistor 200, or the transistor 300.

Although the conductor 112 and the conductor 110 having a single-layer structure are illustrated in FIG. 14, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

The insulator 130 can be provided to have a stacked-layer structure or a single-layer structure using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 130, an insulating film in which zirconium oxide, aluminum oxide, and zirconium oxide are stacked in this order can be used, for example.

For example, the insulator 130 preferably has a stacked-layer structure using a material with high dielectric strength such as silicon oxynitride and a high permittivity (high-k) material. In the capacitor 100 having such a structure, a sufficient capacitance can be provided owing to the high permittivity (high-k) insulator, and the dielectric strength can be increased owing to the insulator with high dielectric strength, so that the electrostatic breakdown of the capacitor 100 can be prevented.

Examples of the insulator with a high permittivity (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

As the material having a high dielectric strength (a material having a low relative permittivity), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring Layers>

Wiring layers provided with an interlayer film, a wiring, a plug, and the like may be provided between the layers. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

Similarly to the conductor 356 and the like, a conductor 218, a conductor included in the transistor 200 (the conductor 205), and the like are embedded in the insulator 210, an insulator 212, the insulator 214, and the insulator 216. Note that the conductor 218 has a function of a plug or a wiring that is electrically connected to the capacitor 100 or the transistor 300. In addition, an insulator 150 is provided over the conductor 120 and the insulator 130.

Examples of an insulator that can be used as an interlayer film include an oxide, a nitride, an oxynitride, a nitride oxide, a metal oxide, a metal oxynitride, and a metal nitride oxide, each of which has an insulating property.

For example, when a material having a low relative permittivity is used for the insulator functioning as an interlayer film, the parasitic capacitance generated between wirings can be reduced. Thus, a material is preferably selected depending on the function of an insulator.

For example, the insulator 150, the insulator 212, the insulator 352, the insulator 354, and the like each preferably include an insulator having low relative permittivity. For example, the insulator preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (nylon, aramid, or the like), polyimide, polycarbonate, and acrylic.

When the transistor using an oxide semiconductor is surrounded by an insulator that has a function of inhibiting the passage of oxygen and impurities such as hydrogen, the electrical characteristics of the transistor can be stable. Thus, an insulator having a function of inhibiting the passage of oxygen and impurities such as hydrogen is used as the insulator 210, the insulator 350, and the like.

As an insulator having a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride can be used.

For the conductors that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, or the like, a single layer or stacked layers of a conductive material such as a metal material, an alloy material, a metal nitride material, or a metal oxide material that is formed using the above material can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<<Wirings or Plugs in a Layer Provided with an Oxide Semiconductor>>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, an insulator 276 is preferably provided between the insulator 224 including excess oxygen and the conductor 246 in FIG. 14. Since the insulator 276 is provided in contact with the insulator 222 and the insulator 274, the insulator 224 and the transistor 200 can be sealed by the insulators having a barrier property. It is also preferable that the insulator 276 be in contact with part of the insulator 280. When the insulator 276 extends to the insulator 280, diffusion of oxygen and impurities can be further inhibited.

That is, the insulator 276 can inhibit excess oxygen included in the insulator 224 from being absorbed by the conductor 246. In addition, the insulator 276 can inhibit diffusion of hydrogen, which is an impurity, into the transistor 200 through the conductor 246.

The insulator 276 is preferably formed using an insulating material having a function of inhibiting diffusion of an impurity such as water or hydrogen and oxygen. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like.

Note that although the two-layer structure including the layer 290_1 and the layer 290_2 is illustrated in FIG. 14, the structure is not limited thereto, and three or more layers each including the transistor 200 may be stacked.

The above is the description of the structure example. With the use of the structure, layers each including the transistor 200 can be stacked, which can reduce the top-view area occupied by the semiconductor device and facilitate scaling-down and higher integration of the semiconductor device. With the use of the structure, a change in electrical characteristics can be reduced and reliability can be improved in a semiconductor device using a transistor including an oxide semiconductor. A transistor including an oxide semiconductor and having high on-state current can also be provided. A transistor including an oxide semiconductor and having low off-state current can also be provided. A semiconductor device with low power consumption can also be provided. According to one embodiment of the present invention, a semiconductor device with high productivity can also be provided.

Figure 15A:
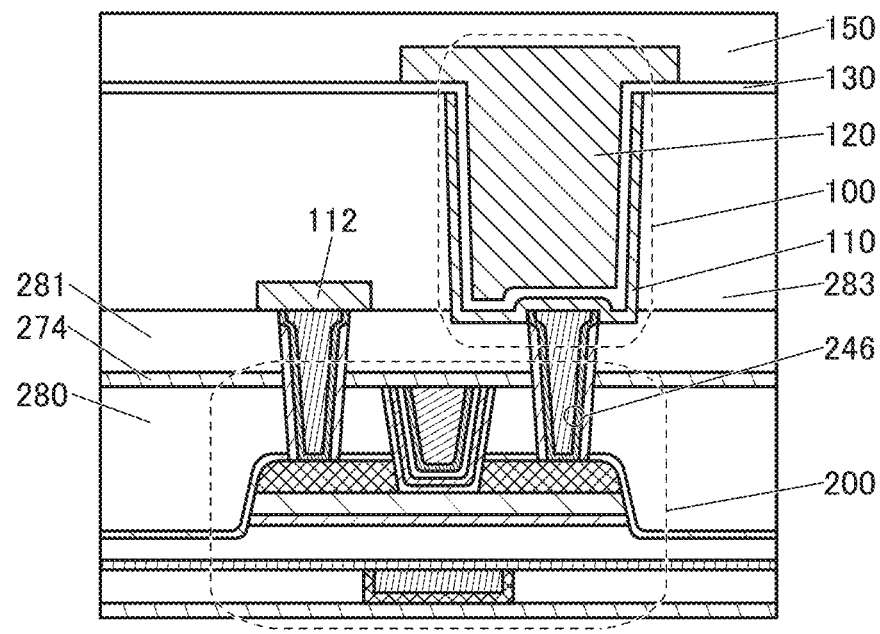
FIGS. 15 (A) and (B) Cross-sectional views illustrating structures of memory devices of embodiments of the present invention.

Although the capacitor 100 is a planar-type capacitor in the above description, the shape of the capacitor is not limited thereto. As illustrated in FIG. 15(A), the capacitor 100 may be a cylinder-type capacitor. The capacitor 100 illustrated in FIG. 15(A) includes the conductor 110 placed in an opening formed in the insulator 283 over the insulator 281, the insulator 130 over the conductor 110 and the insulator 283, and the conductor 120 over the insulator 130. Note that the other structures are similar to those of the transistor 200 and the capacitor 100 illustrated in FIG. 14.

Note that although the capacitor 100 is provided above the transistor 200 in FIG. 15(A), this embodiment is not limited thereto; the capacitor 100 may be provided below the transistor 200. As described above, placing the transistor 200 and the capacitor 100 to overlap with each other can reduce the top-view area occupied by the transistor and the capacitor, which further facilitates higher integration of the semiconductor device.

Figure 15B:
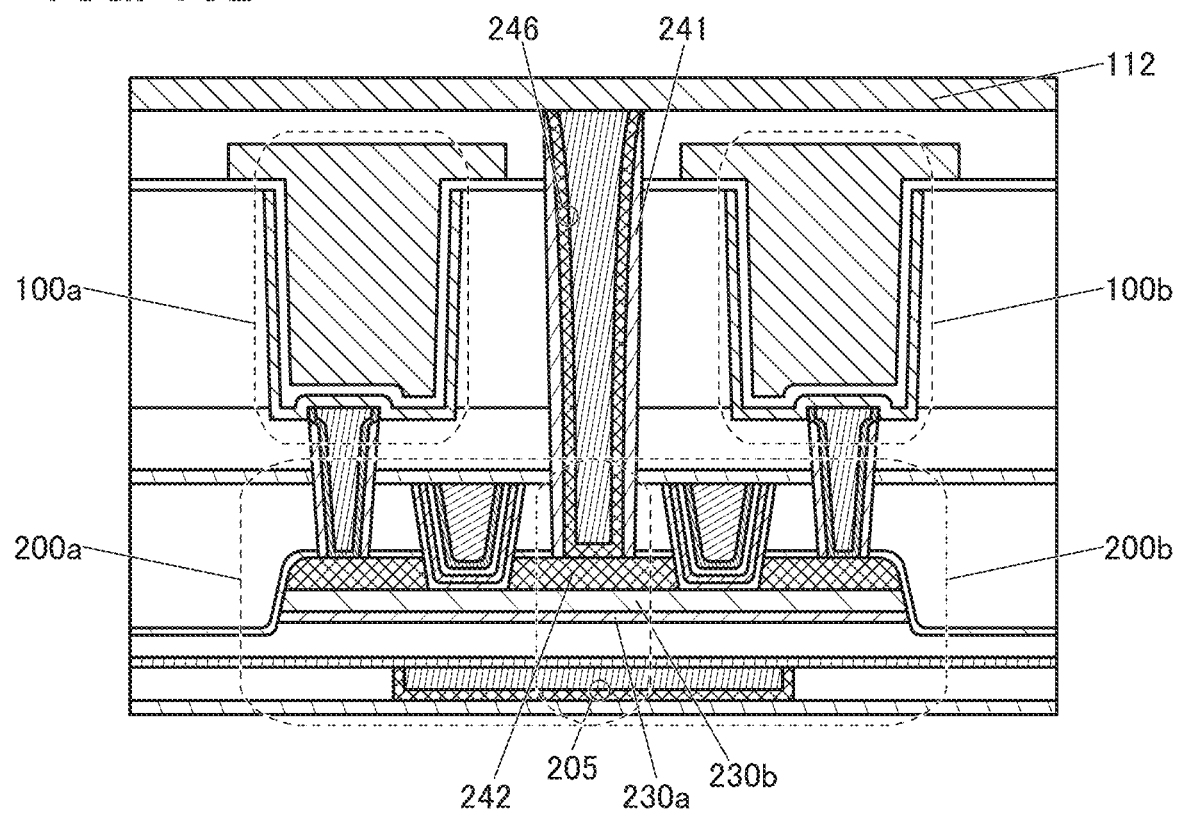

As illustrated in FIG. 15(B), the conductor 205, the oxide 230a, the oxide 230b, the conductor 242, the conductor 246, the insulator 241, and the conductor 112 may be shared between a transistor 200a and a transistor 200b. Here, the transistor 200a and a capacitor 100a, and the transistor 200b and a capacitor 100b have structures similar to those of the transistor 200 and the capacitor 100 illustrated in FIG. 15(A). Thus, the above description can be referred to for the details.

As illustrated in FIG. 15(B), the structure in which the transistor 200a and the transistor 200b share the conductor 246 can reduce the top-view area occupied per transistor, which facilitates higher integration of the semiconductor device.

This embodiment can be implemented in an appropriate combination with the structures described in the other embodiments, the examples, and the like.

Embodiment 4

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), will be described with reference to FIG. 16 and FIG. 17. An OS memory device includes at least a capacitor and an OS transistor that controls the charging and discharging of the capacitor. Since an OS transistor has an extremely low off-state current, an OS memory device has excellent retention characteristics and thus can function as a nonvolatile memory.

Structure Example of Memory Device

Figure 16:
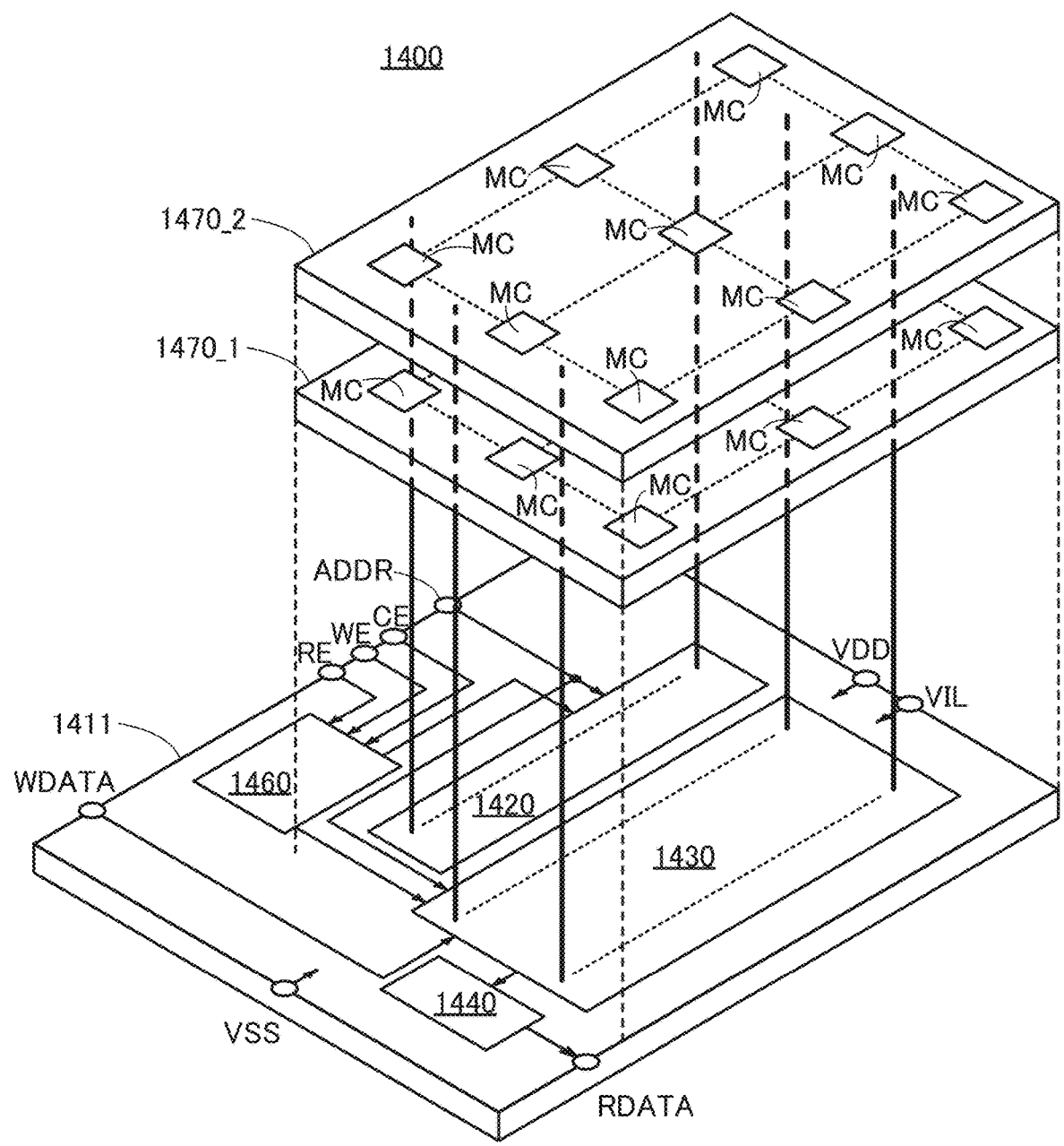
FIG. 16 Block diagrams illustrating a configuration example of a memory device of one embodiment of the present invention.

FIG. 16 illustrates an example of the structure of an OS memory device. A memory device 1400 includes a peripheral circuit 1411 a memory cell array 1470_1, and a memory cell array 1470_2. The peripheral circuit 1411 includes a row circuit 1420, a column circuit 1430, an output circuit 1440, and a control logic circuit 1460. Note that the memory cell array 1470_1 and the memory cell array 1470_2 are hereinafter collectively referred to as a memory cell array 1470 in some cases.

The memory device 1400 corresponds to the memory device illustrated in FIG. 14. The row circuit 1420 and the column circuit 1430 correspond to the layer 291, the memory cell array 1470_1 corresponds to the layer 290_1, and the memory cell array 1470_2 corresponds to the layer 290_2.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the signals (CE, WE, and RE) input from the outside, and generates control signals for the row decoder and the column decoder. CE denotes a chip enable signal, WE denotes a write enable signal, and RE denotes a read enable signal. Signals processed by the control logic circuit 1460 are not limited thereto, and other control signals may be input as necessary.

The memory cell array 1470_1 is formed over a portion of the peripheral circuit 1411, and the memory cell array 1470_2 is formed over the memory cell array 1470_1. The memory cell array 1470 includes a plurality of memory cells MC and a plurality of wirings arranged in a matrix. Note that the number of wirings that connect the memory cell array 1470 to the row circuit 1420 depends on the structure of the memory cell MC, the number of memory cells MC in a column, and the like. The number of wirings that connect the memory cell array 1470 to the column circuit 1430 depends on the structure of the memory cell MC, the number of memory cells MC in a row, and the like.

Note that FIG. 16 illustrates an example in which the two memory cell arrays 1470 are stacked over the peripheral circuit 1411; however, this embodiment is not limited to this example. Three or more memory cells arrays may be stacked over the peripheral circuit 1411, for example.

FIG. 17 illustrates structure examples of a memory cell that can be used as the memory cell MC.
[DOSRAM]

Figure 17A:
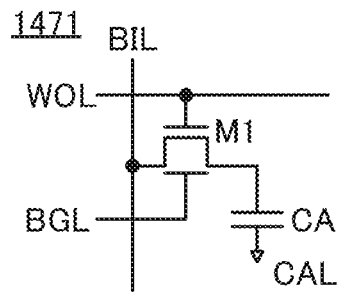
FIG. 17 (A) to (H) Circuit diagrams each illustrating a configuration example of a memory device of one embodiment of the present invention.
Figure 17B:
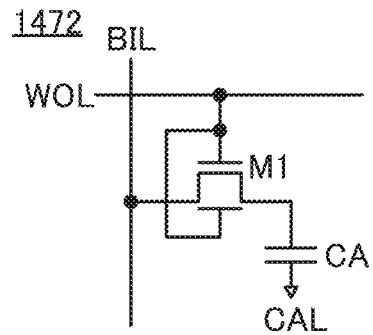
Figure 17C:
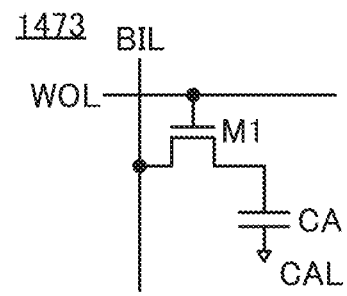
Figure 17D:
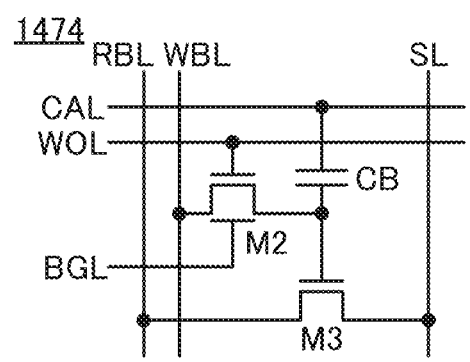
Figure 17E:
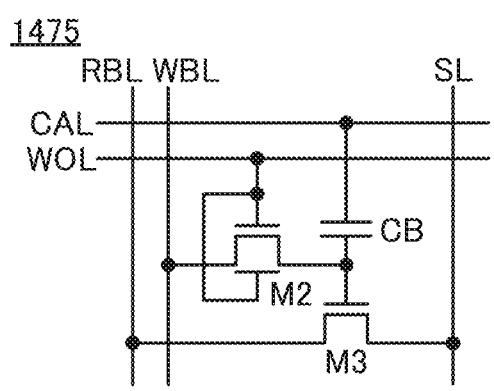
Figure 17F:
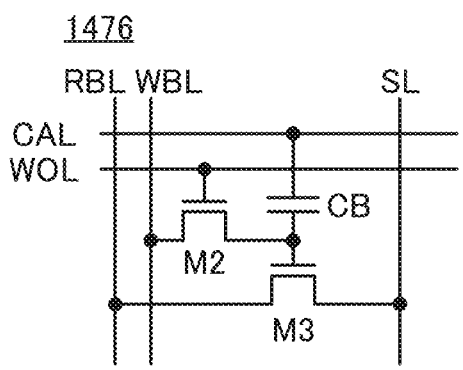
Figure 17G:
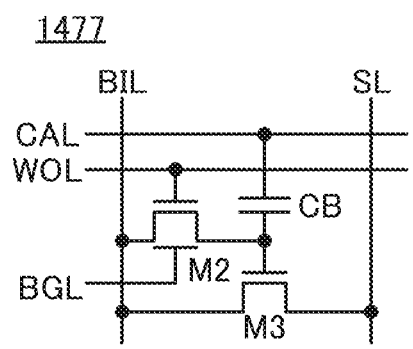

FIGS. 17(A) to 17(C) each illustrate a circuit structure example of a DRAM memory cell. In this specification and the like, a DRAM using a memory cell including one OS transistor and one capacitor is sometimes referred to as a DOSRAM (Dynamic Oxide Semiconductor Random Access Memory). A memory cell 1471 illustrated in FIG. 17(A) includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. A gate of the transistor M1 is connected to a wiring WOL. A back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. At the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 in FIG. 17(A) corresponds to the layer 291_1 or the layer 291_2 of the memory device in FIG. 14. That is, in the layer 291_1, the transistor M1, the capacitor CA, the wiring BIL, the wiring WOL, the wiring BGL, and the wiring CAL correspond to the transistor 200_1, the capacitor 100_1, the wiring 1003_1, the wiring 1004_1, the wiring 1006_1, and the wiring 1005_1, respectively. Furthermore, in the layer 291_2, the transistor M1, the capacitor CA, the wiring BIL, the wiring WOL, the wiring BGL, and the wiring CAL correspond to the transistor 200_2, the capacitor 100_2, the wiring 1003_2, the wiring 1004_2, the wiring 1006_2, and the wiring 1005_2, respectively. Note that the transistor 300 in FIG. 14 corresponds to transistors provided in the row circuit 1420 and the column circuit 1430 of the memory device 1400 illustrated in FIG. 16.

The memory cell MC is not limited to the memory cell 1471, and the circuit structure can be changed. For example, as in a memory cell 1472 illustrated in FIG. 17(B), the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 17(C).

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation of the memory cell can be unnecessary. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIGS. 17(D) to 17(H) each illustrate a circuit structure example of a gain-cell memory cell including two transistors and one capacitor. A memory cell 1474 illustrated in FIG. 17(D) includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By application of a given potential to the wiring BGL, the threshold voltage of the transistor M2 can be increased or decreased.

The memory cell MC is not limited to the memory cell 1474, and the circuit structure can be changed as appropriate. For example, as in a memory cell 1475 illustrated in FIG. 17(E), the back gate of the transistor M2 may be connected not to the wiring BGL but to the wiring WOL in the memory cell MC. Alternatively, for example, the memory cell MC may be a memory cell including as single-gate transistor, that is, the transistor M2 not including a back gate, as in a memory cell 1476 illustrated in FIG. 17(F). Alternatively, for example, in the memory cell MC, the wiring WBL and the wiring RBL may be combined into one wiring BIL, as in a memory cell 1477 illustrated in FIG. 17(G).

In the case where the semiconductor device described in any of the above embodiments is used in the memory cell 1474 and the like, the transistor 200 can be used as the transistor M2 and the transistor M3, and the capacitor 100 can be used as the capacitor CB. When an OS transistor is used as the transistor M2, the leakage current of the transistor M2 can be extremely low. That is, with the use of the transistor M2, written data can be retained for a long time, and thus the frequency of the refresh operation for the memory cell can be decreased. In addition, refresh operation of the memory cell can be unnecessary. In addition, since the transistor M2 has an extremely low leakage current, multi-level data or analog data can be retained in the memory cell 1474. The same applies to the memory cells 1475 to 1477.

When an OS transistor is used as each of the transistors M2 and M3, the circuit of the memory cell array 1470 can be formed using only n-channel transistors.

Note that the transistor M3 may be a transistor containing silicon in a channel formation region (hereinafter, also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Figure 17H:
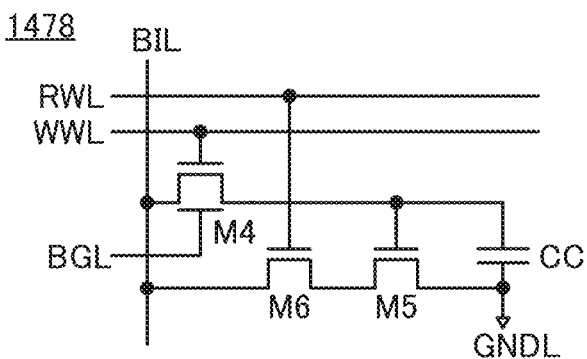

FIG. 17(H) illustrates an example of a gain-cell memory cell including three transistors and one capacitor. A memory cell 1478 illustrated in FIG. 17(H) includes transistors M4 to M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 may not include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structure described in this embodiment can be used in an appropriate combination with the structures described in the other embodiments, examples, and the like.

Embodiment 5

In this embodiment, an example of a chip 1200 on which the semiconductor device of the present invention is mounted will be described with reference to FIG. 18. A plurality of circuits (systems) are mounted on the chip 1200. The technique for integrating a plurality of circuits (systems) on one chip as described above is referred to as system on chip (SoC) in some cases.

Figure 18A:
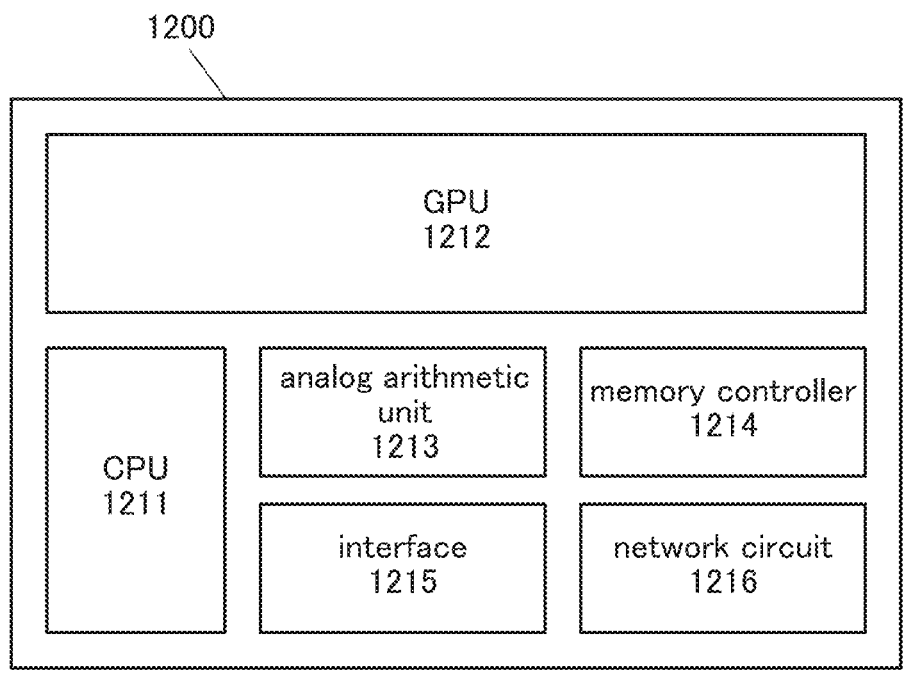
FIGS. 18 (A) and (B) A schematic view and a perspective view of a semiconductor device of one embodiment of the present invention.

As illustrated in FIG. 18(A), the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 18B:
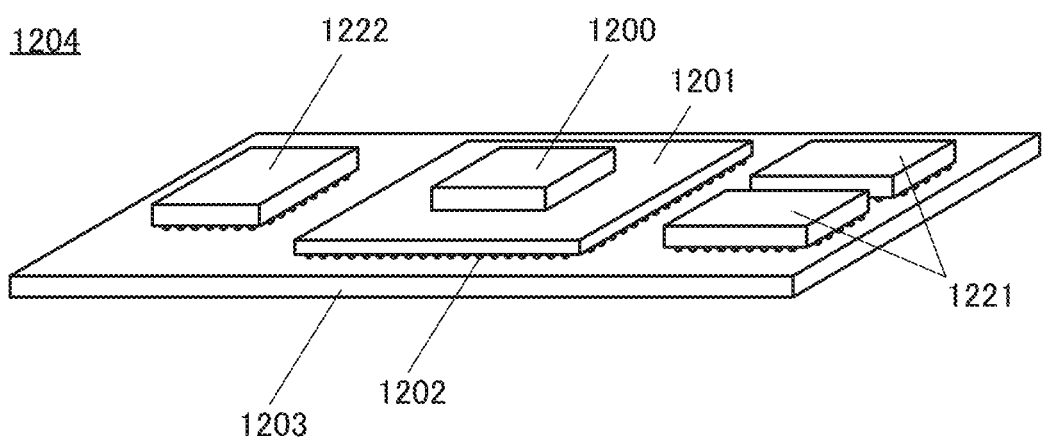

A bump (not illustrated) is provided on the chip 1200, and as illustrated in FIG. 18(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for connection with an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement an arithmetic operation such as a deep neural network (DNN), a convolutional neural network (CNN), a recurrent neural network (RNN), an autoencoder, a deep Boltzmann machine (DBM), or a deep belief network (DBN); thus, the chip 1200 can be used as an AI chip or the GPU module 1204 can be used as an AI system module.

The structure described in this embodiment can be used in an appropriate combination with the structures described in the other embodiments and other examples.

Embodiment 6

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 19 schematically illustrates some structure examples of removable memory devices. The semiconductor device described in the above embodiment is processed into a packaged memory chip and used in a variety of storage devices and removable memories, for example.

Figure 19A:
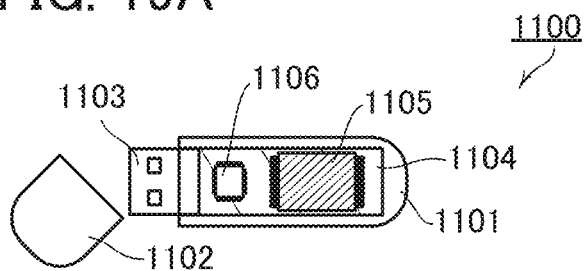
FIG. 19 (A) to (E) Schematic views of memory devices of embodiments of the present invention.

FIG. 19(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

Figures 19B, 19C:
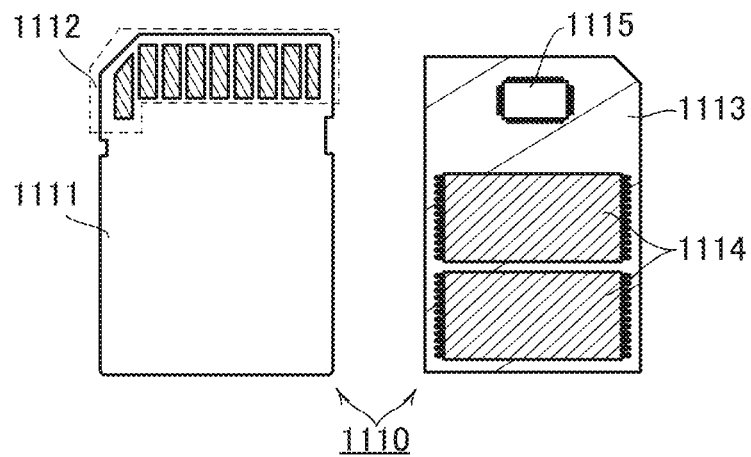

FIG. 19(B) is a schematic external view of an SD card, and FIG. 19(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

Figures 19D, 19E:
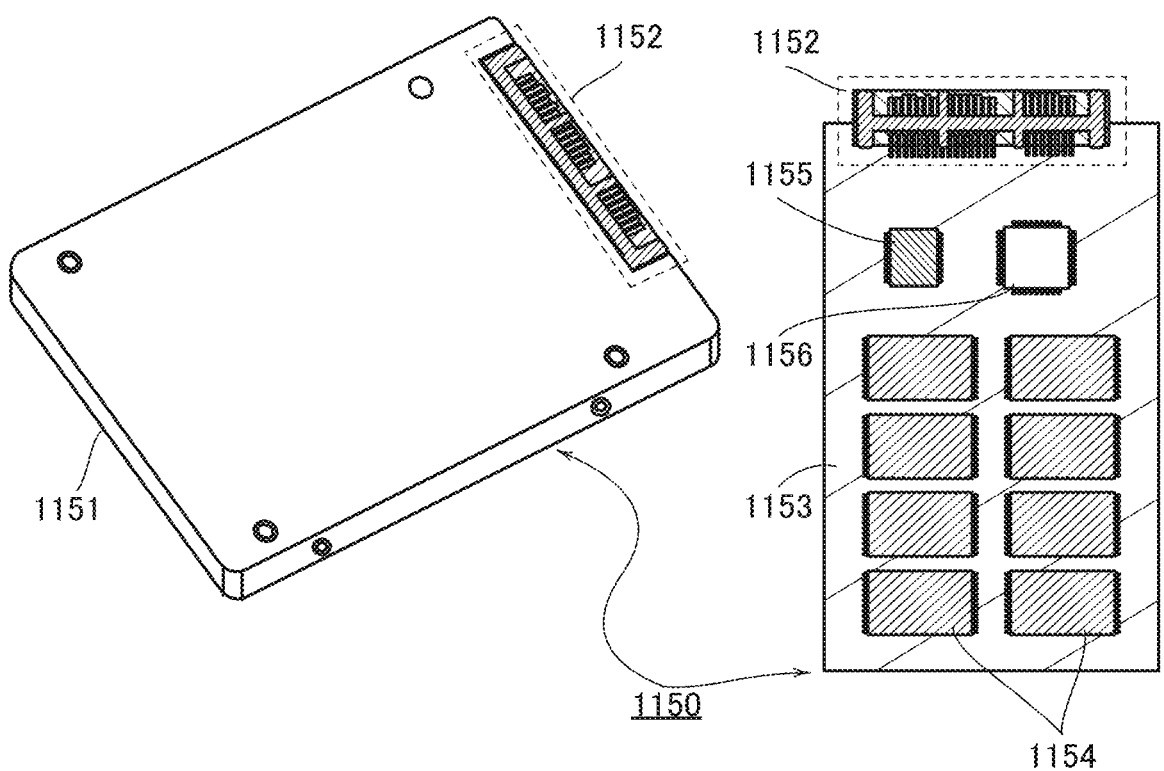

FIG. 19(D) is a schematic external view of an SSD, and FIG. 19(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments, examples, and the like.

Embodiment 7

The semiconductor device of one embodiment of the present invention can be used for processors such as CPUs and GPUs or chips. FIG. 20 to FIG. 22 illustrate specific examples of electronic devices including a processor such as a CPU or a GPU or a chip of one embodiment of the present invention.

<Electronic Device and System>

A GPU or a chip of one embodiment of the present invention can be incorporated into a variety of electronic devices. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine. When the integrated circuit or the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium. FIG. 20 illustrates examples of electronic devices.

[Mobile Phone]

Figure 20A:
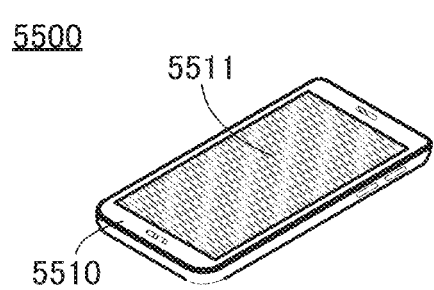
FIG. 20 (A) to (E) Diagrams each illustrating an electronic device of one embodiment of the present invention.

FIG. 20(A) illustrates a mobile phone (smartphone), which is a type of information terminal. An information terminal 5500 includes a housing 5510 and a display portion 5511. As input interfaces, a touch panel is provided in the display portion 5511 and a button is provided in the housing 5510.

The information terminal 5500 can execute an application utilizing artificial intelligence, with the use of the chip of one embodiment of the present invention. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal 1]

Figure 20B:
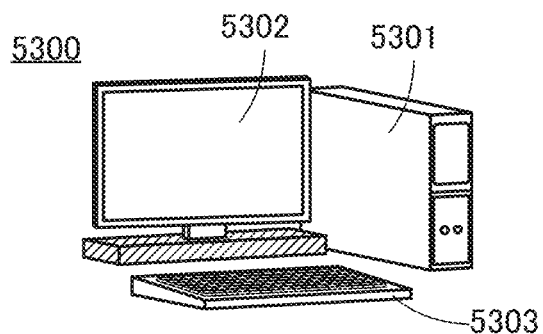
Figure 20C:
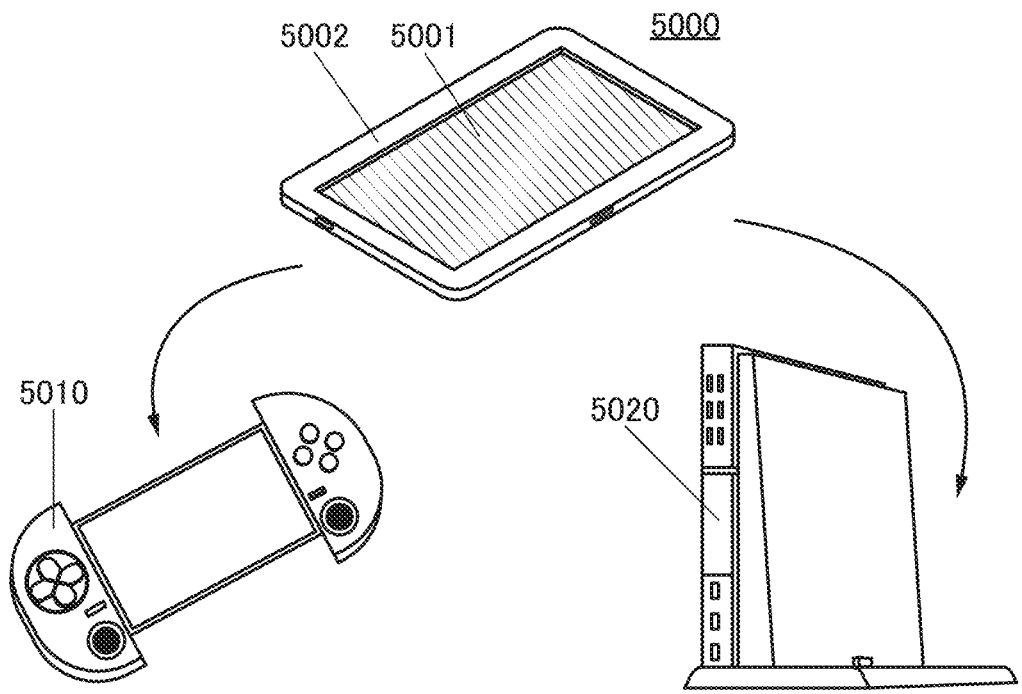

FIG. 20(B) illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence, with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that in the above description, a smartphone and a desktop information terminal are shown as examples of the electronic devices in FIGS. 20(A) and 20(B); alternatively, the electronic device can be an information terminal other than a smartphone and a desktop information terminal. Examples of information terminals other than a smartphone and a desktop information terminal include a PDA (Personal Digital Assistant), a laptop information terminal, and a workstation.

[Information Terminal 2]

FIG. 21(A) illustrates a tablet information terminal 5000. The tablet information terminal 5000 includes a housing 5002 and a display portion 5001. As input interfaces, a touch panel is provided in the display portion 5001 and a button is provided in the housing 5002.

The use of the GPU or the chip of one embodiment of the present invention in the tablet information terminal 5000 enables the tablet information terminal 5000 with low power consumption to be fabricated. Moreover, heat generation from a circuit can be reduced owing to low power consumption; thus, the influence of heat generation on the circuit, the peripheral circuit, and the module can be reduced.

The tablet information terminal 5000 can be held at the center of a controller 5010. The use of the controller 5010 allows the tablet information terminal 5000 to take more accurate and faster operation than through a touch panel. Thus, the tablet information terminal 5000 can be used as a portable game console.

Furthermore, the controller 5010 may include one or more of the above sensors. In addition, the controller 5010 can be connected to the tablet information terminal 5000 with or without wire even in a state where the controller 5010 is not holding the tablet information terminal 5000.

The tablet information terminal 5000 can be held in a cradle 5020. The cradle 5020 has at least one of the following functions: a function of charging the tablet information terminal 5000 and accessories thereof; a function of outputting data output from the tablet information terminal 5000 (e.g., video data, audio data, or text data); a function of being connected to an input device (e.g., a mouse, a keyboard, a recording media drive, or the controller 5010) and transmitting the input data to the tablet information terminal 5000, and a function of electrically connecting the tablet information terminal 5000 to a communication line with or without wire.

With the use of such a cradle 5020, the tablet information terminal 5000 can be used as a personal computer, a workstation, or a stationary game console.

The cradle 5020 may also include a GPU chip, a main memory, storage, or the like, in which case the cradle 5020 is capable of up-converting the video data output from the tablet information terminal 5000, for example.

[Stationary Game Console]

Figure 20D:
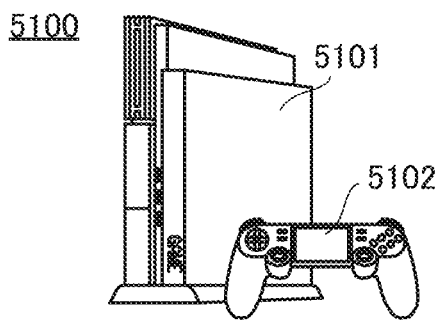

FIG. 20(D) illustrates a stationary game console 5100, which is an example of a game console. The stationary game console 5100 includes a game console body 5101, a controller 5102 that can be connected thereto with or without wire, and the like.

With the use of the GPU or the chip of one embodiment of the present invention in the stationary game console 5100, the stationary game console 5100 with low power consumption can be obtained. Moreover, heat generation from a circuit can be reduced owing to low power consumption; thus, the influence of heat generation on the circuit, the peripheral circuit, and the module can be reduced.

[Portable Game Console]

Figure 20E:
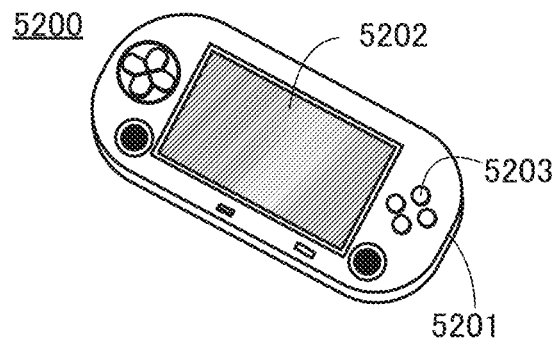

FIG. 20(E) illustrates a portable game console 5200, which is an example of a game console. The portable game console includes a housing 5201, a display portion 5202, a button 5203, and the like.

With the use of the GPU or the chip of one embodiment of the present invention in the portable game console 5200, the portable game console 5200 with low power consumption can be obtained. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game console 5200, the portable game console 5200 including artificial intelligence can be obtained.

In general, the progress of a game, the actions and words of game characters, and expressions of a phenomenon and the like in the game are programed in the game; however, the use of artificial intelligence in the portable game console 5200 enables expressions not limited by the game program. For example, questions posed by the player, the progress of the game, timing at which an event in the game occurs, and actions and words of game characters can be changed and expressed without being limited by the game program.

When a game requiring a plurality of players is played on the portable game console 5200, the artificial intelligence can create a virtual game player; thus, the game can be played alone with the game player created by the artificial intelligence as an opponent.

Although the stationary game console and the portable game console are illustrated as examples of a game console in the above, the game console using the GPU or the chip of one embodiment of the present invention is not limited thereto. Examples of the game console using the GPU or the chip of one embodiment of the present invention include an arcade game console installed in entertainment facilities (a game center, an amusement park, and the like), and a throwing machine for batting practice installed in sports facilities.

[Household Appliance]

FIG. 21(A) illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and food expiration dates, for example, a function of automatically adjusting the temperature to be appropriate for the foods stored in the electric refrigerator-freezer 5800, and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Moving Vehicle]

The GPU or the chip of one embodiment of the present invention can be used in an automobile, which is a moving vehicle, and around a driver's seat in the automobile.

FIG. 21(B1) illustrates an automobile 5700 as an example of a moving vehicle, and FIG. 21(B2) is a diagram illustrating the periphery of a windshield inside the automobile. FIG. 21(B2) illustrates a display panel 5701, a display panel 5702, and a display panel 5703 that are attached to a dashboard and a display panel 5704 that is attached to a pillar.

The display panel 5701 to the display panel 5703 can provide various kinds of information by displaying a speedometer, a tachometer, a mileage, a fuel meter, a gearshift indicator, an air-conditioning setting, and the like. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided for the automobile 5700. That is, displaying an image taken by the imaging device provided on the outside of the automobile 5700 leads to compensation for the blind spot and enhancement of safety. In addition, showing an image for compensating for the area that a driver cannot see makes it possible for the driver to confirm safety more easily and comfortably. The display panel 5704 can also be used as a lighting device.

Since the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation information, risk prediction, and the like.

Although an automobile is described above as an example of a moving vehicle, moving vehicles are not limited to an automobile. Examples of moving vehicles include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

FIG. 21(C) schematically shows data transmission in a broadcasting system. Specifically, FIG. 21(C) shows a path in which a radio wave (a broadcasting signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 21(C), a BS·110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 21(C) and may be satellite broadcasting using an artificial satellite, data broadcasting using an optical line, or the like.

The above-described broadcasting system may utilize artificial intelligence by using the chip of one embodiment of the present invention. When the broadcast data is transmitted from the broadcast station 5680 to the TV 5600 at home, the broadcast data is compressed by an encoder. When the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods for the encoder. In-frame prediction utilizing artificial intelligence, for instance, can also be performed. For another example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, application examples of artificial intelligence, its effects, and the like described in this embodiment can be combined as appropriate with the description of another electronic device.

<Parallel Computer>

Building a cluster using a plurality of computers of one embodiment of the present invention can constitute a parallel computer.

Figure 22A:
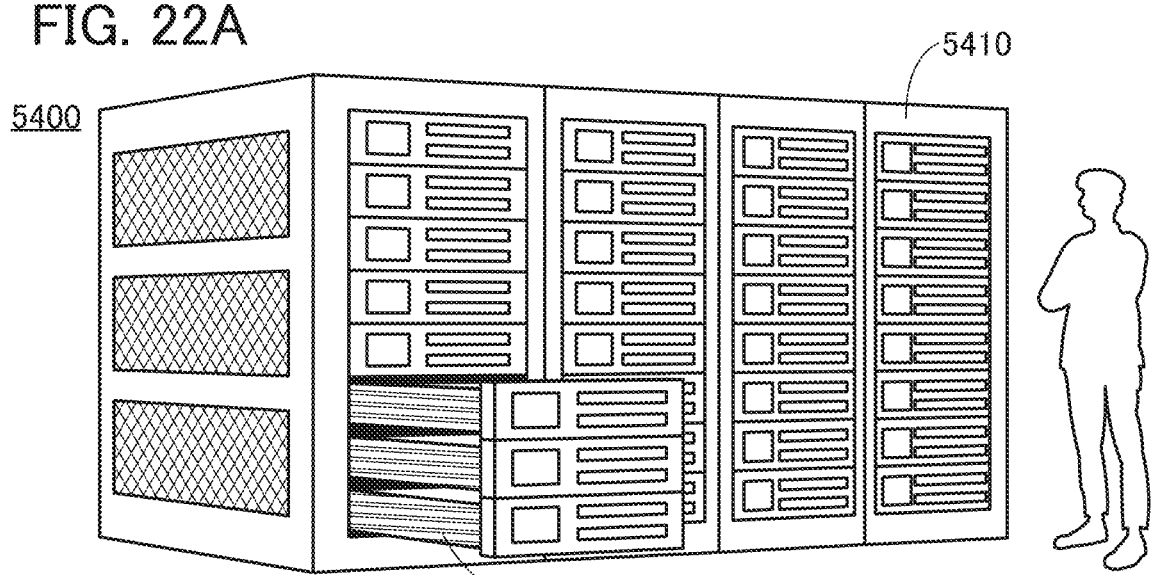
FIG. 22 (A) to (C) Diagrams illustrating configuration examples of a parallel computer, a computer, and a PC card of embodiments of the present invention.

FIG. 22(A) illustrates a large parallel computer 5400. In the parallel computer 5400, a plurality of rack mount computers 5420 are stored in a rack 5410.

Figure 22B:
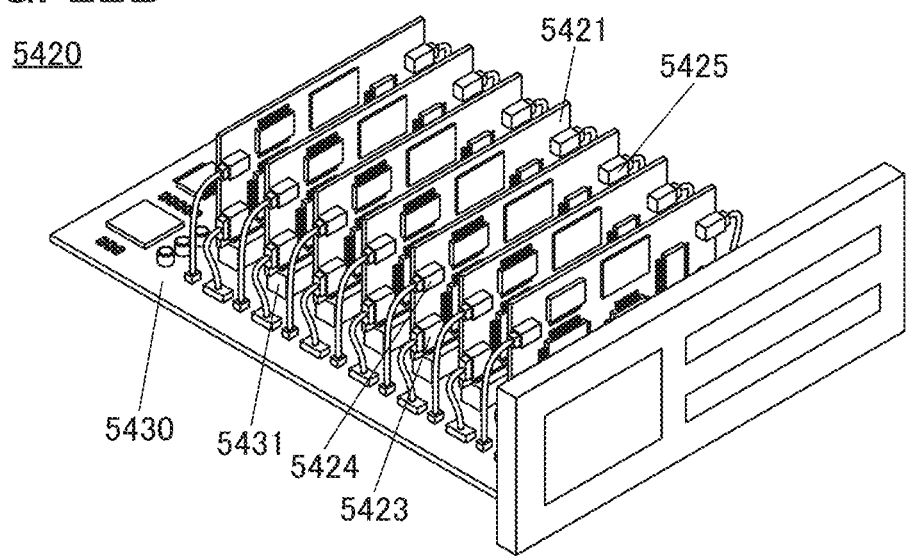

The computer 5420 can have a configuration in a perspective view of FIG. 22(B), for example. In FIG. 22(B), the computer 5420 includes a motherboard 5430, and the motherboard includes a plurality of slots 5431, a plurality of connection terminals 5432, and a plurality of connection terminals 5433. A PC card 5421 is inserted in the slot 5431. In addition, the PC card 5421 includes a connection terminal 5423, a connection terminal 5424, and a connection terminal 5425, each of which is connected to the motherboard 5430.

Figure 22C:
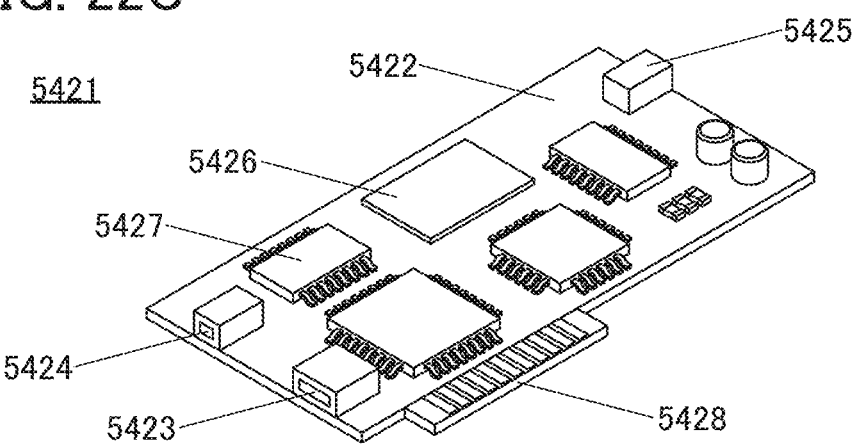

The PC card 5421 is a processing board provided with a CPU, a GPU, a memory device, and the like of one embodiment of the present invention. For example, FIG. 22(C) illustrates a structure in which the PC card 5421 includes a board 5422, and the board 5422 includes the connection terminal 5423, the connection terminal 5424, the connection terminal 5425, a chip 5426, a chip 5427, and a connection terminal 5428. Note that although FIG. 22(C) illustrates chips other than the chip 5426 and the chip 5427, the following description of the chip 5426 and the chip 5427 is referred to for these chips.

The connection terminal 5428 has a shape with which the connection terminal 5428 can be inserted in the slot 5431 of the motherboard 5430, and the connection terminal 5428 functions as an interface for connecting the PC card 5421 and the motherboard 5430. An example of the standard for the connection terminal 5428 is PCIe.

The connection terminal 5423, the connection terminal 5424, and the connection terminal 5425 can serve, for example, as an interface for performing power supply, signal input, or the like to the PC card 5421. As another example, they can serve as an interface for outputting a signal calculated by the PC card 5421, for instance. Examples of the standard for each of the connection terminal 5423, the connection terminal 5424, and the connection terminal 5425 include USB (Universal Serial Bus), SATA (Serial ATA), and SCSI (Small Computer System Interface). In the case where video signals are output from the connection terminal 5423, the connection terminal 5424, and the connection terminal 5425, an example of the standard therefor is HDMI (registered trademark).

The chip 5426 includes a terminal (not illustrated) for inputting and outputting signals, and when the terminal is inserted in a socket (not illustrated) of the PC card 5421, the chip 5426 and the PC card 5421 can be electrically connected to each other. The chip 5426 can be the GPU of one embodiment of the present invention, for example.

The chip 5427 includes a plurality of terminals, and when the terminals are reflow-soldered, for example, to wirings of the PC card 5421, the chip 5427 and the PC card 5421 can be electrically connected to each other. Examples of the chip 5427 include a memory device, an FPGA (Field Programmable Gate Array), and a CPU.

The use of the computer of one embodiment of the present invention in the computers 5420 of the parallel computer 5400 illustrated in FIG. 22(A) enables large-scale computation necessary for artificial intelligence learning and inference, for example.

This embodiment can be implemented in an appropriate combination with the structures described in the other embodiments, the examples, and the like.

Example

In this example, a semiconductor device in which the transistors described in the above embodiment were stacked was fabricated and observed with a scanning transmission electron microscope (STEM) to measure the electrical characteristics of the transistor.

In this example, a semiconductor device (hereinafter referred to as Sample 1) in which two layers with transistors were stacked on one another, each transistor having a structure similar to that of the transistor 200 described in the above embodiment, was fabricated. Hereinafter, transistors in the lower layer in Sample 1 are referred to as transistors 200_1, and transistors in the upper layer are referred to as transistors 200_2. In Sample 1, the transistors 200_1 and the transistors 200_2 were placed in the corresponding layers at a density of $0.05/\mu m^2$.

First, the structures of the transistor 200_1 and the transistor 200_2 will be described. As illustrated in FIG. 3, the transistor 200_1 and the transistor 200_2 each include: the insulator 214; the insulator 216 placed over the insulator 214; the conductor 205 placed so as to be embedded in the insulator 216; the insulator 222 placed over the insulator 216 and the conductor 205; the insulator 224 placed over the insulator 222; the oxide 230a placed over the insulator 224; the oxide 230b placed over the oxide 230a; the conductor 242a and the conductor 242b placed to be apart from each other over the oxide 230b; the insulator 254 placed over the conductor 242a, the conductor 242b, and the insulator 224; the insulator 280 placed over the insulator 254; the oxide 230c1 placed over the oxide 230b; the oxide 230c2 placed over the oxide 230c1; the insulator 250 placed over the oxide 230c2; the conductor 260a and the conductor 260b placed over the insulator 250; and the insulator 274 placed over the insulator 280, the oxide 230c1, the oxide 230c2, the insulator 250, and the conductor 260.

As the insulator 214, 40-nm-thick aluminum oxide was used. As the insulator 216, silicon oxynitride was used. As the conductor 205, a conductive film in which tantalum nitride, titanium nitride, and tungsten were stacked in this order was used.

As the insulator 222, 5-nm-thick aluminum oxide deposited by an ALD method was used. As the insulator 224, 35-nm-thick silicon oxynitride was used. Note that after the formation of the insulator 224, heat treatment was performed at 400° C. in a nitrogen atmosphere for one hour, and another heat treatment was sequentially performed at 400° C. in an oxygen atmosphere for one hour. The surface of the insulator 224 was subjected to CMP treatment.

As the oxide 230a, 5-nm-thick In—Ga—Zn oxide deposited by a DC sputtering method was used. In the deposition of the oxide 230a, a target with In:Ga:Zn=1:3:4 [atomic ratio] was used; an oxygen gas at 45 sccm was used as a deposition gas; the deposition pressure was 0.7 Pa; the deposition power was 500 W; the substrate temperature was 200° C.; and the target-substrate distance was 60 mm.

As the oxide 230b, 20-nm-thick In—Ga—Zn oxide deposited by a DC sputtering method was used. In the deposition of the oxide 230b, a target with In:Ga:Zn=4:2:4.1 [atomic ratio] was used; an argon gas at 30 sccm and an oxygen gas at 15 sccm were used as a deposition gas; the deposition pressure was 0.7 Pa; the deposition power was 500 W; the substrate temperature was 200° C.; and the target-substrate distance was 60 mm. Note that after the formation of the oxide 230b, heat treatment was performed at 400° C. in a nitrogen atmosphere for one hour, and another heat treatment was sequentially performed at 400° C. in an oxygen atmosphere for one hour.

As each of the conductor 242a and the conductor 242b, 25-nm-thick tantalum nitride was used. As the insulator 254, a stacked film including 5-nm-thick aluminum oxide deposited by a sputtering method and 3-nm-thick aluminum oxide deposited thereover by an ALD method was used.

As the insulator 280, silicon oxynitride deposited by a PECVD method was used.

As the oxide 230c1, 5-nm-thick In—Ga—Zn oxide deposited by a DC sputtering method was used. In the deposition of the oxide 230c1, a target with In:Ga:Zn=4:2:4.1 [atomic ratio] was used; an oxygen gas at 45 sccm was used as the deposition gas; the deposition pressure was 0.7 Pa; the deposition power was 500 W; the substrate temperature was 200° C.; and the target-substrate distance was 60 mm.

As the oxide 230c2, 5-nm-thick In—Ga—Zn oxide deposited by a DC sputtering method was used. In the deposition of the oxide 230c2, a target with In:Ga:Zn=1:3:4 [atomic ratio] was used; an oxygen gas at 45 sccm was used as a deposition gas; the deposition pressure was 0.7 Pa; the deposition power was 500 W; the substrate temperature was 200° C.; and the target-substrate distance was 60 mm.

As the insulator 250, 10-nm-thick silicon oxynitride was used. As the conductor 260a, 10-nm-thick titanium nitride was used. As the conductor 260b, tungsten was used.

As the insulator 274, 40-nm-thick aluminum oxide deposited by an RF sputtering method was used. For the insulator 274, an $Al_2O_3$ target was used, an argon gas at 25 sccm and an oxygen gas at 25 sccm were used as the deposition gases, the deposition pressure was 0.4 Pa, the deposition power was 2500 W, the substrate temperature was 250° C., and the target-substrate distance was 60 mm.

The transistor 200_1 and the transistor 200_2 of Sample 1 having the above structures were designed to have a channel length of 360 nm and a channel width of 360 nm. Note that as with the transistor 200, the transistor 200_1 and the transistor 200_2 in Sample 1 each include the conductor 240, the insulator 241, the insulator 281, and the like in addition to the above structure.

Note that since the transistor 2002 was fabricated over the transistor 200_1, the transistor 200_1 was also subjected to the thermal budget in fabricating the transistor 200_2. However, in the fabrication process of the transistor 200_2, heat treatment after the deposition of the insulator 224 was not performed and heat treatment at 400° C. in a nitrogen atmosphere for one hour was performed after the deposition of the insulator 274. After the fabrication of Sample 1, heat treatment at 400° C. in a nitrogen atmosphere for four hours was further performed.

Figure 23:
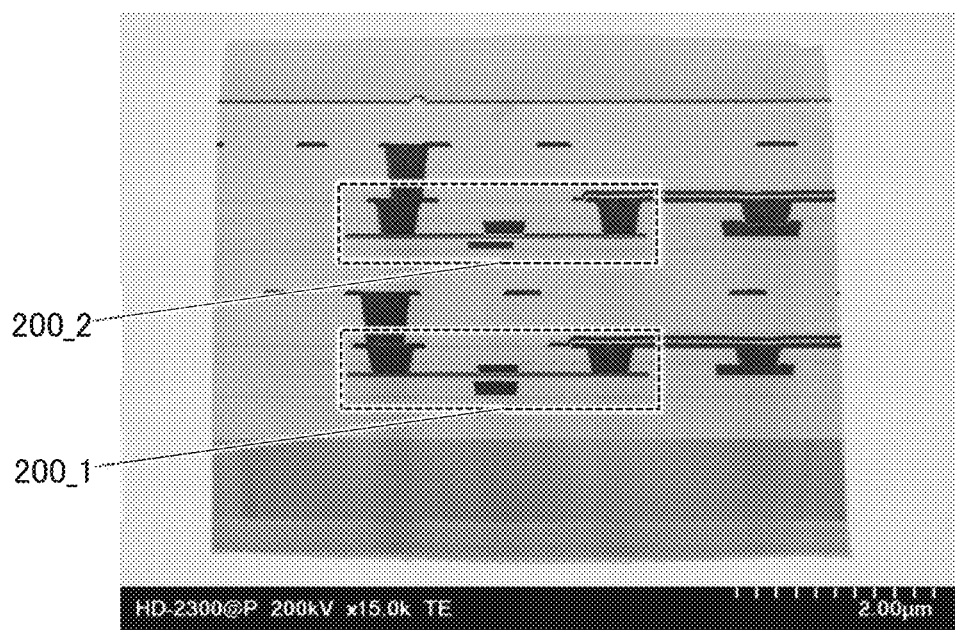
FIG. 23 A cross-sectional TEM image of a transistor of an example of the present invention.

Next, a cross-sectional STEM image of a portion of the fabricated sample was taken by using "HD-2300" produced by Hitachi High-Technologies Corporation with an acceleration voltage of 200 kV. FIG. 23 is a cross-sectional STEM image taken at a magnification of 15,000 times, FIG. 24(A) is a cross-sectional STEM image of the transistor 200_1 in FIG. 23 taken at a magnification of 100,000 times, and FIG. 24(B) is a cross-sectional STEM image of the transistor 200_2 in FIG. 23 taken at a magnification of 100,000 times.

As shown in FIG. 23, the transistor 200_2 is stacked over the transistor 200_1 in Sample 1.

Figure 24A:
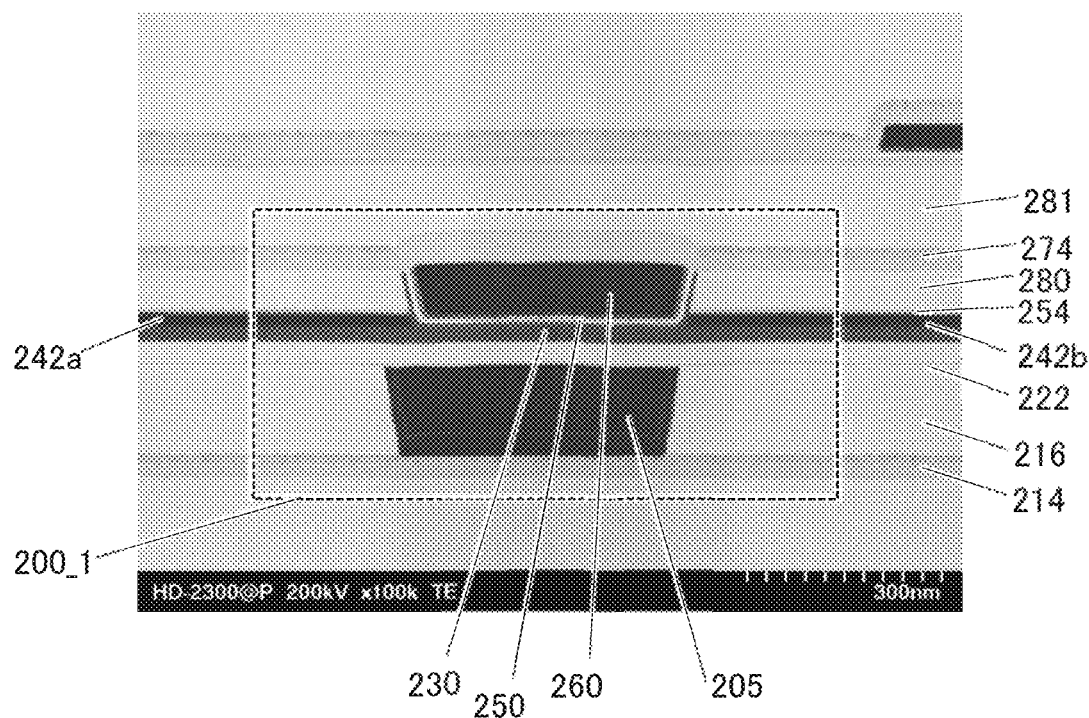
FIGS. 24 (A) and (B) Cross-sectional TEM images of transistors of an example of the present invention.
Figure 24B:
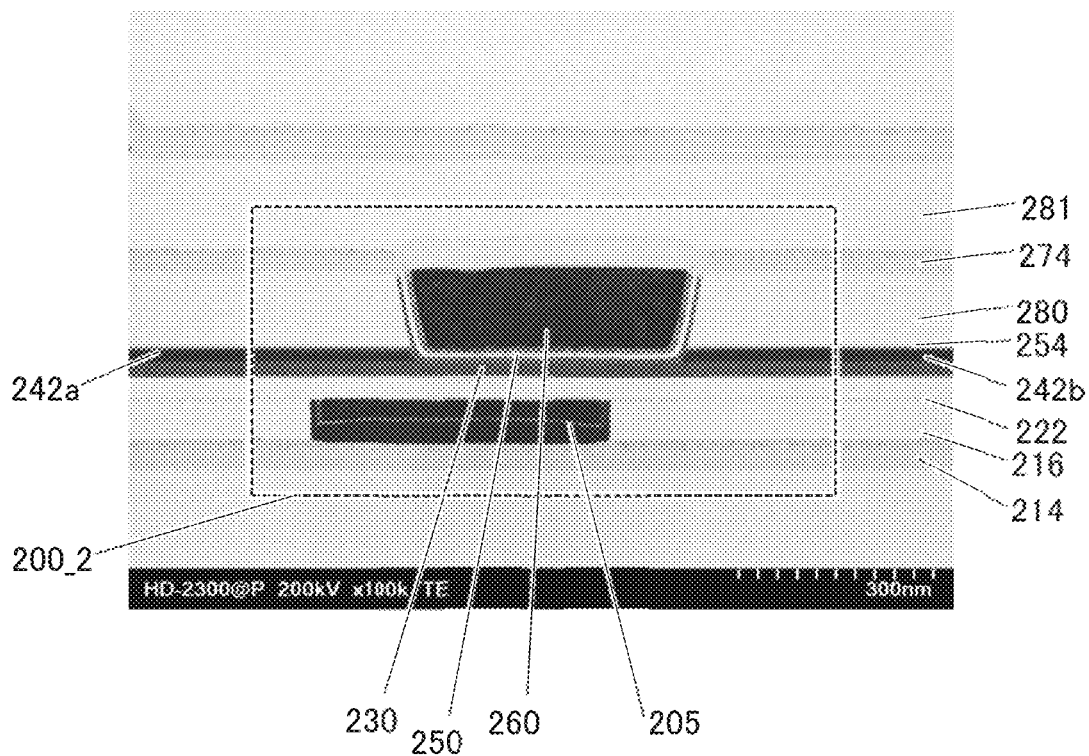

As shown in FIG. 24(A), in the transistor 200_1, the insulator 280 is isolated from the conductor 260, the conductor 242a, and the conductor 242b by the insulator 274, the oxide 230c2, and the insulator 254. Similarly, as shown in FIG. 24(B), in the transistor 200_2, the insulator 280 is isolated from the conductor 260, the conductor 242a, and the conductor 242b by the insulator 274, the oxide 230c2, and the insulator 254.

Next, $I_d$-$V_g$ measurement of 13 pieces of transistors 200_1 and 13 pieces of transistors 200_2 in Sample 1 was performed. The $I_d$-$V_g$ measurement was performed under the following conditions: the drain potential $V_d$ of the transistor was set to +0.1 V and +3.3 V; the source potential $V_s$ was set to 0 V; and the top gate potential $V_G$ was swept from −3.3 V to +3.3 V. The bottom gate potential $V_{bg}$ was set to 0 V. A semiconductor parameter analyzer manufactured by Keysight Technologies was used for the $I_d$-$V_g$ measurement.

Figure 25A:
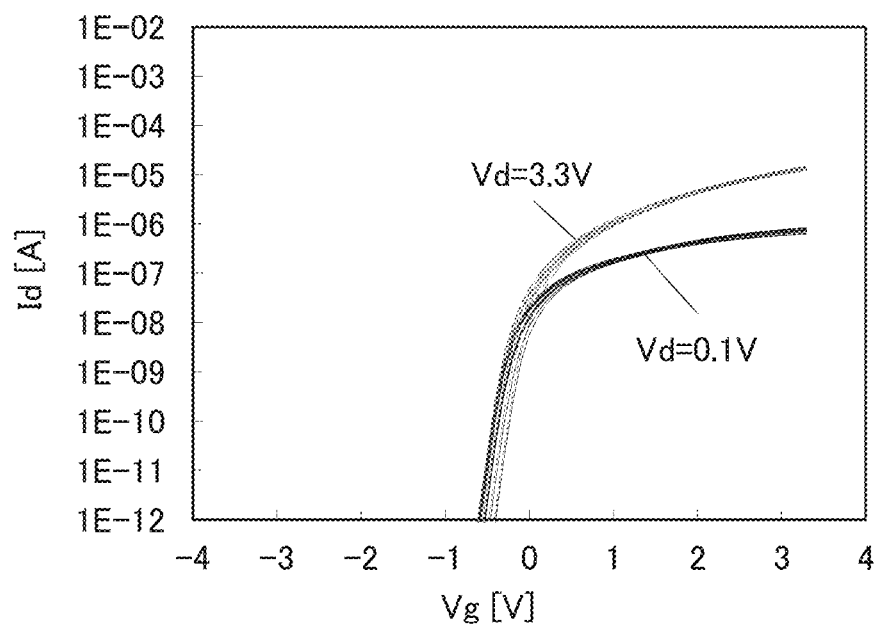
FIGS. 25 (A) and (B) Diagrams each showing electrical characteristics of a transistor of an example of the present invention.
Figure 25B:
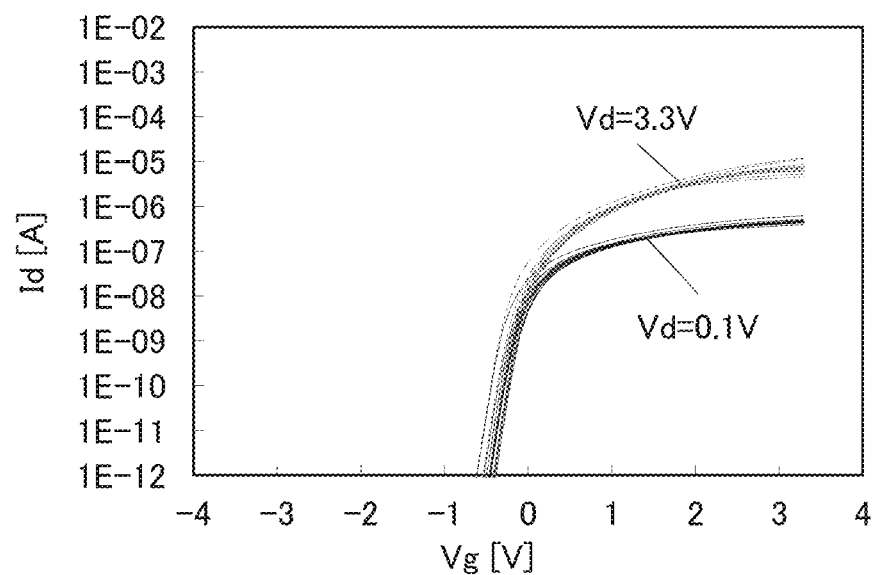

FIG. 25(A) shows $I_d$-$V_g$ curves of the 13 pieces of transistors 200_1, and FIG. 25(B) shows $I_d$-$V_g$ curves of the 13 pieces of transistors 200_2.

As shown in FIGS. 25(A) and 25(B), both the transistor 200_1 and the transistor 200_2 exhibited favorable switching characteristics.

The above results demonstrated that the semiconductor device in which the transistors 200 of one embodiment of the present invention were stacked has favorable electrical characteristics even when heat treatment is performed repeatedly.

At least part of the structure, the method, and the like described above in this example can be implemented in appropriate combination with other embodiments and examples described in this specification.

REFERENCE NUMERALS

10: layer, 10_n: layer, 10_1: layer, 10_2: layer, 20: transistor, 22: oxide, 22a: oxide, 22b: oxide, 22bP: layer, 22bX: c-axis, 24: insulator, 26: conductor, 28a: conductor, 28b: conductor, 30: insulator, 32: insulator, 34: insulator, 36: insulator, 38: insulator, 40: insulator, 50: oxygen, 100: capacitor, 100_1: capacitor, 100_2: capacitor, 100a: capacitor, 100b: capacitor, 110: conductor, 112: conductor, 120: conductor, 130: insulator, 150: insulator, 200: transistor, 200_1: transistor, 200_2: transistor, 200a: transistor, 200b: transistor, 205: conductor, 210: insulator, 212: insulator, 214: insulator, 216: insulator, 218: conductor, 220: insulator, 222: insulator, 224: insulator, 230: oxide, 230a: oxide, 230b: oxide, 230c: oxide, 230c1: oxide, 230c1P: layer, 230c1X: c-axis, 230c2: oxide, 230c2P: layer, 230c2X: c-axis, 230C1: oxide film, 230C2: oxide film, 231: region, 231a: region, 231b: region, 232B: oxide film, 234: region, 240: conductor, 240a: conductor, 240b: conductor, 241: insulator, 241a: insulator, 241b: insulator, 242: conductor, 242a: conductor, 242A: conductor layer, 242b: conductor, 243: region, 243a: region, 243b: region, 246: conductor, 250: insulator, 250A: insulating film, 254: insulator, 254A: insulating film, 260: conductor, 260a: conductor, 260Aa: conductive film, 260Ab: conductive film, 260b: conductor, 273: insulator, 274: insulator, 276: insulator, 280: insulator, 280A: insulator, 281: insulator, 283: insulator, 290: oxygen, 290_1: layer, 290_2: layer, 291: layer, 291_1: layer, 291_2: layer

The invention claimed is:

1. A semiconductor device comprising:
   a first layer and a second layer over the first layer,
   wherein the first layer and the second layer each comprise a transistor,
   wherein the transistor in the first layer and the second layer comprises:
   a first oxide;
   a first conductor and a second conductor over the first oxide;
   a first insulator placed to cover the first conductor, the second conductor, and the first oxide;
   a second insulator over the first insulator;
   a second oxide placed between the first conductor and the second conductor over the first oxide;
   a third insulator over the second oxide;
   a third conductor over the third insulator; and
   a fourth insulator in contact with a top surface of the second insulator, a top surface of the second oxide, a top surface of the third insulator, and a top surface of the third conductor, and
   wherein the first insulator and the fourth insulator are oxides comprising one or both of aluminum and hafnium.

2. The semiconductor device according to claim 1,
   wherein the first oxide and the second oxide comprise In, an element M, and Zn, and
   wherein M is Al, Ga, Y, or Sn.

3. The semiconductor device according to claim 1, further comprising a third layer placed below the first layer,
   wherein the third layer comprises:
   a fifth insulator over a silicon substrate; and
   a fourth conductor over the fifth insulator.

4. The semiconductor device according to claim 1, further comprising a fifth insulator and a sixth insulator,
   wherein the fifth insulator is placed below the first oxide and the first insulator, and
   wherein the sixth insulator is placed below the fifth insulator.

5. The semiconductor device according to claim 4, further comprising a fourth conductor,
   wherein the fourth conductor is placed below the sixth insulator to overlap with the first oxide.

6. The semiconductor device according to claim 1, wherein the second oxide has crystallinity.

7. The semiconductor device according to claim 6, wherein the second oxide comprises a region in contact with a side surface of the second insulator, the region in which a c-axis is oriented substantially perpendicular to the side surface.

8. The semiconductor device according to claim 6, wherein a third oxide is placed over and in contact with the second oxide.

9. A semiconductor device comprising:
a first layer and a second layer over the first layer,
wherein the first layer and the second layer each comprise a transistor,
wherein the transistor in the first layer and the second layer comprises:
  a first oxide;
  a first conductor and a second conductor over the first oxide;
  a first insulator placed to cover the first conductor, the second conductor, and the first oxide;
  a second insulator over the first insulator;
  a second oxide placed between the first conductor and the second conductor over the first oxide;
  a third insulator over the second oxide;
  a third conductor over the third insulator; and
  a fourth insulator in contact with a top surface of the second insulator, a top surface of the second oxide, a top surface of the third insulator, and a top surface of the third conductor, and
wherein each of the first insulator and the fourth insulator comprises any one of aluminum oxide, magnesium oxide, gallium oxide, germanium oxide, yttrium oxide, zirconium oxide, lanthanum oxide, neodymium oxide, hafnium oxide, tantalum oxide, silicon nitride oxide, and silicon nitride.

10. The semiconductor device according to claim 9,
wherein the first oxide and the second oxide comprise In, an element M, and Zn, and
wherein M is Al, Ga, Y, or Sn.

11. The semiconductor device according to claim 9, further comprising a third layer placed below the first layer, wherein the third layer comprises:
  a fifth insulator over a silicon substrate; and
  a fourth conductor over the fifth insulator.

12. The semiconductor device according to claim 9, further comprising a fifth insulator and a sixth insulator,
wherein the fifth insulator is placed below the first oxide and the first insulator, and
wherein the sixth insulator is placed below the fifth insulator.

13. The semiconductor device according to claim 12, further comprising a fourth conductor,
wherein the fourth conductor is placed below the sixth insulator to overlap with the first oxide.

14. The semiconductor device according to claim 9, wherein the second oxide has crystallinity.

15. The semiconductor device according to claim 14,
wherein the second oxide comprises a region in contact with a side surface of the second insulator, the region in which a c-axis is oriented substantially perpendicular to the side surface.

16. The semiconductor device according to claim 14, wherein a third oxide is placed over and in contact with the second oxide.

* * * * *